US012751304B2

(12) United States Patent
Wang et al.

(10) Patent No.: US 12,751,304 B2
(45) Date of Patent: Sep. 29, 2026

(54) ANCHOR-CONTAINING UNDERFILL STRUCTURES FOR A CHIP PACKAGE AND METHODS OF FORMING THE SAME

(71) Applicant: Taiwan Semiconductor Manufacturing Company Limited, Hsinchu (TW)

(72) Inventors: Chin-Hua Wang, New Taipei City (TW); Yu-Fan Chen, Hsinchu City (TW); Yu Chen Lee, Hsinchu City (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 630 days.

(21) Appl. No.: 17/849,760

(22) Filed: Jun. 27, 2022

(65) Prior Publication Data

US 2023/0420314 A1 Dec. 28, 2023

(51) Int. Cl.
*H10W 70/68* (2026.01)
*H10W 70/05* (2026.01)
(Continued)

(52) U.S. Cl.
CPC ........... *H10W 70/68* (2026.01); *H10W 70/05* (2026.01); *H10W 70/095* (2026.01);
(Continued)

(58) Field of Classification Search
CPC ... H01L 23/13; H01L 21/4857; H01L 21/486; H01L 21/561; H01L 21/563; H01L 23/49816; H01L 23/49822; H01L 23/49833; H01L 23/49838; H01L 24/32; H01L 24/96; H01L 24/97; H01L 25/0655; H01L 24/16; H01L 24/73; H01L 2224/16227; H01L 2224/16238; H01L 2224/32058; H01L 2224/32059; H01L 2224/32225; H01L 2224/73204; H01L 2924/1437; H01L 2924/15151;
(Continued)

(56) References Cited

U.S. PATENT DOCUMENTS 12,199,025 B2 * 1/2025 Shen ..................... H01L 21/565
2008/0169555 A1 * 7/2008 Topacio .............. H10W 74/012
257/E23.005

(Continued)

*Primary Examiner* — Eliseo Ramos Feliciano
*Assistant Examiner* — Thaddeus J Kolb
(74) *Attorney, Agent, or Firm* — The Marbury Law Group, PLLC

(57) ABSTRACT

A bonded assembly includes an interposer including redistribution wiring interconnects and redistribution insulating layers and including recesses in corner regions. The recesses include surfaces that are recessed relative to a horizontal plane including a horizontal surface of the interposer. A least one semiconductor die is attached to the interposer through a respective array of solder material portions. An underfill material portion is located between the interposer and the at least one semiconductor die. The underfill material includes downward-protruding anchor portions that protrude downward from a horizontally-extending portion of the underfill material portion that laterally surrounds each array of solder material portions into the recesses.

20 Claims, 53 Drawing Sheets

(51) Int. Cl.

| | |
|---|---|
| ***H10W 70/65*** | (2026.01) |
| ***H10W 70/685*** | (2026.01) |
| ***H10W 72/00*** | (2026.01) |
| ***H10W 72/30*** | (2026.01) |
| ***H10W 74/01*** | (2026.01) |
| ***H10W 74/15*** | (2026.01) |
| ***H10W 76/63*** | (2026.01) |
| ***H10W 90/00*** | (2026.01) |

(52) U.S. Cl.
CPC ......... *H10W 70/65* (2026.01); *H10W 70/685* (2026.01); *H10W 72/0198* (2026.01); *H10W 74/012* (2026.01); *H10W 74/014* (2026.01); *H10W 74/15* (2026.01); *H10W 90/00* (2026.01); *H10W 90/401* (2026.01); *H10W 90/701* (2026.01); *H10W 70/681* (2026.01); *H10W 72/07353* (2026.01); *H10W 72/334* (2026.01); *H10W 76/63* (2026.01); *H10W 90/724* (2026.01); *H10W 90/734* (2026.01)

(58) Field of Classification Search
CPC ... H01L 2924/1616; H01L 2924/16235; H01L 2924/16251; H01L 2924/1632; H01L 2924/35121; H01L 25/0652; H01L 25/50; H01L 23/5383; H01L 23/5384; H01L 23/5386; H01L 2224/81; H01L 23/055; H01L 23/10; H01L 23/3142; H01L 23/562; H01L 23/5385; H01L 24/13; H01L 24/81
See application file for complete search history.

(56) References Cited

U.S. PATENT DOCUMENTS

| | | | | |
|---|---|---|---|---|
| 2019/0067249 | A1* | 2/2019 | Huang .................... | H10P 72/74 |
| 2020/0343197 | A1* | 10/2020 | Chen ................... | H10W 42/121 |
| 2022/0013474 | A1* | 1/2022 | Yoo ..................... | H10W 42/121 |
| 2022/0181289 | A1* | 6/2022 | Goh .................... | H10W 44/601 |
| 2022/0301969 | A1* | 9/2022 | Noh ...................... | H10W 40/22 |
| 2022/0351901 | A1* | 11/2022 | Newlin ............... | H01F 17/0006 |

* cited by examiner

ANCHOR-CONTAINING UNDERFILL STRUCTURES FOR A CHIP PACKAGE AND METHODS OF FORMING THE SAME

BACKGROUND

An underfill material between an interposer and a semiconductor die is frequently subjected to mechanical stress. Failure to properly absorb the mechanical stress may result in cracks in the semiconductor die or in the interposer, and may result in a package failure. For example, cracks formed in an underfill material may induce additional cracks in a semiconductor die, solder material portions, interposers, and/or various dielectric layers within a semiconductor die or within a packaging substrate. Thus, suppression of the formation of cracks in the underfill material is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
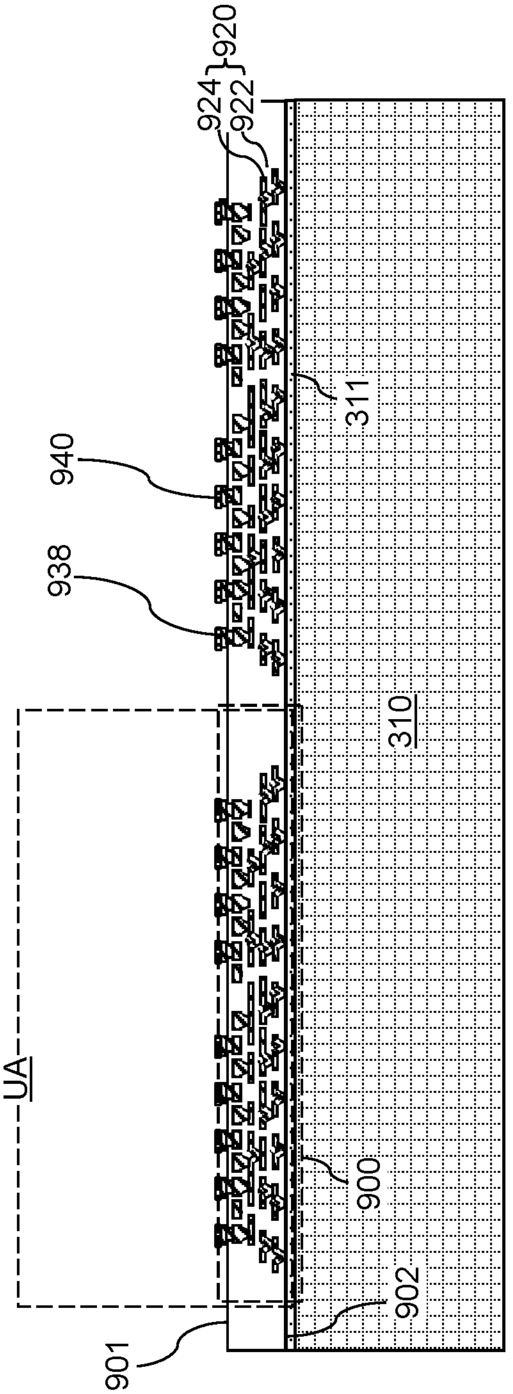
FIG. 1A is a vertical cross-sectional view of a structure that includes a first carrier substrate and interposers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a chip package structure containing an underfill material portion that includes downward-protruding anchor portions that protrude into recesses, or cavities, in a surfaces of a first interconnect-containing structure, which may be an interposer, a packaging substrate, or a printed circuit board.

Generally, underfill material between a first interconnect-containing structure and at least one second interconnect-containing structure is prone to mechanical and thermal stress during assembly and operation. As used herein, an “interconnect-containing structure” refers to any structure including metal interconnect structures therein. Examples of interconnect-containing structures comprise semiconductor dies, interposers, packaging substrate, and printed circuit boards. High temperature conditions generated during the operation of the semiconductor dies may also induce thermal expansion of the semiconductor dies and adjacent structural components, such as interposers, packaging substrates, and printed circuit boards. Differences in the thermal expansion coefficients of the various components may cause additional stress, which may induce cracks or delamination in underfill material portions. According to an aspect of the present disclosure, recesses may be formed on a surface of a first interconnect-containing structure that contact the underfill material portion. The recesses may be filled within protruding portions of the underfill material portion. Such a configuration may mitigate against delamination and/or cracking in the vicinity of corners of semiconductor dies, and may increase the reliability of a chip package including the semiconductor dies by effectively reducing the thermal and mechanical stress on the underfill material portions. The various aspects and embodiments of the methods and structures of the present disclosure are described with reference to accompanying drawings herebelow.

Figure 1B:
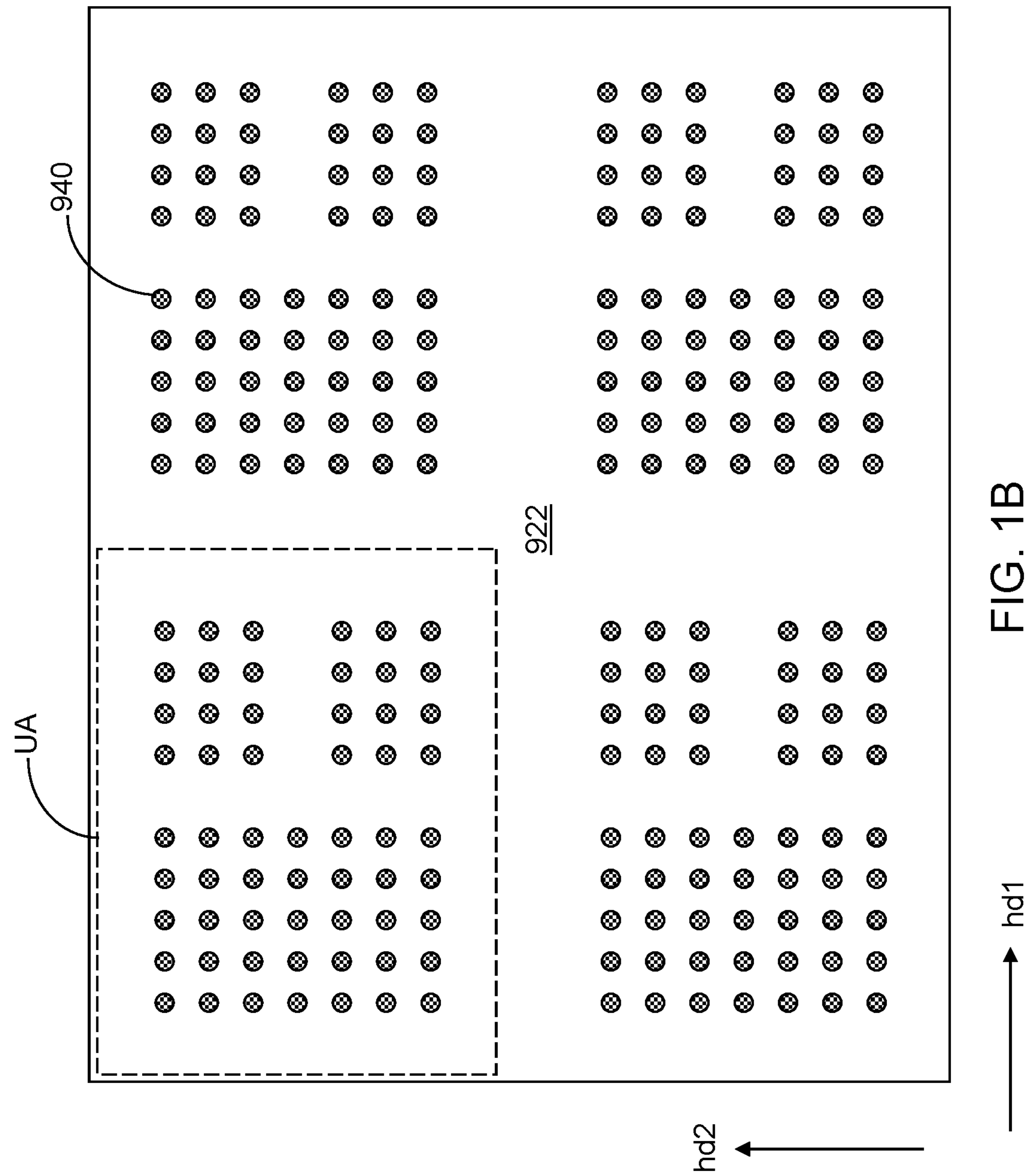
FIG. 1B is a top-down view of the structure of FIG. 1A.

Referring to FIGS. 1A and 1B, a structure according to an embodiment of the present disclosure may include a first carrier substrate 310 and interposers 900 formed on a front side surface of the first carrier substrate 310. The first carrier substrate 310 may include an optically transparent substrate such as a glass substrate or a sapphire substrate. The diameter of the first carrier substrate 310 may be in a range from 150 mm to 290 mm, although lesser and greater diameters may be used. In addition, the thickness of the first carrier substrate 310 may be in a range from 500 microns to 2,000 microns, although lesser and greater thicknesses may also be used. Alternatively, the first carrier substrate 310 may be provided in a rectangular panel format. The dimensions of the first carrier in such alternative embodiments may be substantially the same.

A first adhesive layer 311 may be applied to the front-side surface of the first carrier substrate 310. In one embodiment, the first adhesive layer 311 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the first adhesive layer 311 may include a thermally decomposing adhesive material. For example, the first adhesive layer 311 may include an acrylic pressure-sensitive adhesive that decomposes at an elevated temperature. The debonding temperature of the thermally decomposing adhesive material may be in a range from 150 degrees to 200 degrees Celsius.

Interposers 900 may be formed over the first adhesive layer 311. Specifically, an interposer 900 may be formed within each unit area UA, which is the area of a repetition unit that may be repeated in a two-dimensional array over the first carrier substrate 310. Each interposer 900 includes a respective portion of a redistribution structure 920, which is a combination of redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 500 nm, and the copper seed layer may have a thickness in a range from 50 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each interposer 900 (i.e., the levels of the redistribution wiring interconnects 924) may be in a range from 1 to 10. A periodic two-dimensional array (such as a rectangular array) of interposers 900 may be formed over the first carrier substrate 310. Each interposer 900 may be formed within a unit area UA. The layer including all interposers 900 is herein referred to as an interposer layer. The interposer layer includes a two-dimensional array of interposers 900. In one embodiment, the two-dimensional array of interposers 900 may be a rectangular periodic two-dimensional array of interposers 900 having a first periodicity along a first horizontal direction hd1 and having a second periodicity along a second horizontal direction hd2 that is perpendicular to the first horizontal direction hd1.

At least one metallic material and a first solder material may be sequentially deposited over the front-side surface of the interposers 900. The at least one metallic material comprises a material that may be used for metallic bumps, such as copper. The thickness of the at least one metallic material may be in a range from 5 microns to 60 microns, such as from 10 microns to 30 microns, although lesser and greater thicknesses may also be used. The first solder material may comprise a solder material suitable for C2 bonding, i.e., for microbump bonding. The thickness of the first solder material may be in a range from 2 microns to 30 microns, such as from 4 microns to 15 microns, although lesser and greater thicknesses may also be used.

The first solder material and the at least one metallic material may be patterned into discrete arrays of first solder material portions 940 and arrays of metal bonding structures, which are herein referred to as arrays of on-interposer bump structure 938. Each array of on-interposer bump structure 938 may be formed within a respective unit area UA. Each array of first solder material portions 940 may be formed within a respective unit area UA. Each first solder material portion 940 may have a same horizontal cross-sectional shape as an underlying on-interposer bump structure 938.

In one embodiment, the on-interposer bump structure 938 may include, and/or may consist essentially of, copper or a copper-containing alloy. Other suitable materials are within the contemplated scope of disclosure. The thickness of the on-interposer bump structure 938 may be in a range from 5 microns to 60 microns, although lesser or greater thicknesses may also be used. The on-interposer bump structure 938 may have horizontal cross-sectional shapes of rectangles, rounded rectangles, circles, regular polygons, irregular polygons, or any other two-dimensional curvilinear shape having a closed periphery. In one embodiment, on-interposer bump structure 938 may be configured for microbump bonding (i.e., C2 bonding), and may have a thickness in a range from 10 microns to 30 microns, although lesser or greater thicknesses may also be used. In this embodiment, each array of on-interposer bump structure 938 may be formed as an array of microbumps (such as copper pillars) having a lateral dimension in a range from 10 microns to 25 microns, and having a pitch in a range from 20 microns to 50 microns.

Generally, at least one interposer 900 including a respective set of redistribution wiring interconnects 924 and redistribution insulating layers 922 may be provided. In one embodiment, the at least one interposer 900 may comprise a plurality of interposers 900 located over a first carrier wafer 310. Each interposer 900 comprises on-interposer bump structures 938 overlying a horizontal plane including a first horizontal surface 901 of the interposer 900. Each interposer 900 comprises a second horizontal surface 902 that is located on an opposite side of the first horizontal surface 901. The vertical spacing between the first horizontal surface 901 and the second horizontal surface 902 may be referred to as the thickness of the interposers 900.

Figure 2A:
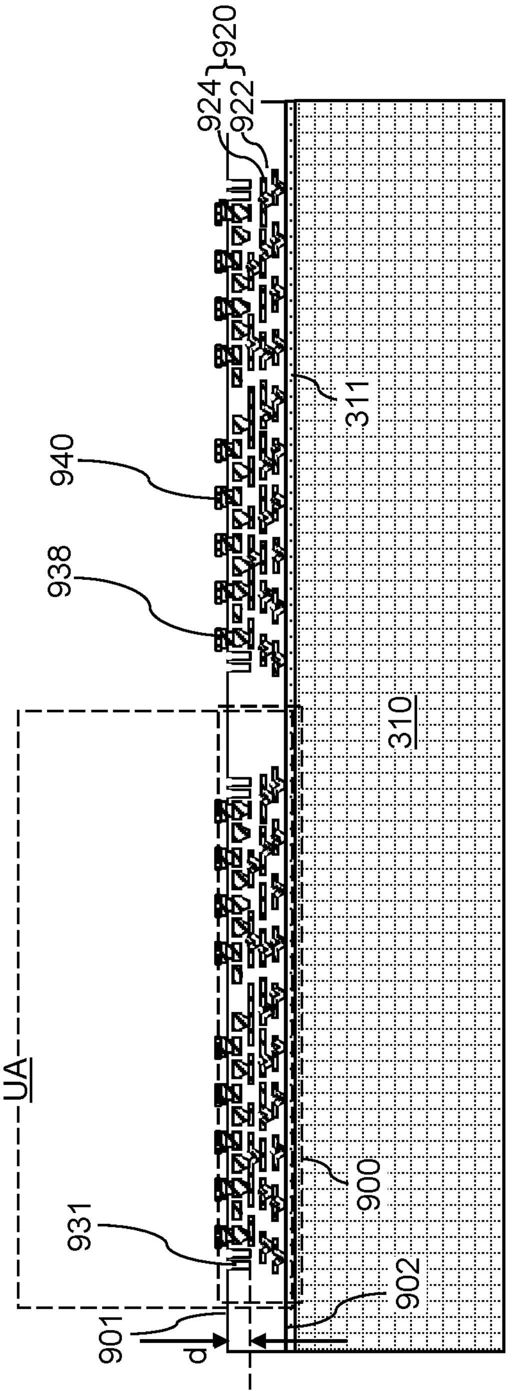
FIG. 2A is a vertical cross-sectional view of the structure after formation of recesses in corner regions of each unit area according to an embodiment of the present disclosure.
Figure 2B:
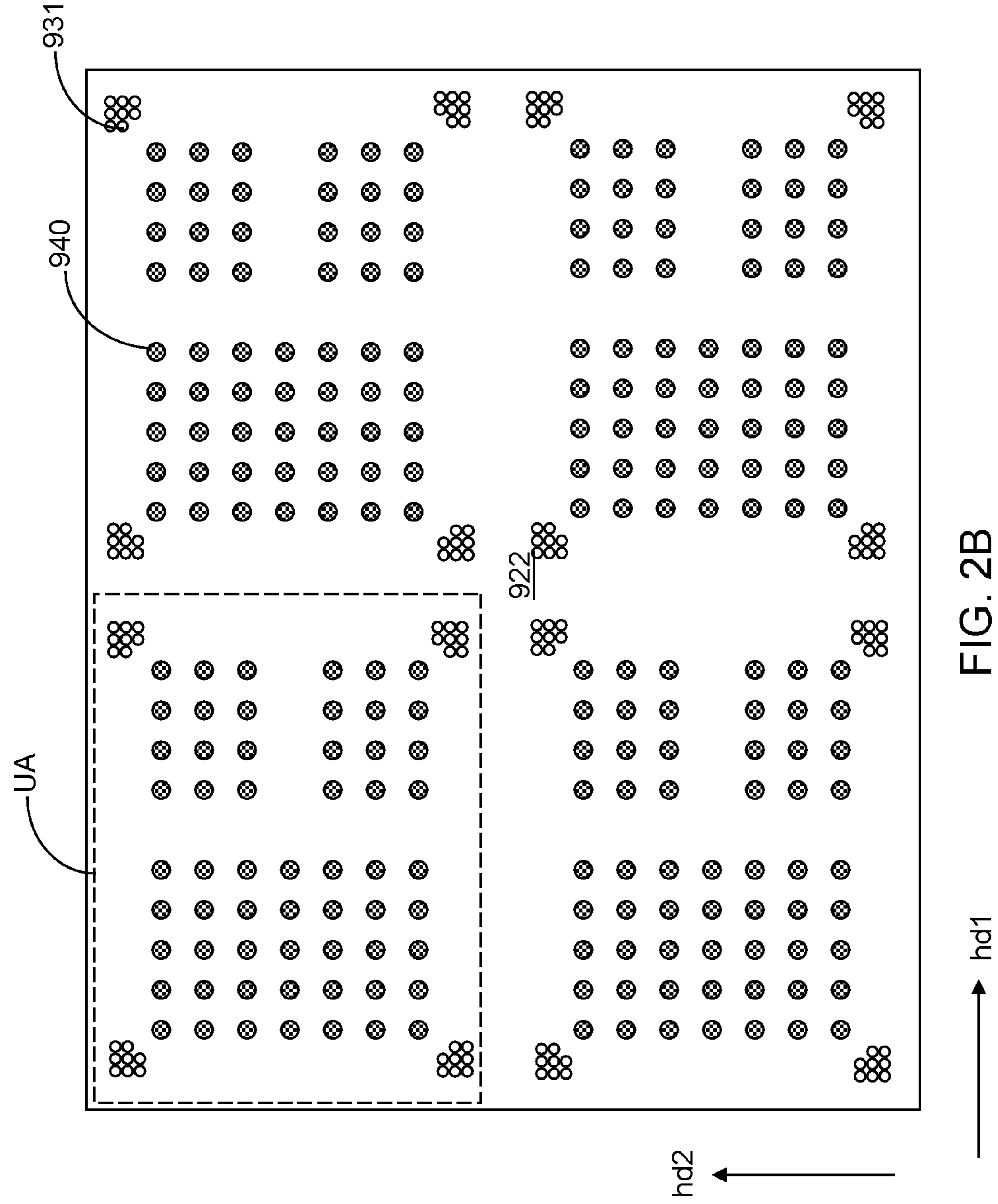
FIG. 2B is a top-down view of the structure of FIG. 2A.
Figure 2C:
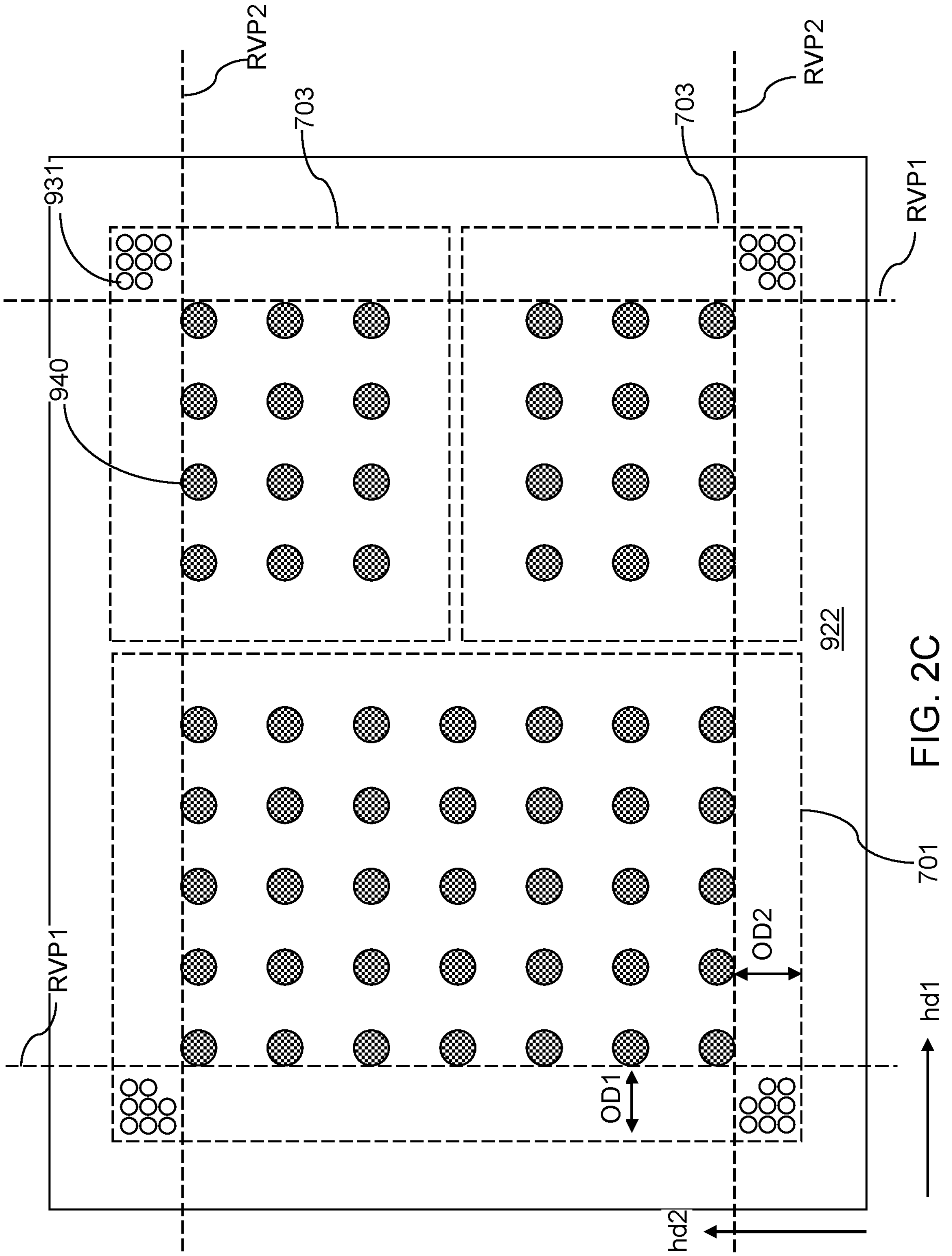
FIG. 2C is a top-down view of an unit area within the structure of FIG. 2A.

Referring to FIGS. 2A-2C, a photoresist layer (not shown) may be applied over the first horizontal surface 901 of the interposers 900, and may be lithographically patterned to form openings in corner regions of each interposer 900, i.e., in corner regions of each unit area UA of the structure. According to an aspect of the present disclosure, the locations of the openings in the photoresist layer may be selected such that openings in the photoresist layer do not have any areal overlap with the on-interposer bump structures 938.

In one embodiment, all on-interposer bump structures 938 of an interposer 900 within a unit area UA may be located within a respective rectangular area in a plan view (such as a top-down view), and all openings in the photoresist layer within the unit area UA may be formed outside the rectangular area. In one embodiment, all on-interposer bump structures 938 of an interposer 900 within a unit area UA may be laterally offset inward from sidewalls semiconductor dies (701, 703) to be subsequently bonded to the interposer 900 at least by offset distances (as illustrated in FIG. 2C). For example, all on-interposer bump structures 938 of an interposer 900 within a unit area UA may be laterally offset inward from first sidewalls of the semiconductor dies (701, 703) (to be subsequently bonded to the interposer 900) that are perpendicular to the first horizontal direction hd1 at least by a first offset distance OD1. All on-interposer bump structures 938 of an interposer 900 within a unit area UA may be laterally offset inward from second sidewalls of the semiconductor dies (701, 703) (to be subsequently bonded to the interposer 900) that are perpendicular to the first horizontal direction hd1 at least by a second offset distance OD2. Each of the first offset distance OD1 and the second offset distance OD2 may be in a range from 50 microns to 500 microns, although lesser and greater dimensions may also be used. FIG. 2C shows first reference vertical planes RVP1 that are laterally offset inward from the first sidewalls of the semiconductor dies (701, 703) (to be subsequently bonded to the interposer 900) by the first offset distance OD1, and second reference vertical planes RVP2 that are laterally offset inward from the second sidewalls of the semiconductor dies (701, 703) (to be subsequently bonded to the interposer 900) by the second offset distance OD2.

At least one etch process may be performed to remove portions of each interposer 900 that are not masked by the photoresist layer. The recesses 931 may be formed in volumes from which the material of the each interposer 900 is removed by the at least one etch process. In one embodiment, the recesses 931 may be formed in corner regions of each interposer 900. In one embodiment, the corner regions may be defined as rectangular regions located outside the pair of first reference vertical planes RVP1 and located outside the pair of second reference vertical planes RVP2, and having an areal overlap with a respective set of semiconductor dies (701, 703) to be subsequently bonded to an interposer 900. As such, the corner regions may be a rectangular region having a respective area that equals the product of the first lateral offset distance OD1 and the second lateral offset distance OD2. The recesses 931 comprise surfaces that are recessed relative to a horizontal plane including the first horizontal surface 901 of the interposers 900. In one embodiment, each of the recesses 931 may have a depth d that is in a range from 5% to 99.9% of the thickness of the interposer 900, which is the vertical distance between the first horizontal surface 901 and the second horizontal surface 902. In one embodiment, the recesses 931 in each interposer 900 may comprise an array of recesses 931 having a first periodicity along the first horizontal direction hd1 and having a second periodicity along the second horizontal direction hd2 and located in one of the corner regions of a respective unit area UA. The photoresist layer may be subsequently removed, for example, by ashing.

The at least one etch process that is used to form the recesses 931 may include an anisotropic etch process, an isotropic etch process, or a combination thereof. FIGS. 3A-3E are vertical cross-sectional views of various configurations of a recess 931 in the structure of FIGS. 2A-2C.

Figure 3B:
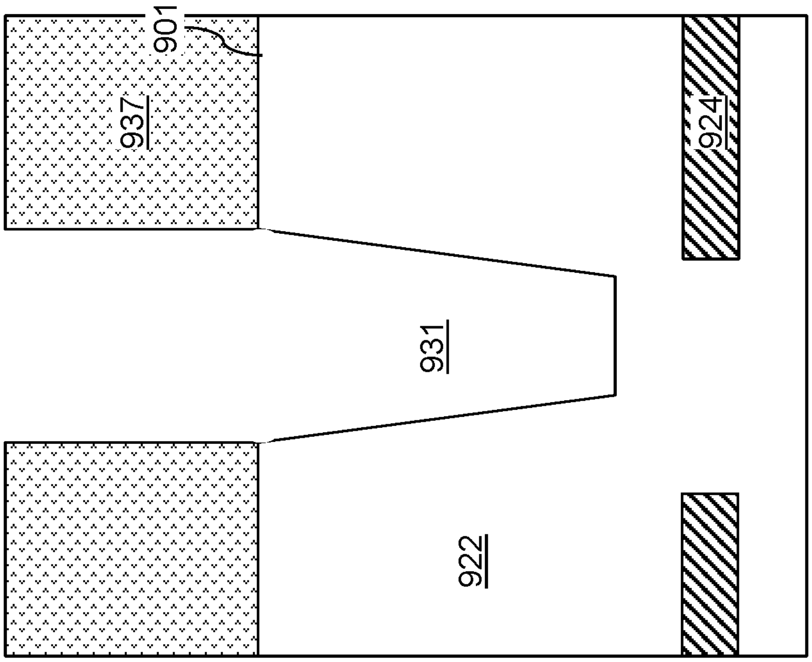
FIGS. 3A-3E are vertical cross-sectional views of various configurations of a recess in the structure of FIGS. 2A-2C.
Figure 3A:
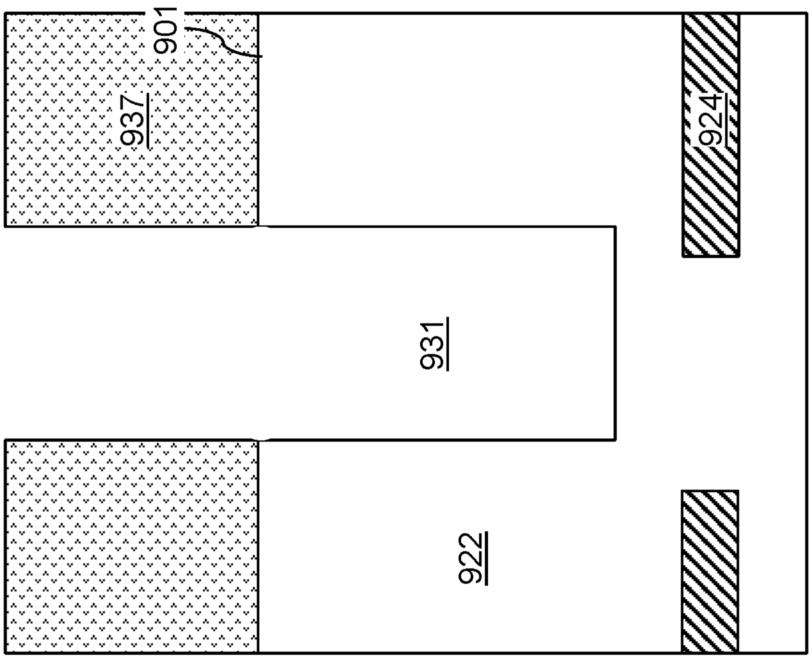

Referring to FIG. 3A, a first configuration of a recess 931 is shown immediately after formation of the recesses 931 in which the photoresist layer 937 has not yet been removed. In the first configuration, an anisotropic etch process such as a reactive ion etch process may be used to form the recesses 931 having vertical sidewalls.

Referring to FIG. 3B, a second configuration of a recess 931 is shown immediately after formation of the recesses 931. In the second configuration, an anisotropic etch process such as a reactive ion etch process may be formed to form the recesses 931 having tapered sidewalls. The taper angle of the sidewalls, as measured from a vertical direction, may be in a range from 0.1 degree to 15 degrees, such as from 1 degree to 5 degrees, although lesser and greater taper angles may also be used.

Figure 3D:
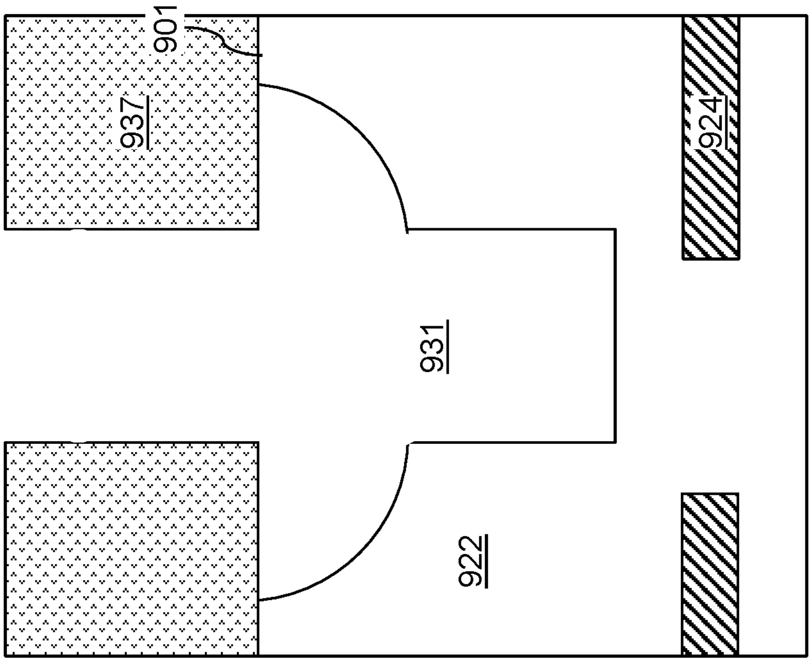
Figure 3C:
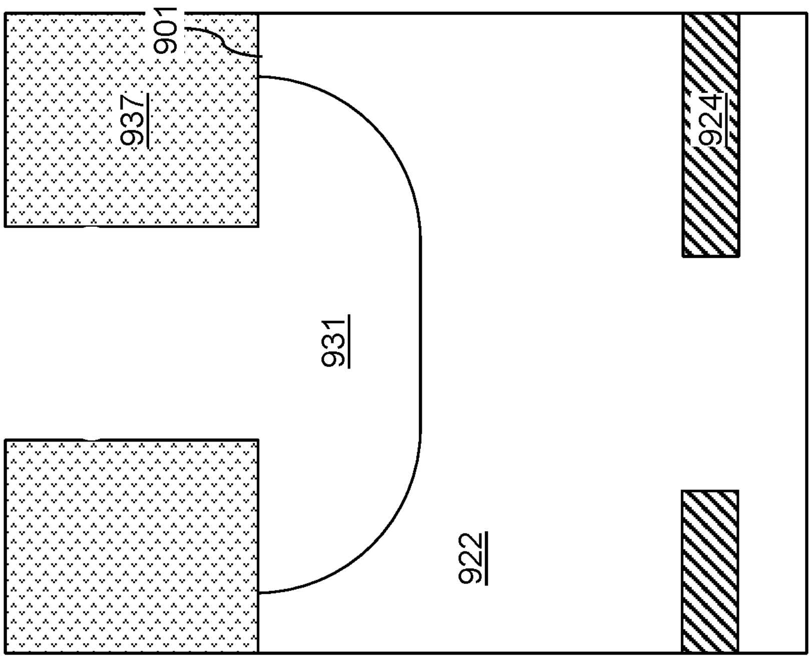

Referring to FIG. 3C, a third configuration of a recess 931 is shown immediately after formation of the recesses 931. In the third configuration, an isotropic etch process such as a wet etch process may be performed to form the recesses 931. AS shown in FIG. 3C, the recess 931 resulting from the wet etch process may have edges that undercut the redistribution dielectric layer 922 beneath the photoresist layer 937.

Referring to FIG. 3D, a fourth configuration of a recess 931 is shown immediately after formation of the recesses 931. In the fourth configuration, an isotropic etch process such as a wet etch process may be performed, and an anisotropic etch process such as a reactive ion etch process may be performed to form the recesses 931.

Figure 3E:
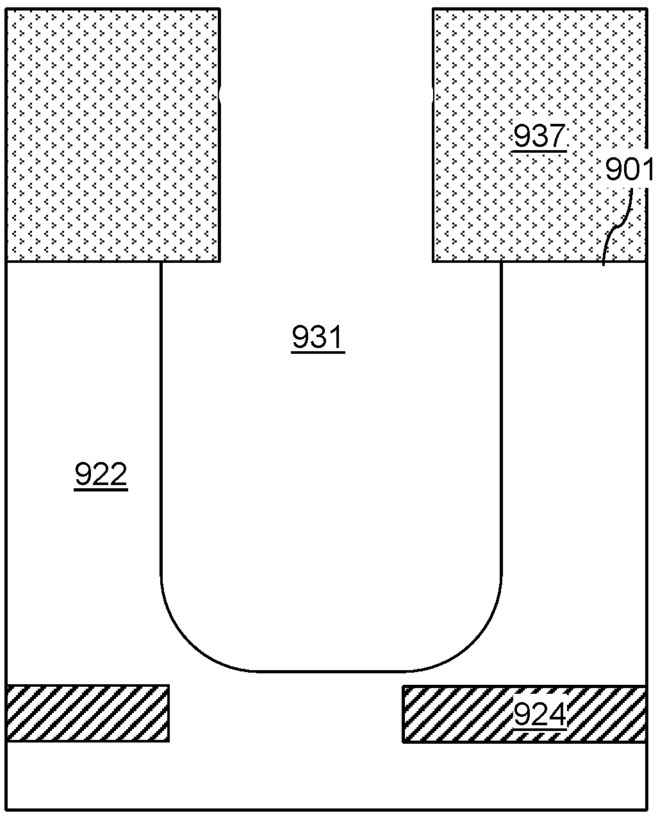

Referring to FIG. 3E, a fifth configuration of a recess 931 is shown immediately after formation of the recesses 931. In the fifth configuration, an anisotropic etch process such as a reactive ion etch process may be performed, and an isotropic etch process such as a wet etch process may be performed to form the recesses 931.

In some embodiments, one, a plurality, and/or each of the recesses 931 may have a vertical sidewall that vertically extends from the horizontal plane including the first horizontal surface 901 of the interposer 900 to a respective recessed horizontal surface located within the interposer 900. In one embodiment, each recessed horizontal surface may be a surface of a polymer material of one of the redistribution dielectric layers 922. In some embodiments, such as in FIG. 3D, one, a plurality, and/or each of the recesses 931 has a concave surface segment that is adjoined to a recessed horizontal surface located within the interposer 900.

Figure 4A:
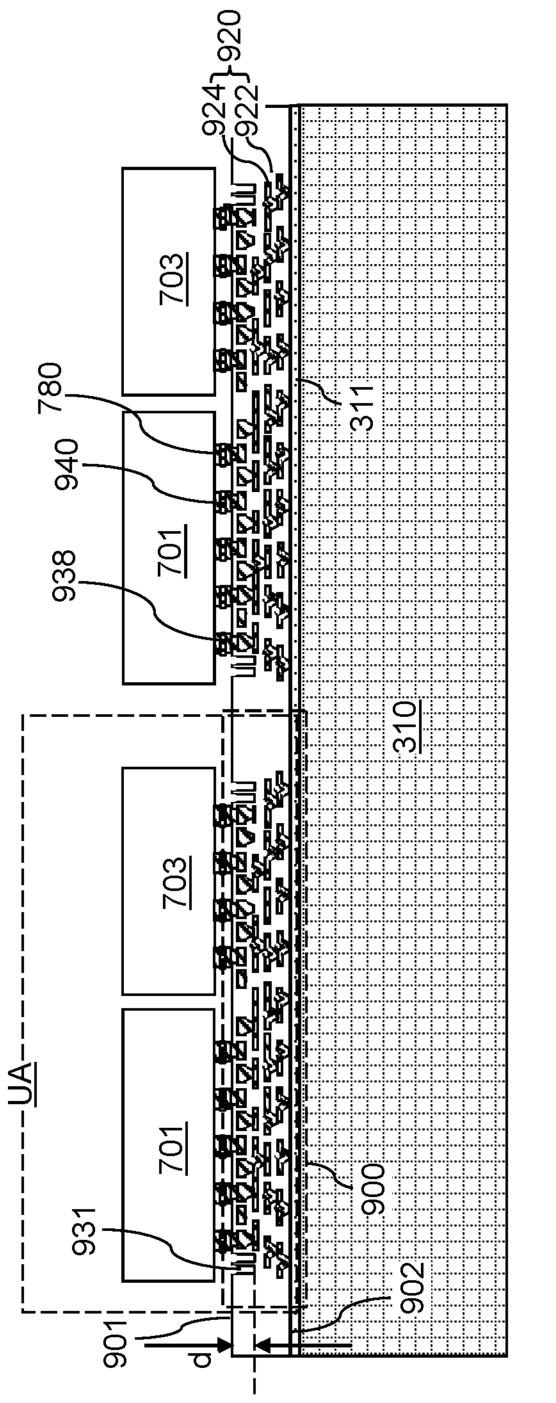
FIG. 4A is a vertical cross-sectional view of a region the structure after attaching semiconductor dies to the interposers using solder material portions according to an embodiment of the present disclosure.
Figure 4B:
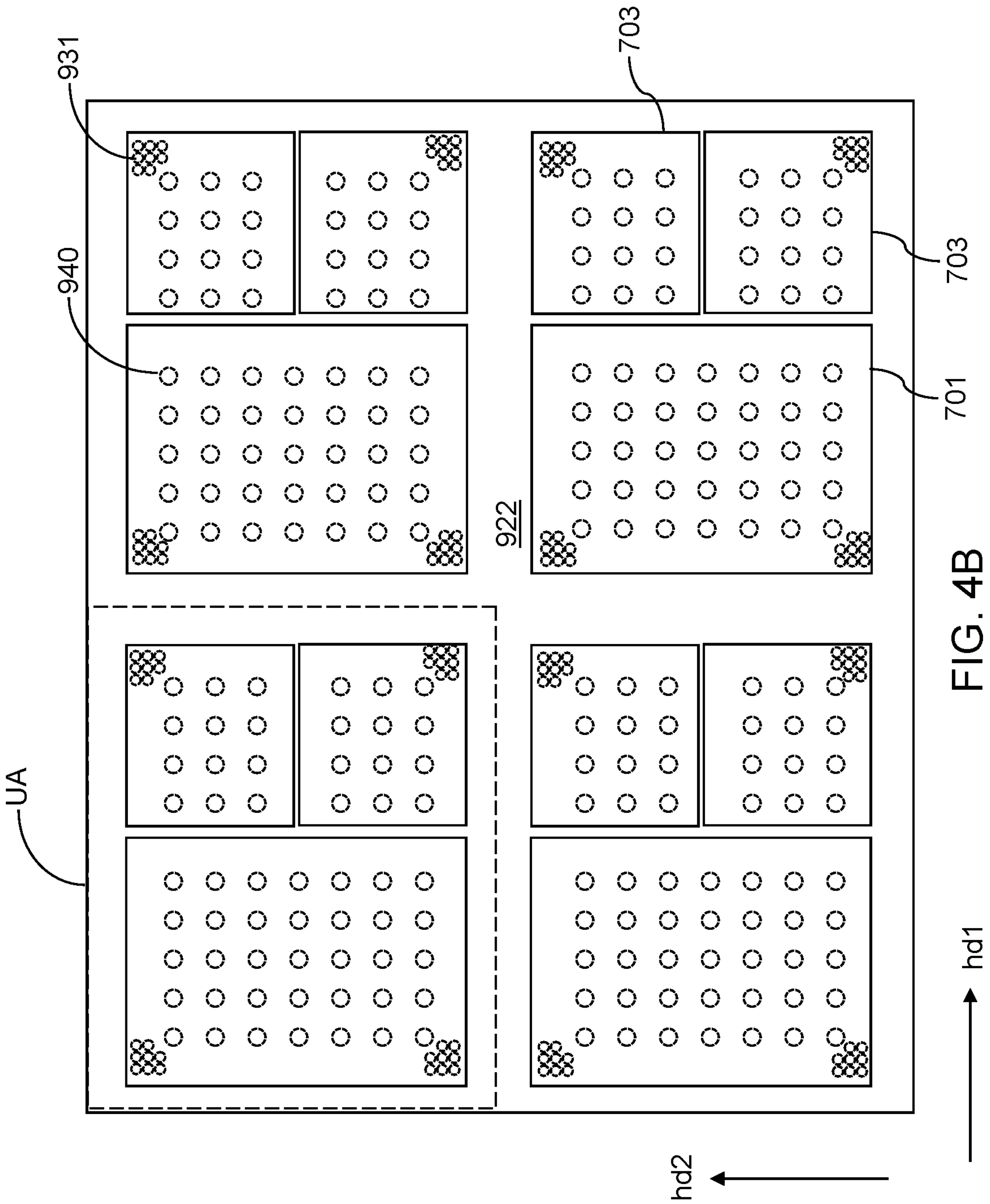
FIG. 4B is a top-down view of the region of the structure of FIG. 4A.

Referring to FIGS. 4A and 4B, a set of at least one semiconductor die (701, 703) may be bonded to each interposer 900. In one embodiment, the interposers 900 may be arranged as a two-dimensional periodic array, and multiple sets of at least one semiconductor die (701, 703) may be bonded to the interposers 900 as a two-dimensional periodic rectangular array of sets of the at least one semiconductor die (701, 703). Each set of at least one semiconductor die (701, 703) includes at least one semiconductor die (701, 703). Each set of at least one semiconductor die (701, 703) may include any set of at least one semiconductor die (701, 703) known in the art. In one embodiment, each set of at least one semiconductor die (701, 703) may comprise a plurality of semiconductor dies (701, 703). For example, each set of at least one semiconductor die (701, 703) may include at least one system-on-chip (SoC) die 701 and/or at least one memory die 703. Each SoC die 701 may comprise an application processor die, a central processing unit die, or a graphic processing unit die. In one embodiment, the at least one memory die 703 may comprise a high bandwidth memory (HBM) die that includes a vertical stack of static random access memory dies. In one embodiment, the at least one semiconductor die (701, 703) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame.

Each semiconductor die (701, 703) may comprise a respective array of on-die bump structures 780. For example, each SoC die 701 may comprise a respective array of on-die bump structures 780, and each memory die 703 may comprise a respective array of on-die bump structures 780. Each of the semiconductor dies (701, 703) may be positioned in a face-down position such that on-die bump structures 780 face the first solder material portions 940. Each set of at least one semiconductor die (701, 703) may be placed within a respective unit area UA. Placement of the semiconductor dies (701, 703) may be performed using a pick and place apparatus such that each of the on-die bump structures 780 may be placed on a top surface of a respective one of the first solder material portions 940.

Generally, an interposer 900 including on-interposer bump structure 938 thereupon may be provided, and at least one semiconductor die (701, 703) including a respective set of on-die bump structures 780 may be provided. The at least one semiconductor die (701, 703) may be bonded to the interposer 900 using first solder material portions 940 that are bonded to a respective on-interposer bump structure 938 and to a respective one of the on-die bump structures 780.

Each set of at least one semiconductor die (701, 703) may be attached to a respective interposer 900 through a respective set of first solder material portions 940. The plan view is a view along a vertical direction, which is the direction that is perpendicular to the planar top surface of the interposer layer.

Figure 4C:
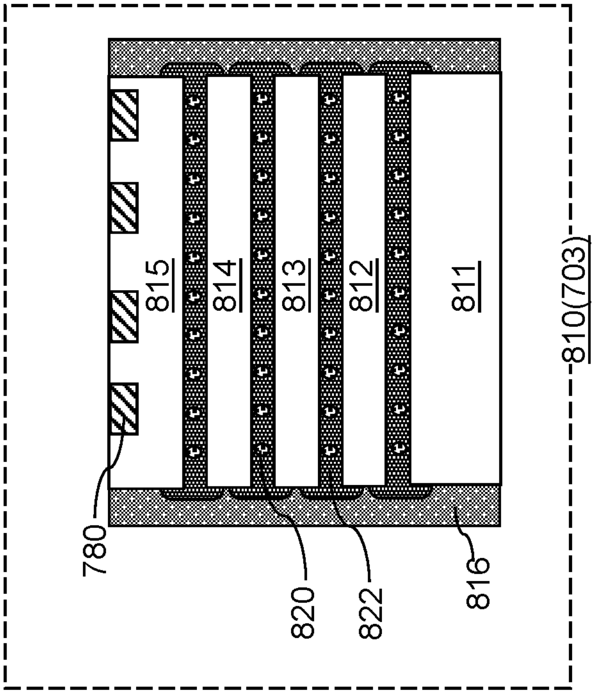
FIG. 4C is a magnified vertical cross-sectional view of a high bandwidth memory die.
Figure 5A:
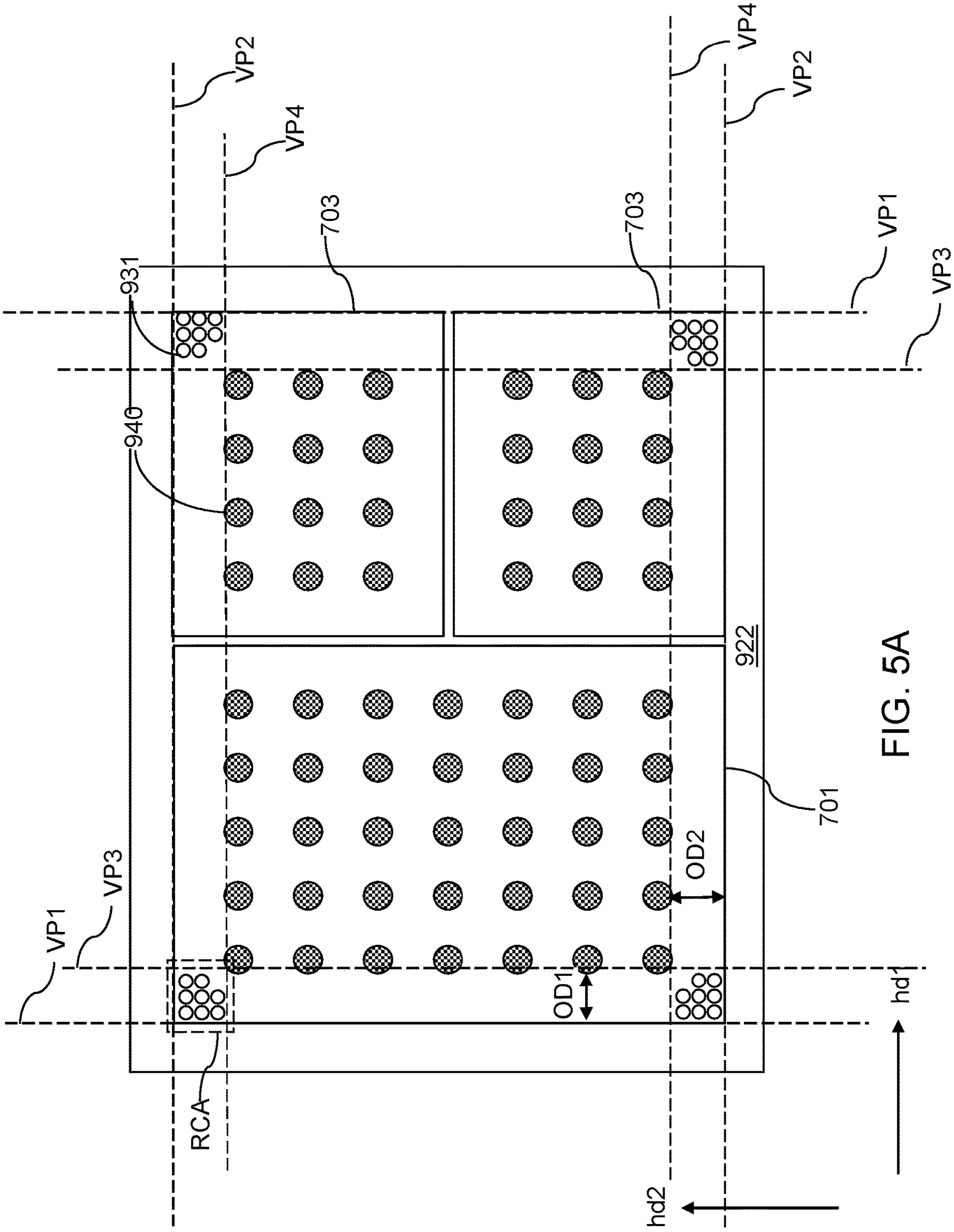
FIGS. 5A-5H are plan views illustrating alternative configurations of the structure of FIGS. 4A-4C according to various embodiments of the present disclosure.
Figure 5B:
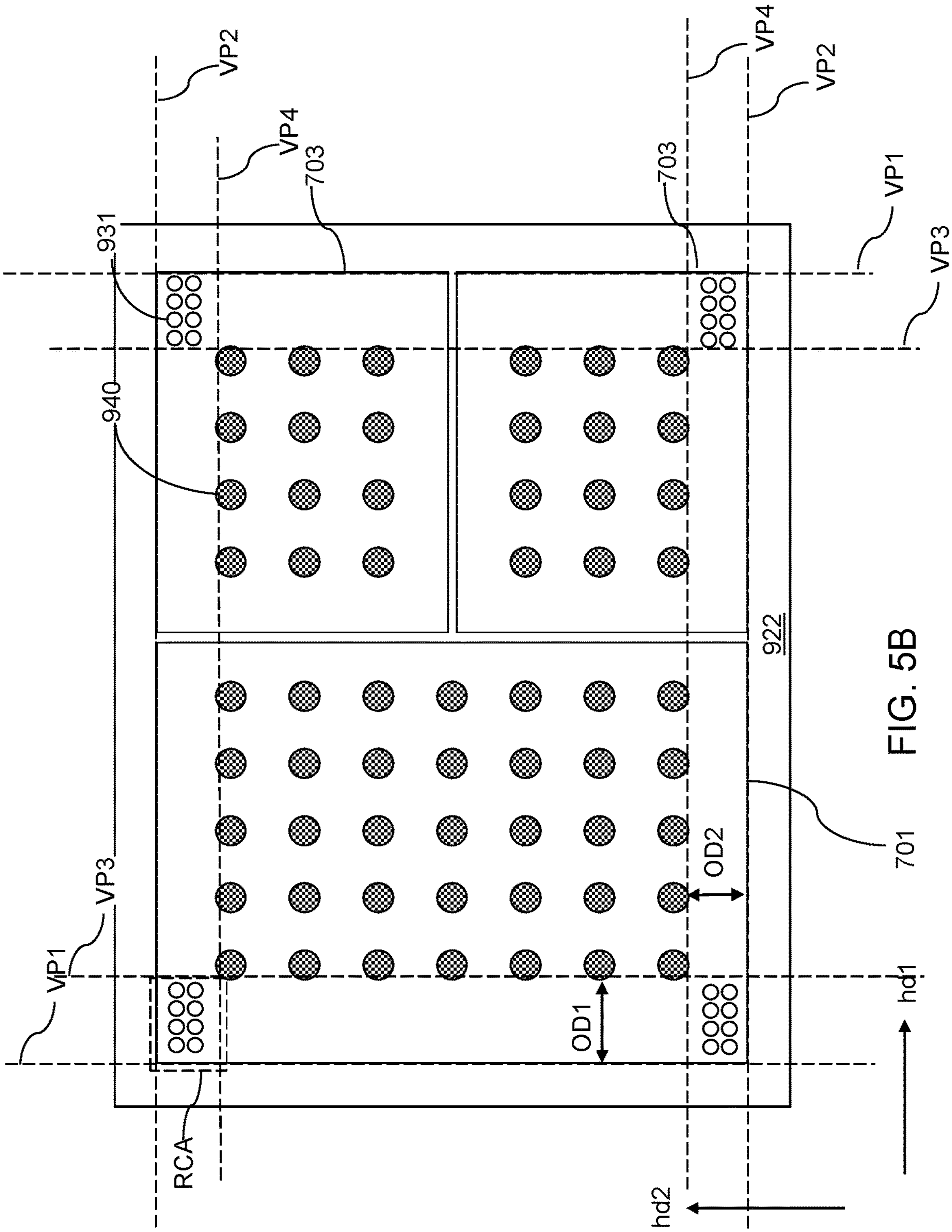
Figure 5C:
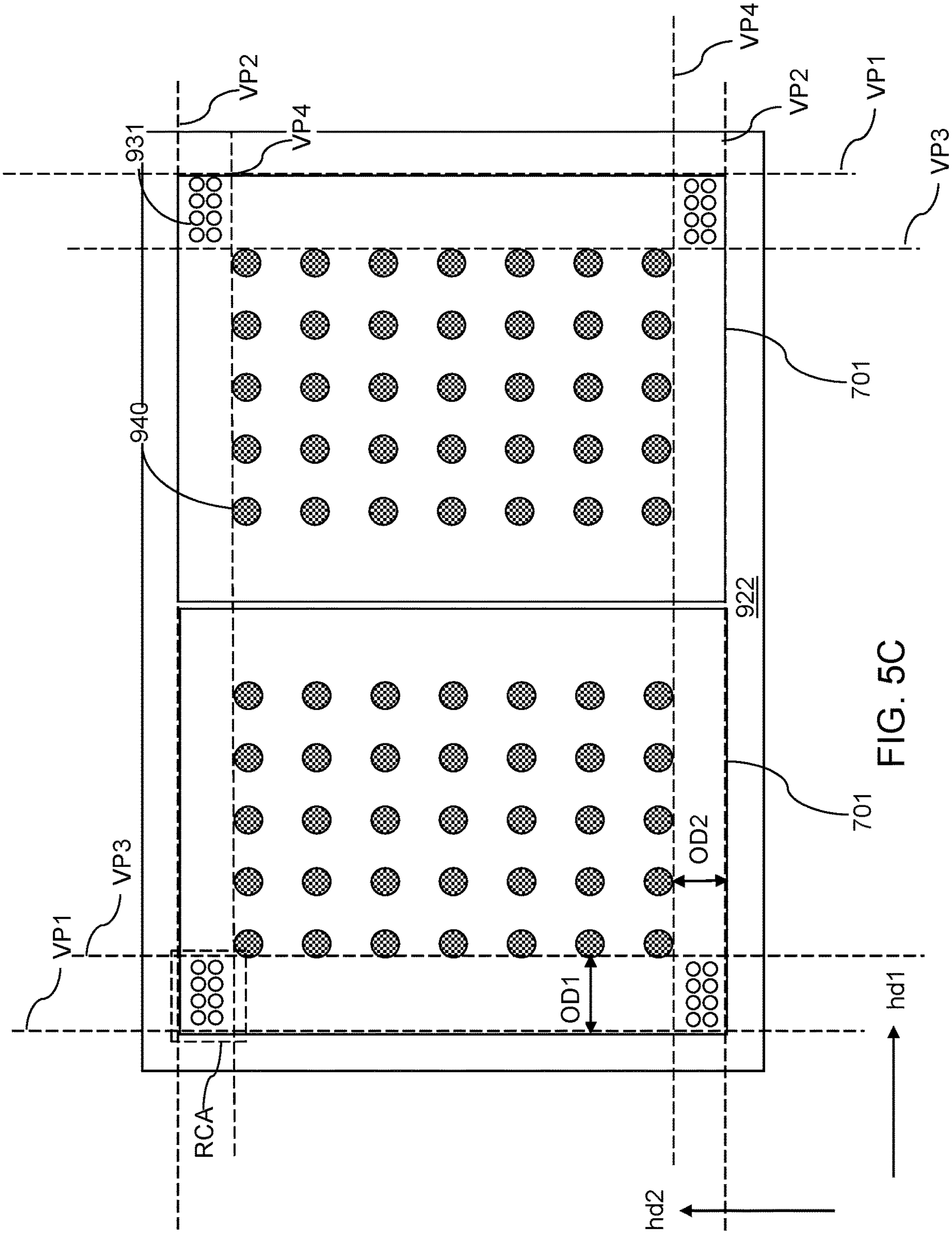
Figure 5D:
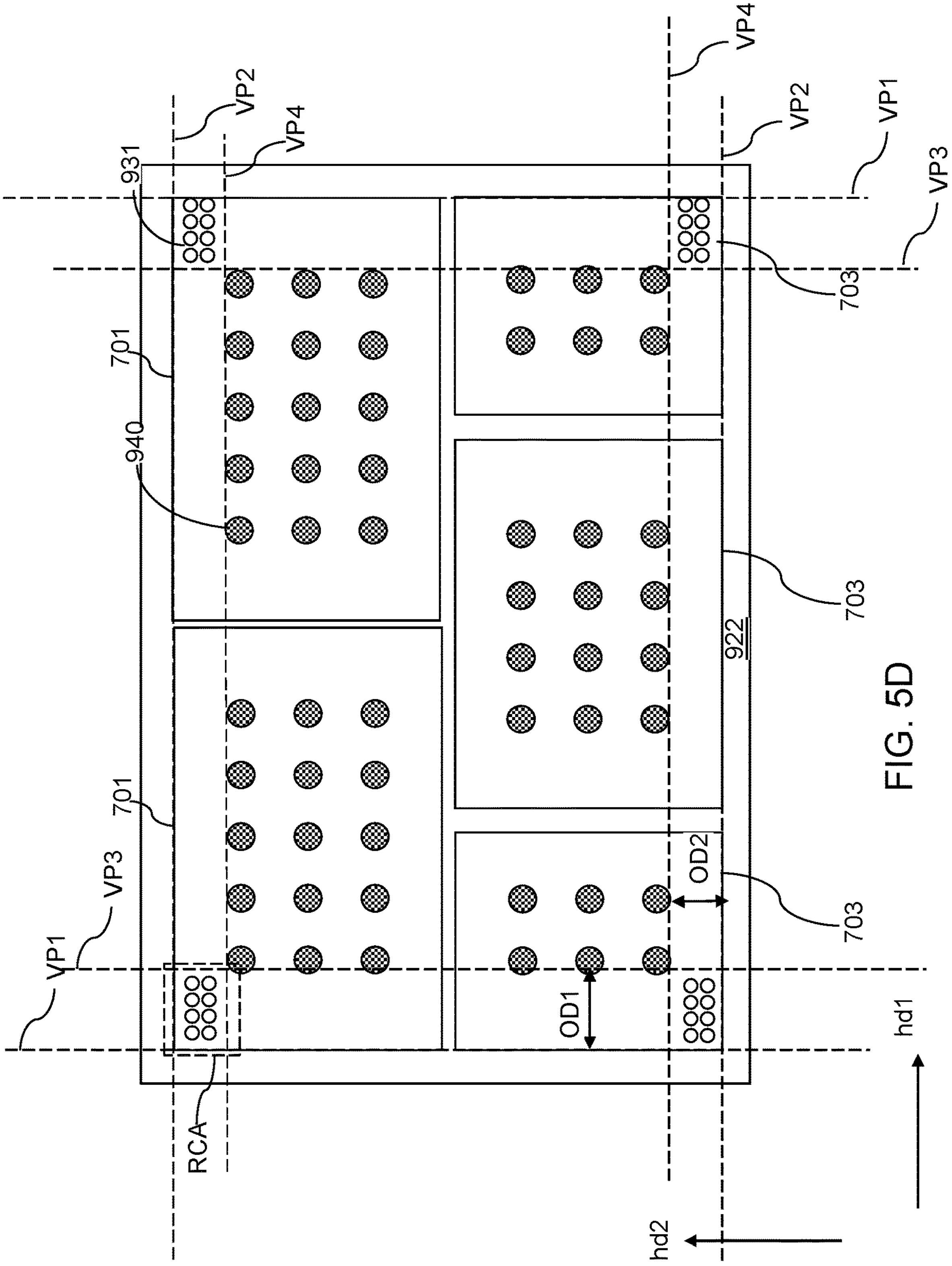
Figure 5E:
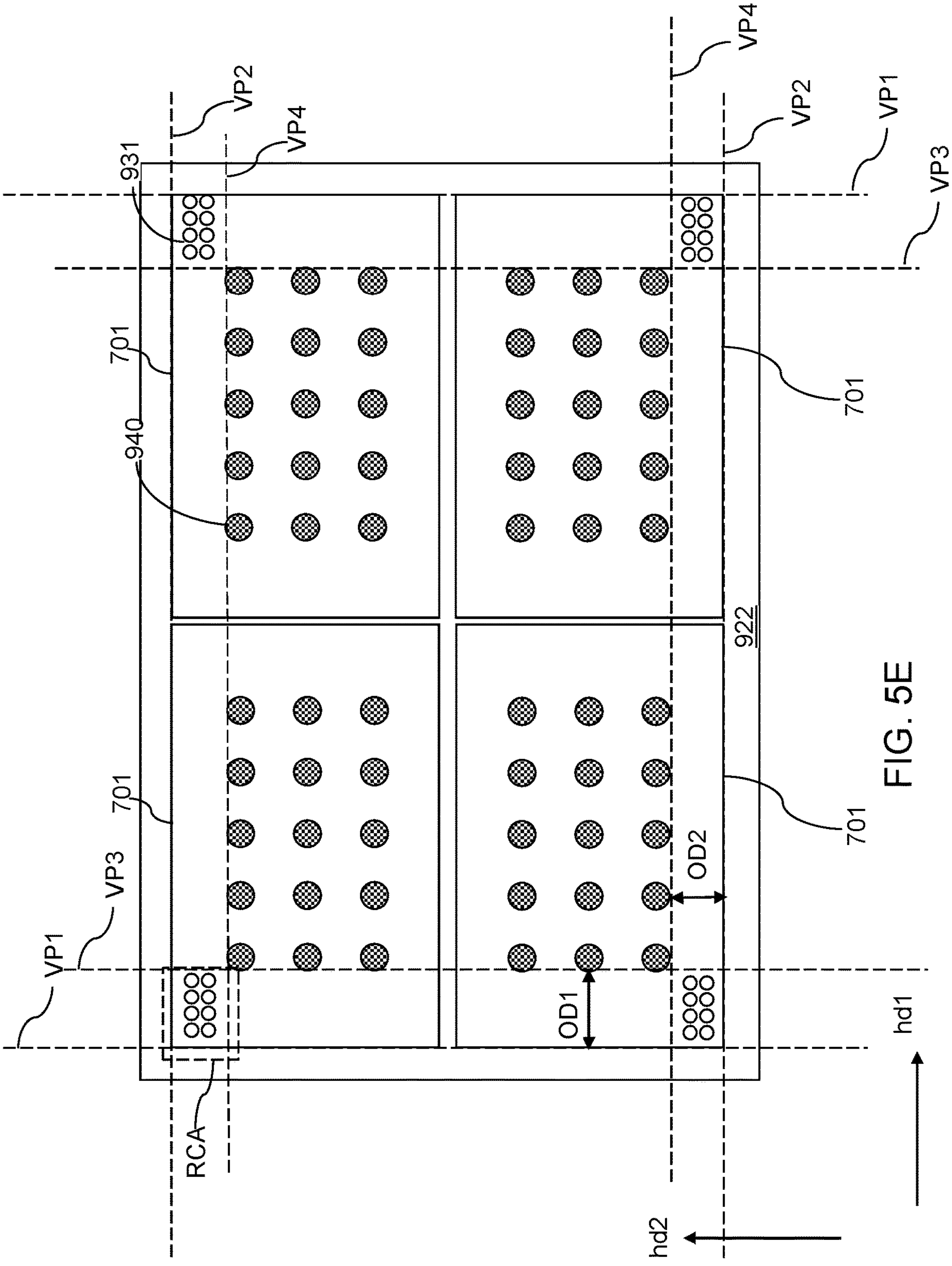
Figure 5F:
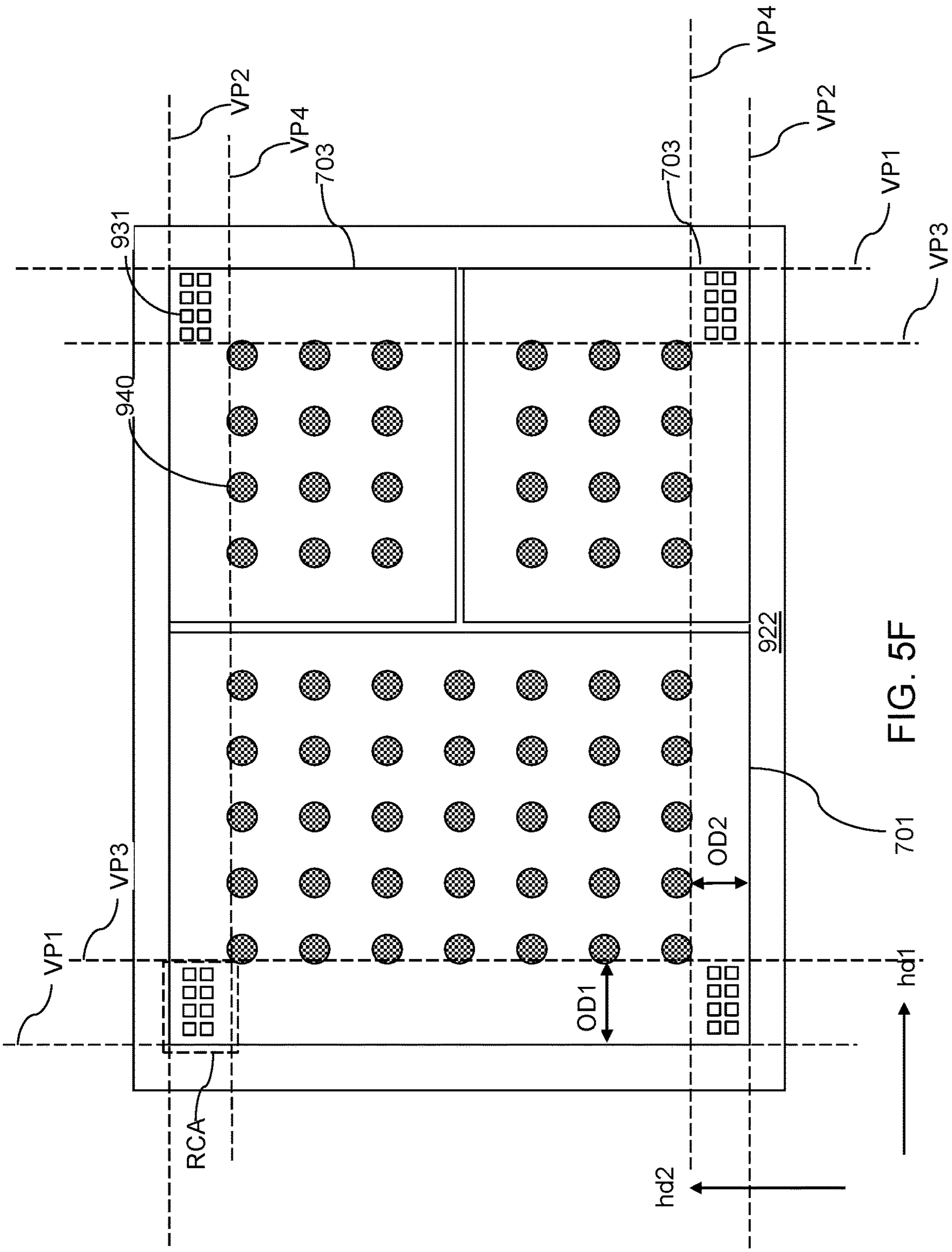
Figure 5G:
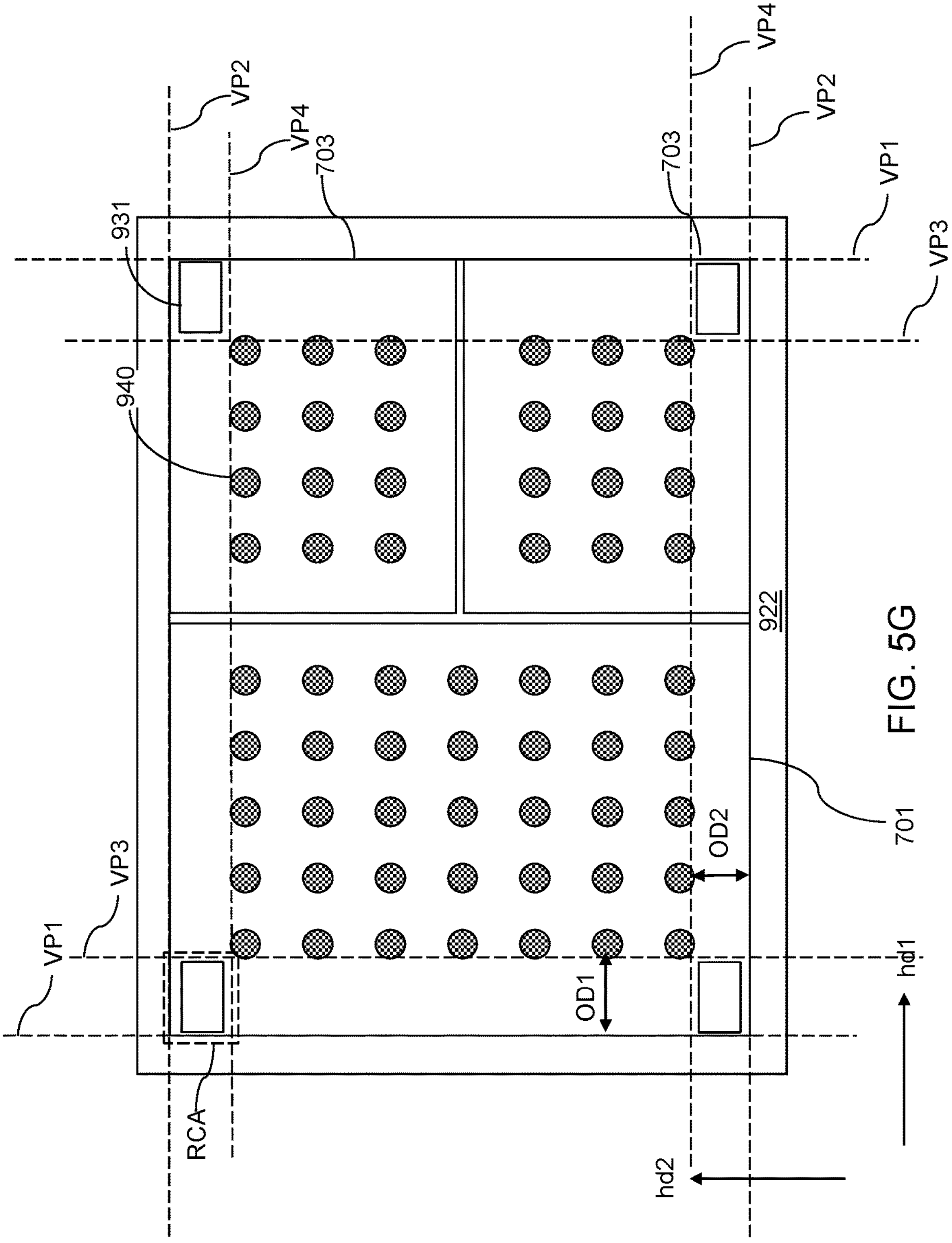
Figure 5H:
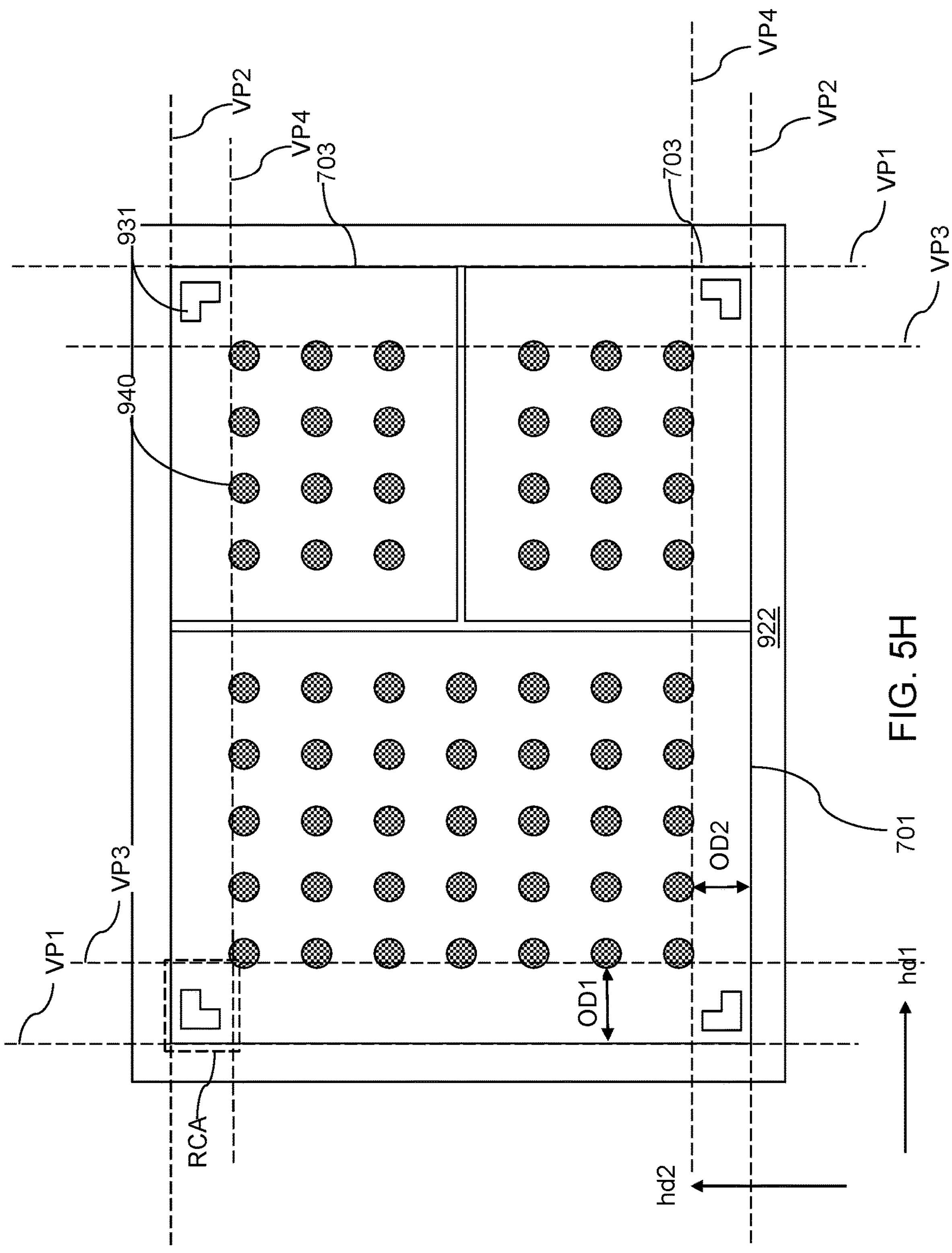

Referring to FIG. 4C, a high bandwidth memory (HBM) die 810 is illustrated, which may be used as a memory die 703 within the structures of FIGS. 4A and 4B. The HBM die 810 may include a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portions 822 that laterally surrounds a respective set of microbumps 820. The HBM die 810 may comprise an array of on-die bump structures 780 configured to be bonded to a subset of an array of on-interposer bump structure 938 within a unit area UA. The HBM die 810 may, or may not, be configured to provide a high bandwidth as defined under JEDEC standards, i.e., standards defined by The JEDEC Solid State Technology Association.

Referring collectively to FIGS. 4A-4C and generally speaking, a respective set of at least one semiconductor die (701, 703) may be attached to each of the at least one interposer 900. Each area of the recesses 931 may be entirely covered by a respective semiconductor die (701, 703) upon attaching the respective set of at least one semiconductor die (701, 703) to each of the at least one interposer 900. At least one semiconductor die (701, 703) may be attached to the interposer 900 through a respective array of solder material portions 940. The at least one semiconductor die (701, 703) may comprise a first semiconductor die (701 or 703) that is attached to the interposer 900 through a first array of solder material portions 940, a second semiconductor die (701 or 703) that is attached to the interposer 900 through a second array of solder material portions 940, etc.

In one embodiment, the at least one semiconductor die (701, 703) comprises a plurality of semiconductor dies (701, 703), and at least one semiconductor die (701, 703) selected from the plurality of semiconductor dies (701, 703) comprises at least two corner regions that do not have any areal overlap with the recesses 931.

FIGS. 5A-5H are plan views illustrating alternative UA configurations of the structure of FIGS. 4A-4C according to various embodiments of the present disclosure.

First sidewalls of the at least one semiconductor die (701, 703) that are located at a periphery of the at least one semiconductor die (701, 703) and perpendicular to the first horizontal direction hd1 may be aligned to a pair of first vertical planes VP1. Second sidewalls of the at least one semiconductor die (701, 703) that are located at a periphery of the at least one semiconductor die (701, 703) and perpendicular to the second horizontal direction hd2 may be aligned to a pair of second vertical planes VP2. The first reference vertical planes RVP1 as defined in FIG. 2C are hereafter referred to as third vertical planes VP3. The second reference vertical planes RVP2 as defined in FIG. 2C are hereafter referred to as fourth vertical planes VP4.

In some configurations such as the configurations illustrated in FIGS. 4B, 5A, 5B, 5C, 5D, 5E, and 5F, the recesses 931 comprise an array of recesses 931 having a first periodicity along a first horizontal direction hd1 and/or having a second periodicity along a second horizontal direction hd2 and located in one of the corner regions of a respective interposer 900 (which is located within a respective unit area UA). In some configurations such as the configurations illustrated in FIGS. 5G and 5H, the recesses 931 may comprise a discrete recess 931 located in a respective corner region of a respective interposer 900 such that each corner region of each interposer 900 includes no more than one recess 931 therein.

In some configurations such as the configurations illustrated in FIGS. 4B, 5A, 5B, 5C, 5D, and 5E, the recesses 931 may have a respective horizontal cross-sectional shape of a circle, an ellipse, or an oval. In some configurations such as the configurations illustrated in FIGS. 5F, 5G, and 5H, the recesses may have a respective horizontal cross-sectional shape of a polygon such as a rectangle, a triangle, or any other polygonal shape. Generally, each of the recesses 931 may have a respective horizontal cross-sectional shape of any two-dimensional curvilinear shape having a closed periphery.

In some embodiments, all on-interposer bump structures 938 of an interposer 900 within a unit area UA may be laterally offset inward from sidewalls semiconductor dies (701, 703) to be subsequently bonded to the interposer 900 at least by offset distances. For example, all on-interposer bump structures 928 of an interposer 900 within a unit area UA may be laterally offset inward from first sidewalls of the semiconductor dies (701, 703) that are perpendicular to the first horizontal direction hd1 at least by a first offset distance OD1. All on-interposer bump structures 928 of an interposer 900 within a unit area UA may be laterally offset inward from second sidewalls of the semiconductor dies (701, 703) that are perpendicular to the first horizontal direction hd1 at least by a second offset distance OD 2. Each of the first offset distance OD 1 and the second offset distance OD 2 may be in a range from 50 microns to 500 microns, although lesser and greater dimensions may also be used.

In some embodiments, each recess 931 may be formed within a respective rectangular corner area RCA bounded by a first vertical plane VP1 including a first sidewall of a semiconductor die (701 or 703) that is perpendicular to the first horizontal direction hd1, a second vertical plane VP2 including a second sidewall of the semiconductor die (701 or 703) that is perpendicular to the second horizontal direction hd2, a third vertical plane VP3 that is laterally offset from the first vertical plane by the first offset distance od1 toward a geometrical center of the semiconductor die (701 or 703), and a fourth vertical plane VP4 that is laterally offset from the second vertical plane by the second offset distance od2 toward the geometrical center of the semiconductor die ((701 or 703). As such, the size of each rectangular area may be the product of the first lateral offset distance OD1 and the second lateral offset distance OD2. In some embodiments, the total area of all recess(es) within each corner region of an interposer 900 may be in a range from 5% to 90% of the product of the first offset distance od1 and the second offset distance od2. Alternatively, at least a portion of a recess 931 may be located outside rectangular areas defined by a respective set of the first vertical sidewall, the second vertical sidewall, the third vertical sidewall, and the fourth vertical sidewall in some embodiments.

Figure 6A:
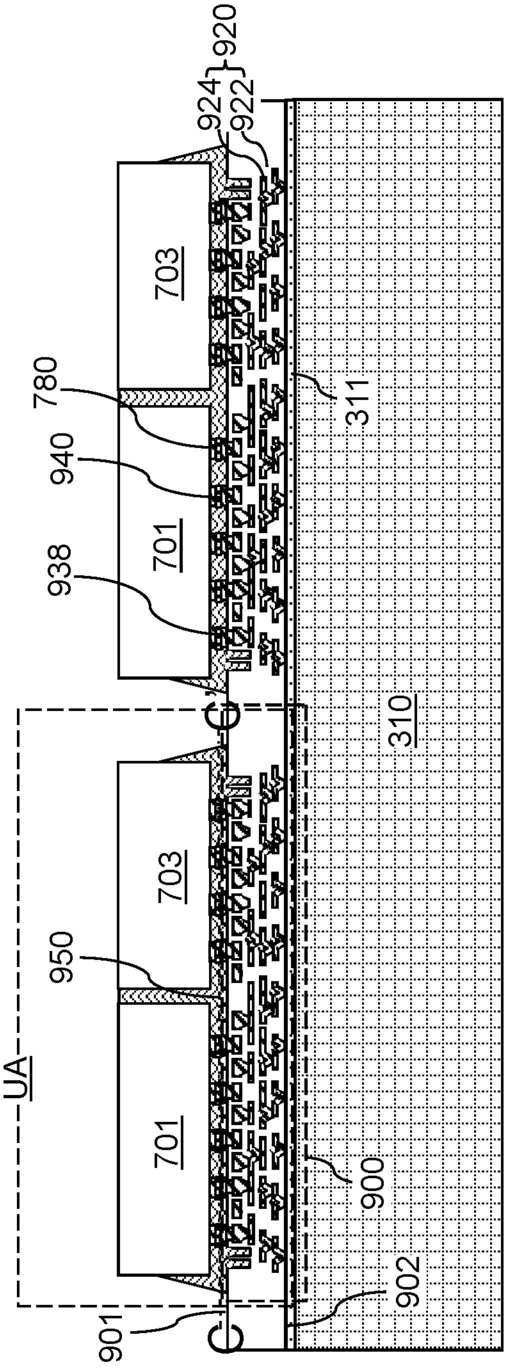
FIG. 6A is a vertical cross-sectional view of a region the structure after formation of underfill material portions according to an embodiment of the present disclosure.
Figure 6B:
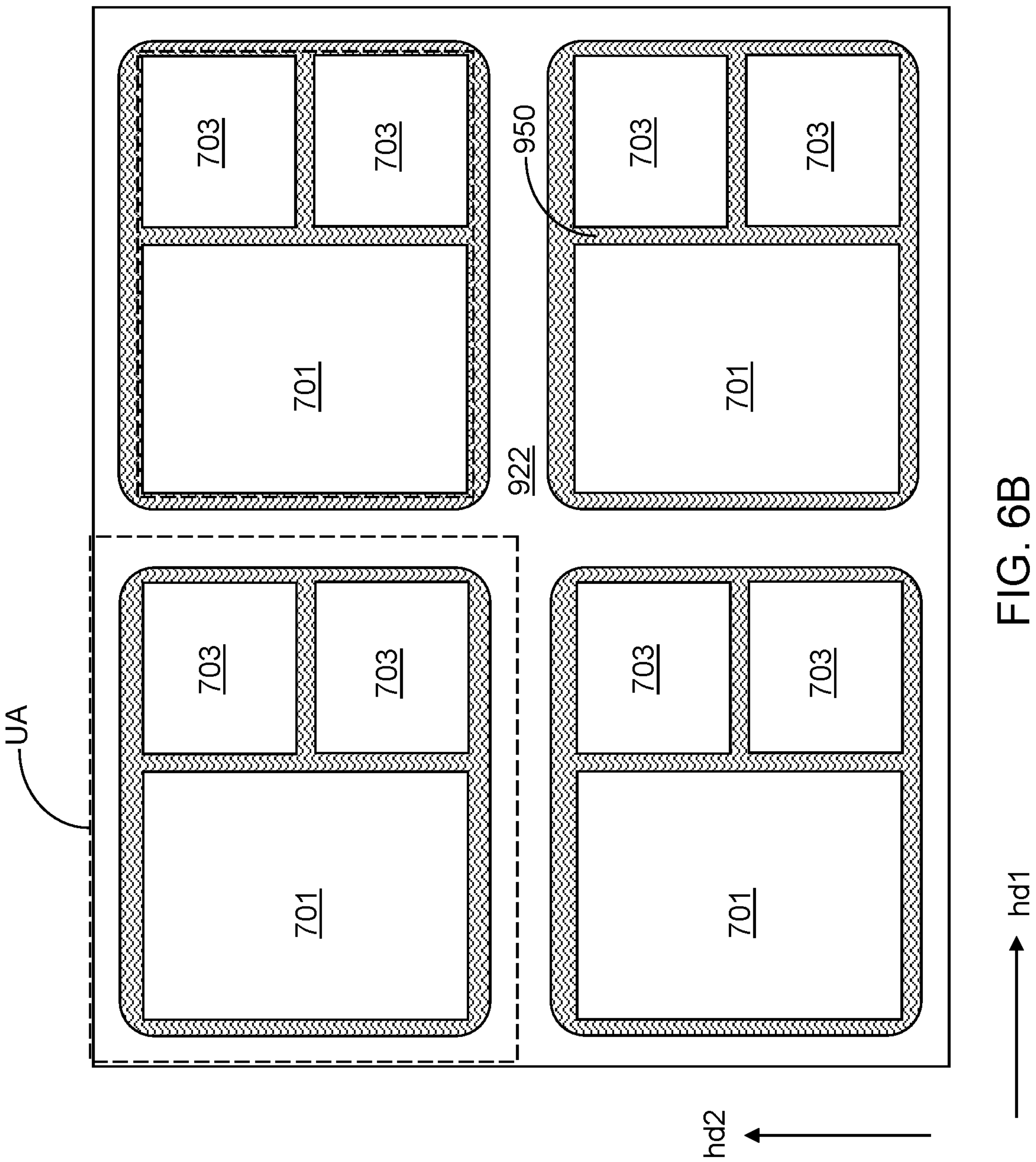
FIG. 6B is a top-down view of the region of the structure of FIG. 6A.
Figure 6C:
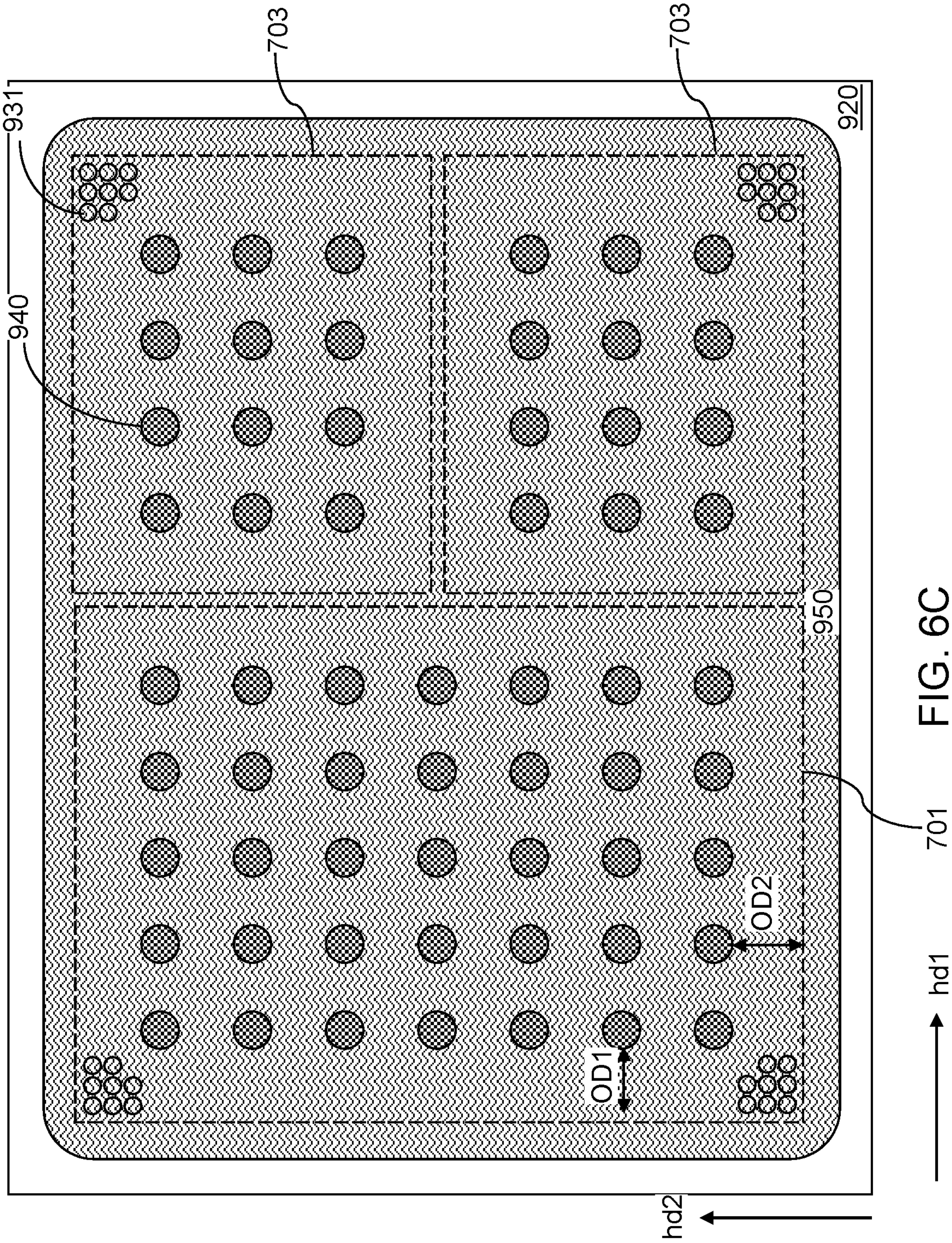
FIG. 6C is a horizontal cross-sectional view of the structure along the horizontal plane A-A' of FIG. 6A.

Referring to FIGS. 6A-6C, a first underfill material may be applied into each gap between the interposers 900 and sets of at least one semiconductor die (701, 703) that are bonded to the interposers 900. The first underfill material may comprise any underfill material known in the art. A first underfill material portion 950 may be formed within each unit area UA between an interposer 900 and an overlying set of at least one semiconductor die (701, 703). The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method.

Within each unit area UA, a first underfill material portion 950 may laterally surround, and contact, each of the first solder material portions 940 within the unit area UA. The first underfill material portion 950 may be formed around, and contact, the first solder material portions 940, the on-interposer bump structure 938, and the on-die bump structures 780 in the unit area UA. The first underfill material portion 950 is formed between semiconductor dies (701, 703) and an interposer 900, and thus, is also referred to as a die-interposer underfill material portion, or a DI underfill material portion.

Each interposer 900 in a unit area UA comprises on-interposer bump structure 938. At least one semiconductor die (701, 703) comprising a respective set of on-die bump structures 780 is attached to the on-interposer bump structure 938 through a respective set of first solder material portions 940 within each unit area UA. Within each unit area UA, a first underfill material portion 950 laterally surrounds the on-interposer bump structure 938 and the on-die bump structures 780 of the at least one semiconductor die (701, 703).

Generally, an underfill material portion 950 may be formed between each facing pair of the at least one interposer 900 and at least one set of the at least one semiconductor die (701, 703). In one embodiment, each interposer 900 comprises on-interposer bump structures 938 located above the horizontal plane including the first horizontal surface 901 of the interposer 900, and the horizontally-extending portion of the underfill material portion 950 is located above the horizontal plane including the first horizontal surface 901 of the interposer 900.

According to an aspect of the present disclosure, each underfill material portion 950 comprises respective downward-protruding anchor portions 950A that fill a respective subset of the recesses 931. In one embodiment, each underfill material portion 950 may comprise at least four downward-protruding anchor portions 950A that fill at least four recesses 931. Each underfill material portion 950 comprises a horizontally-extending portion located above the horizontal plane including the first horizontal surface 901 of the interposers 900 and laterally surrounds each array of solder material portions 940. Each of the downward-protruding anchor portions 950A protrudes downward from a horizontally-extending portion of the underfill material portion 950 into the recesses 931, and may fill an entirety of each recess 931.

In one embodiment, at least first downward-protruding anchor portion 950A selected from the downward-protruding anchor portions 950A of an underfill material portion 950 may be located within an area of a first semiconductor die (701 or 703) selected from the at least one semiconductor die (701, 703) in a plan view. In one embodiment, the first downward-protruding anchor portion 950A is more proximal to sidewalls of the first semiconductor die (701 or 703) than any solder material portion 940 within the first array of solder material portions 940 is to the sidewalls of the first semiconductor die (701 or 703). In one embodiment, each of the downward-protruding anchor portions 950A of the underfill material portion 950 is located entirely within an area of a respective one of the at least one semiconductor die (701, 703) in a plan view.

In one embodiment, the at least one semiconductor die (701, 703) that is attached to an interposer 900 comprises a plurality of semiconductor dies (701, 703), and one or more of the at least one semiconductor die (701, 703) comprises a respective corner region that does not have any areal overlap with the downward-protruding anchor portions 950A in a plan view.

In one embodiment, a first semiconductor die (701 or 703) selected from the at least one semiconductor die (701, 703) that is attached to an interposer 900 comprises first sidewalls laterally extending along a first horizontal direction hd1 and second sidewalls laterally extending along a second horizontal direction hd2. The first semiconductor die (701 or 703) is attached to the interposer 900 through a first array of solder material portions 940 and has areal overlap with a first downward-protruding anchor portion 950A selected from the downward-protruding anchor portions 950A. The first downward-protruding anchor portion 950A is more proximal to a proximal one of the first sidewalls than any solder material portion 940 within the first array of solder material portions 940 is to the first sidewalls. The first downward-protruding anchor portion 950A is more proximal to a proximal one of the second sidewalls than any solder material portion 940 within the first array of solder material portions 940 is to the second sidewalls. In one embodiment, the entirety of the first downward-protruding anchor portion 950A may be located within a rectangular area having a first width of the first offset distance od1 and having a second width of the second offset distance od2 and located at a corner region of one of the at least one semiconductor die (701 or 703).

FIGS. 7A-7E are vertical cross-sectional views of various configurations of a recess in the structure of FIGS. 6A-6C.

Figure 7B:
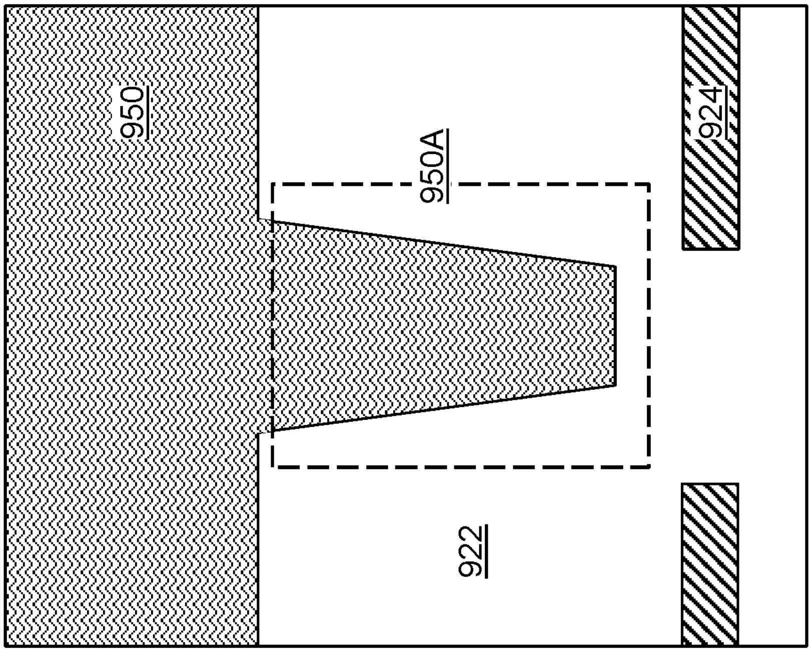
FIGS. 7A-7E are vertical cross-sectional views of various configurations of a recess in the structure of FIGS. 6A-6C.
Figure 7A:
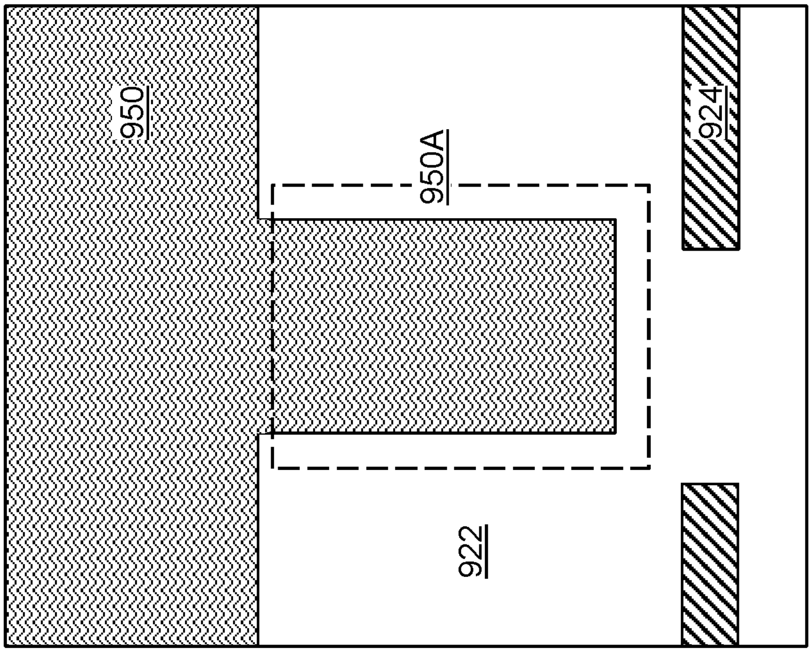

Referring to FIG. 7A, a first configuration of a recess 931 as filled by a downward-protruding anchor portion 950A is shown.

Referring to FIG. 7B, a second configuration of a recess 931 as filled by a downward-protruding anchor portion 950A is shown. The taper angle of the sidewalls, as measured from a vertical direction, may be in a range from 0.1 degree to 15 degrees, such as from 1 degree to 5 degrees, although lesser and greater taper angles may also be used.

Figure 7C:
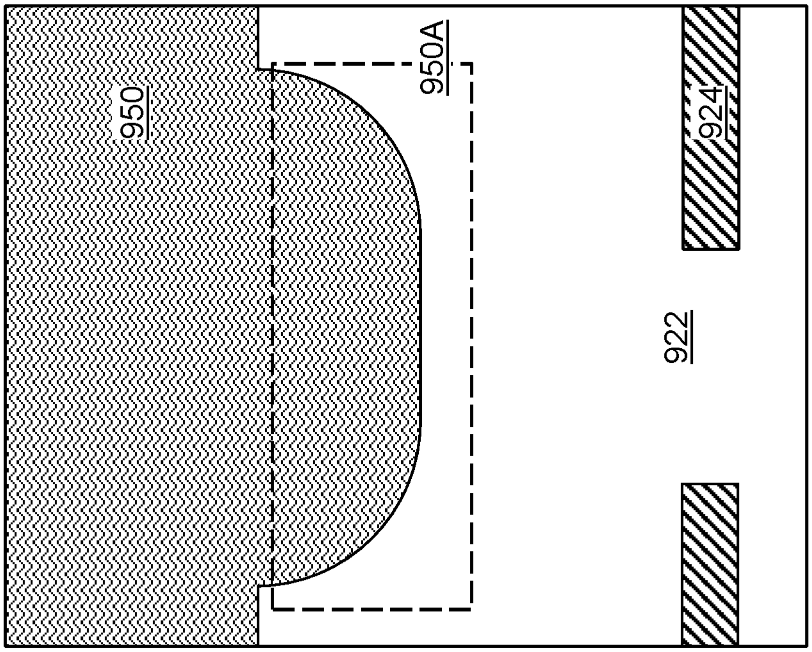

Referring to FIG. 7C, a third configuration of a recess 931 as filled by a downward-protruding anchor portion 950A is shown.

Figure 7D:
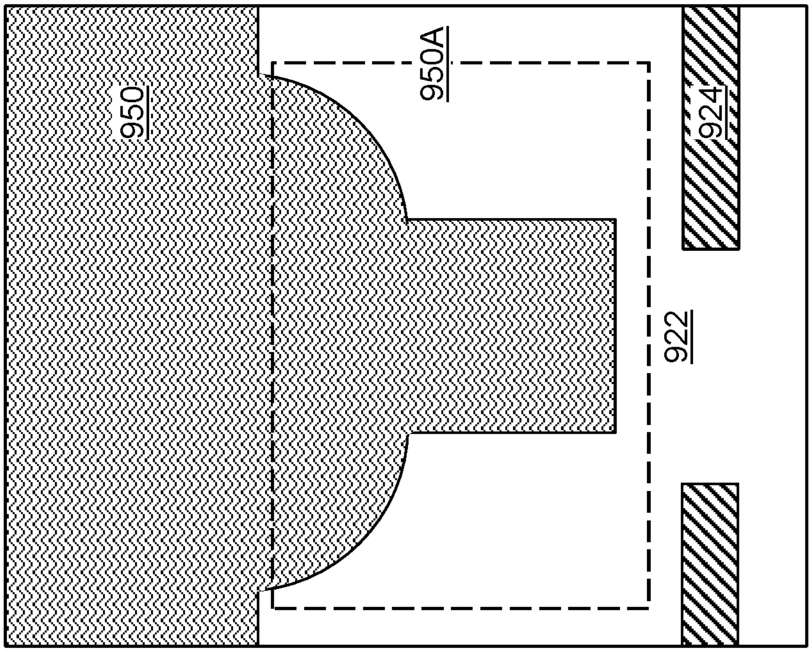

Referring to FIG. 7D, a fourth configuration of a recess 931 as filled by a downward-protruding anchor portion 950A is shown.

Figure 7E:
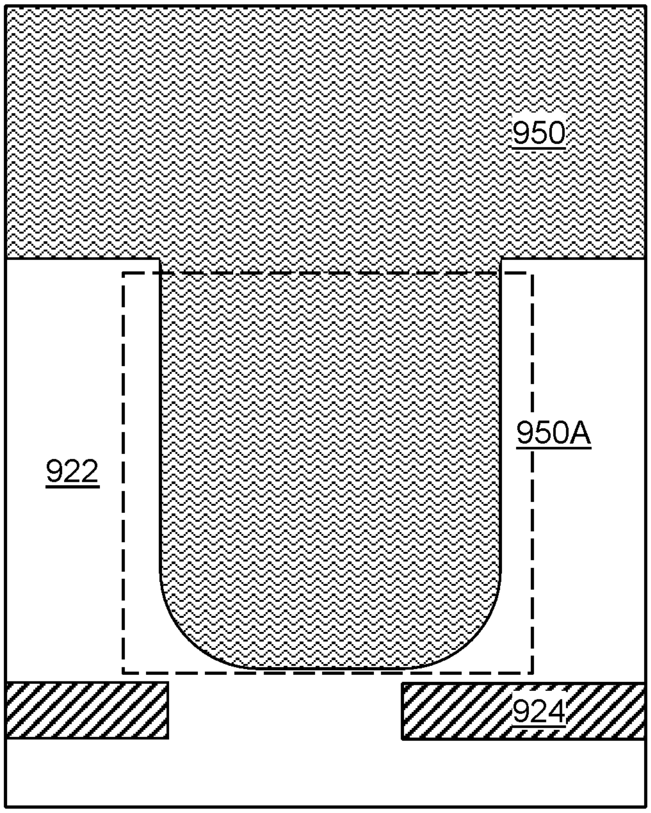

Referring to FIG. 7E, a fifth configuration of a recess 931 as filled by a downward-protruding anchor portion 950A is shown immediately.

Figure 8A:
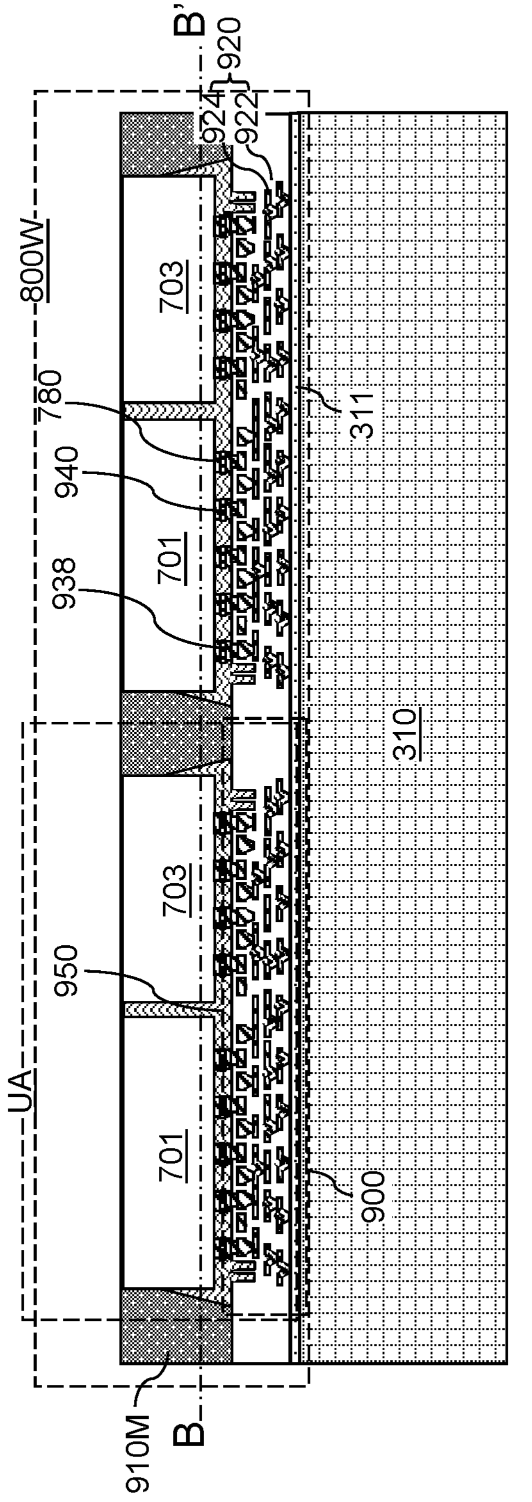
FIG. 8A is a vertical cross-sectional view of a region of the structure after formation of an epoxy molding compound (EMC) matrix according to an embodiment of the present disclosure.
Figure 8B:
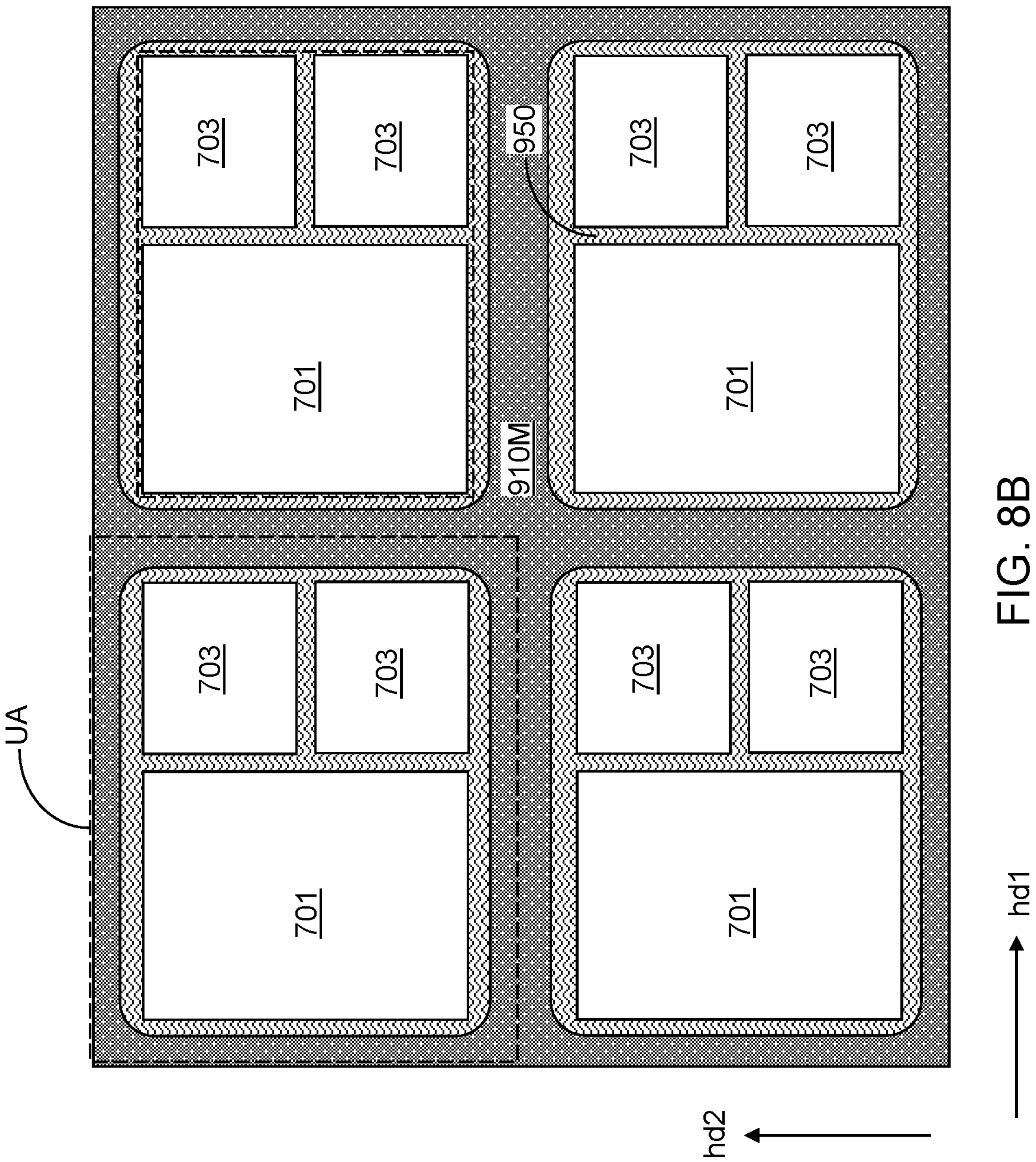
FIG. 8B is a top-down view of the region of the structure of FIG. 8A.

Referring to FIGS. 8A and 8B, an epoxy molding compound (EMC) may be applied to the gaps between contiguous assemblies of a respective set of semiconductor dies (701, 703) and a first underfill material portion 950.

The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 311 in embodiments in which the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (701, 703) and a first underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds a respective a set of semiconductor dies (701, 703) and a respective first underfill material portion 950. Young's modulus of pure epoxy is about 3.35 GPa, and Young's modulus of the EMC may be higher than Young's modulus of pure epoxy by adding additives. Young's modulus of EMC may be greater than 3.5 GPa.

Portions of the EMC matrix 910M that overlies the horizontal plane including the top surfaces of the semiconductor dies (701, 703) may be removed by a planarization process. For example, the portions of the EMC matrix 910M that overlies the horizontal plane may be removed using a chemical mechanical planarization (CMP). The combination of the remaining portion of the EMC matrix 910M, the semiconductor dies (701, 703), the first underfill material portions 950, and the two-dimensional array of interposers 900 comprises a reconstituted wafer 800W. Each portion of the EMC matrix 910M located within a unit area UA constitutes an EMC die frame. The EMC matrix 910 may be laterally spaced from each of the recesses 931 by portions of the first underfill material 950.

Figure 9:
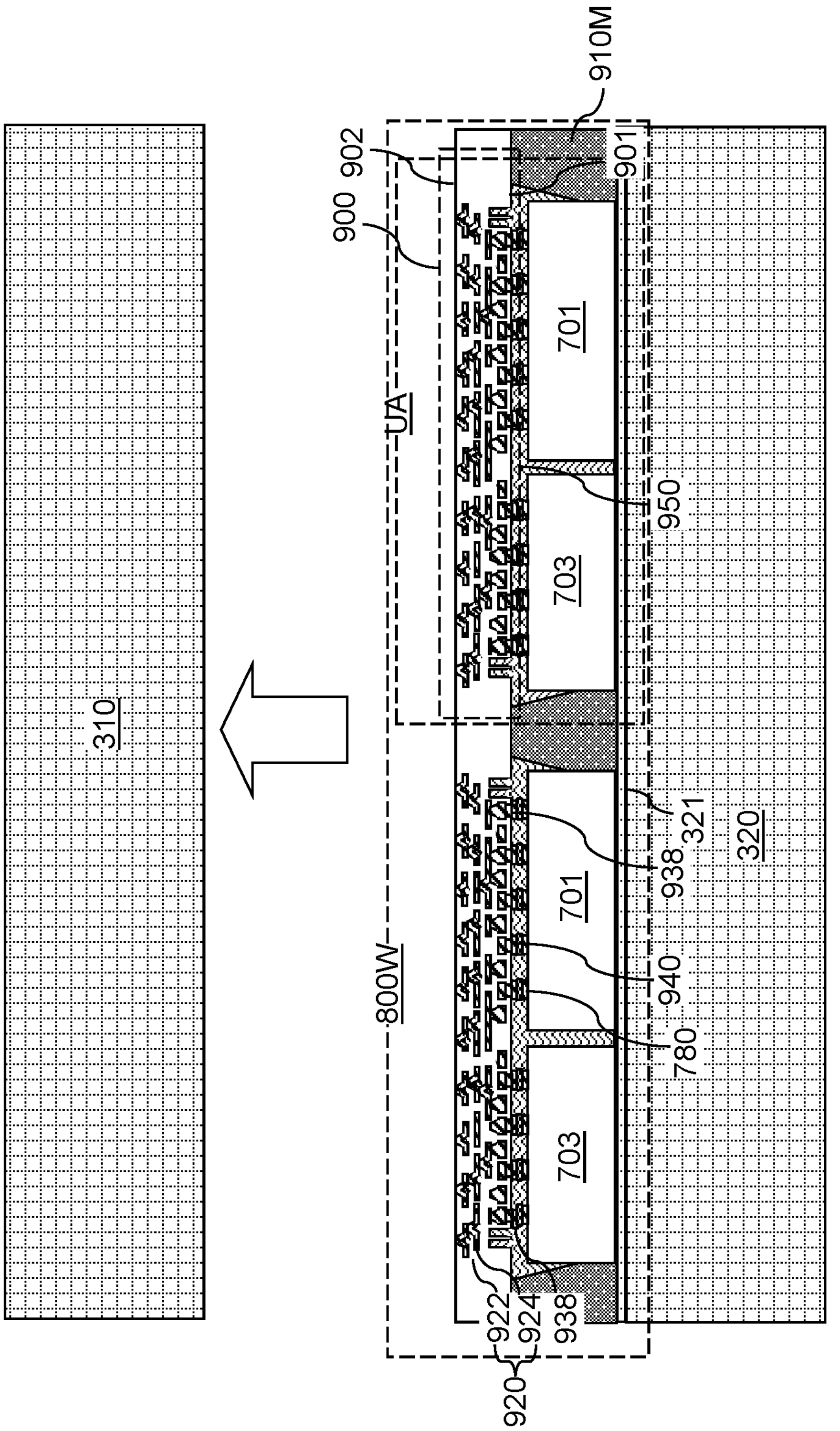
FIG. 9 is a vertical cross-sectional view of a region of the structure after attaching a second carrier substrate and detaching the first carrier substrate according to an embodiment of the present disclosure.

Referring to FIG. 9, a second adhesive layer 321 may be applied to the physically exposed planar surface of the reconstituted wafer 800W, i.e., the physically exposed surfaces of the EMC matrix 910M, the semiconductor dies (701, 703), and the first underfill material portions 950. In one embodiment, the second adhesive layer 321 may comprise a same material as, or may comprise a different material from, the material of the first adhesive layer 311. In embodiments in which the first adhesive layer 311 comprises a thermally decomposing adhesive material, the second adhesive layer 321 may comprise another thermally decomposing adhesive material that decomposes at a higher temperature, or may comprise a light-to-heat conversion material.

A second carrier substrate 320 may be attached to the second adhesive layer 321. The second carrier substrate 320 may be attached to the opposite side of the reconstituted wafer 800W relative to the first carrier substrate 310. Generally, the second carrier substrate 320 may comprise any material that may be used for the first carrier substrate 310. The thickness of the second carrier substrate 320 may be in a range from 500 microns to 2,000 microns, although lesser and greater thicknesses may also be used.

The first adhesive layer 311 may be decomposed by ultraviolet radiation or by a thermal anneal at a debonding temperature. In embodiments in which the first carrier substrate 310 includes an optically transparent material and the first adhesive layer 311 includes an LTHC layer, the first adhesive layer 311 may be decomposed by irradiating ultraviolet light through the transparent carrier substrate. The LTHC layer may be absorb the ultraviolet radiation and generate heat, which decomposes the material of the LTHC layer and cause the transparent first carrier substrate 310 to be detached from the reconstituted wafer 800W. In embodiments in which the first adhesive layer 311 includes a thermally decomposing adhesive material, a thermal anneal process at a debonding temperature may be performed to detach the first carrier substrate 310 from the reconstituted wafer 800W.

Figure 10:
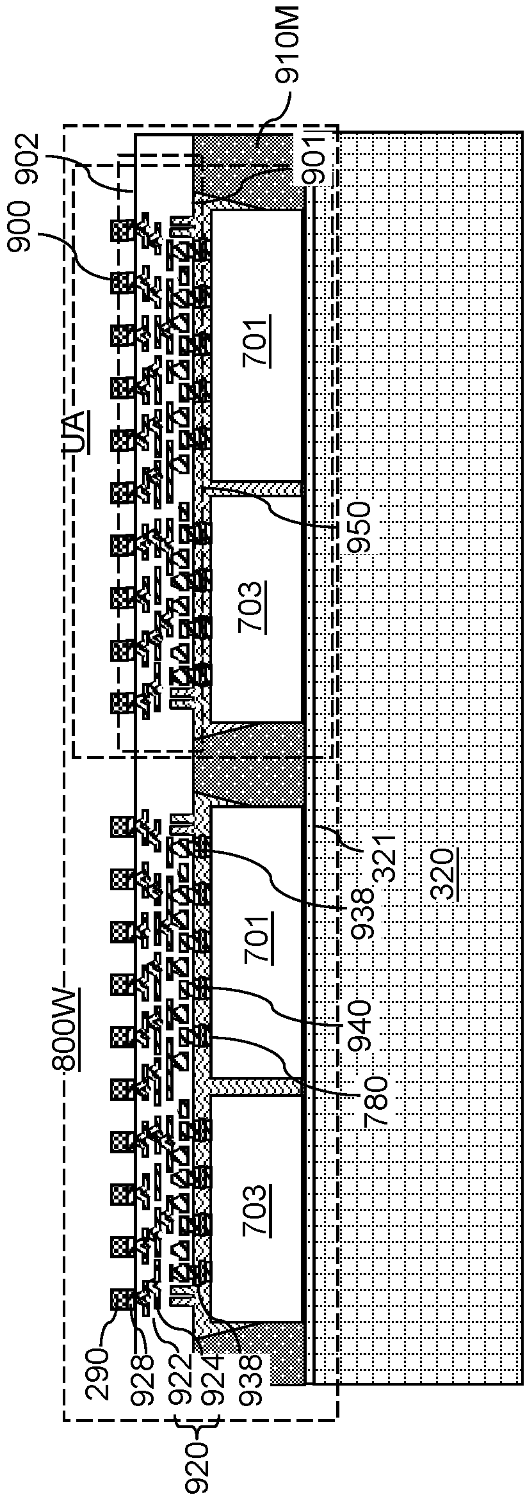
FIG. 10 is a vertical cross-sectional view of a region of the structure after formation of fan-out bonding pads and second solder material portions according to an embodiment of the present disclosure.

Referring to FIG. 10, fan-out bonding pads 928 and second solder material portions 290 may be formed by depositing and patterning a stack of at least one metallic material that may function as metallic bumps and a solder material layer. The metallic fill material for the fan-out bonding pads 928 may include copper. Other suitable metallic fill materials are within the contemplated scope of disclosure. The thickness of the fan-out bonding pads 928 may be in a range from 5 microns to 100 microns, although lesser or greater thicknesses may also be used. The fan-out bonding pads 928 and the second solder material portions 290 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. In some embodiments, the fan-out bonding pads 928 may be, or include, under bump metallurgy (UBM) structures. The configurations of the fan-out bonding pads 928 are not limited to be fan-out structures. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 300 microns, and having a pitch in a range from 10 microns to 500 microns.

The fan-out bonding pads 928 and the second solder material portions 290 may be formed on the opposite side of the EMC matrix 910M and the two-dimensional array of sets of semiconductor dies (701, 703) relative to the interposer layer. The interposer layer includes a three-dimensional array of interposers 900. Each interposer 900 may be located within a respective unit area UA. Each interposer 900 may include redistribution dielectric layers 922, redistribution wiring interconnects 924 embedded in the redistribution dielectric layers 922, and fan-out bonding pads 928. The fan-out bonding pads 928 may be located on an opposite side of the on-interposer bump structure 938 relative to the redistribution dielectric layers 922, and may be electrically connected to a respective one of the on-interposer bump structure 938.

Figure 11:
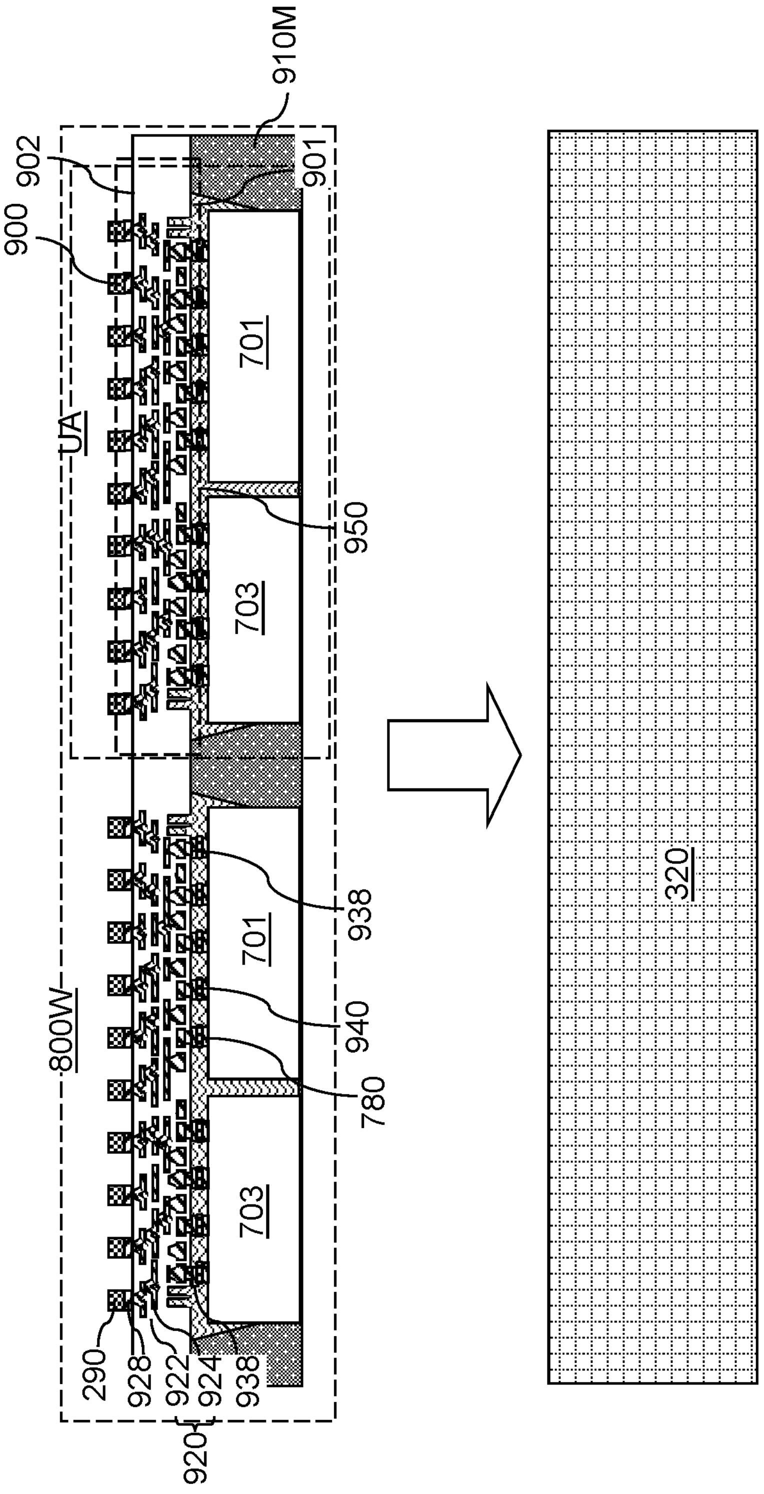
FIG. 11 is a vertical cross-sectional view of a region of the structure after detaching the second carrier substrate according to an embodiment of the present disclosure.

Referring to FIG. 11, the second adhesive layer 321 may be decomposed by ultraviolet radiation or by a thermal anneal at a debonding temperature. In embodiments in which the second carrier substrate 320 includes an optically transparent material and the second adhesive layer 321 includes an LTHC layer, the second adhesive layer 321 may be decomposed by irradiating ultraviolet light through the transparent carrier substrate. In embodiments in which the second adhesive layer 321 includes a thermally decomposing adhesive material, a thermal anneal process at a debonding temperature may be performed to detach the second carrier substrate 320 from the reconstituted wafer 800W.

Figure 12:
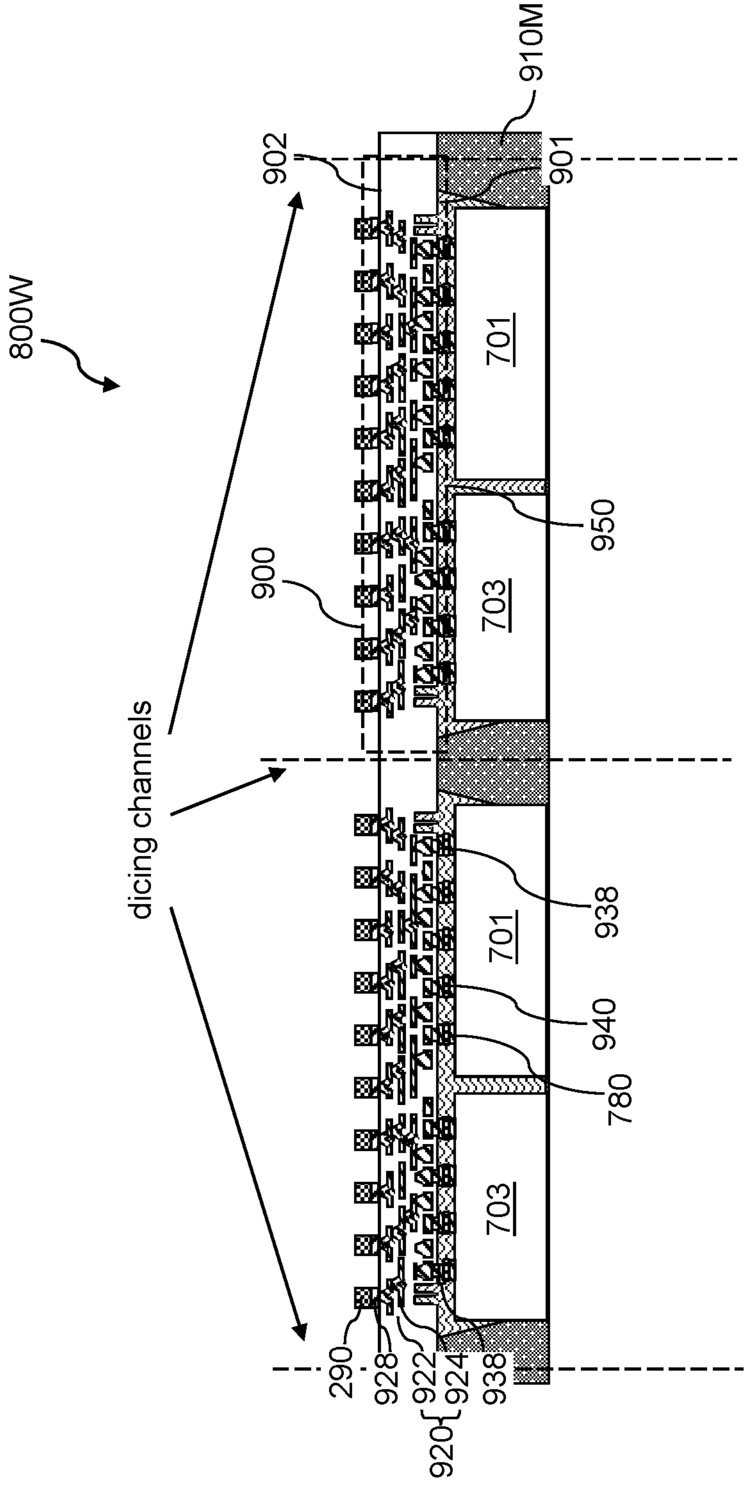
FIG. 12 is a vertical cross-sectional view of a region of the structure during dicing of a redistribution substrate and the EMC matrix according to an embodiment of the present disclosure.

Referring to FIG. 12, the reconstituted wafer 800W including the fan-out bonding pads 928 may be subsequently diced along dicing channels by performing a dicing process. The dicing channels correspond to the boundaries between neighboring pairs of die areas DA. Each diced unit from the reconstituted wafer 800W may include a fan-out package 800. In other words, each diced portion of the assembly of the two-dimensional array of sets of semiconductor dies (701, 703), the two-dimensional array of first underfill material portions 950, the EMC matrix 910M, and the two-dimensional array of interposers 900 constitutes a fan-out package 800. Each diced portion of the EMC matrix 910M constitutes a molding compound die frame 910. Each diced portion of the interposer layer (which includes the two-dimensional array of interposers 900) constitutes an interposer 900.

Figure 13:
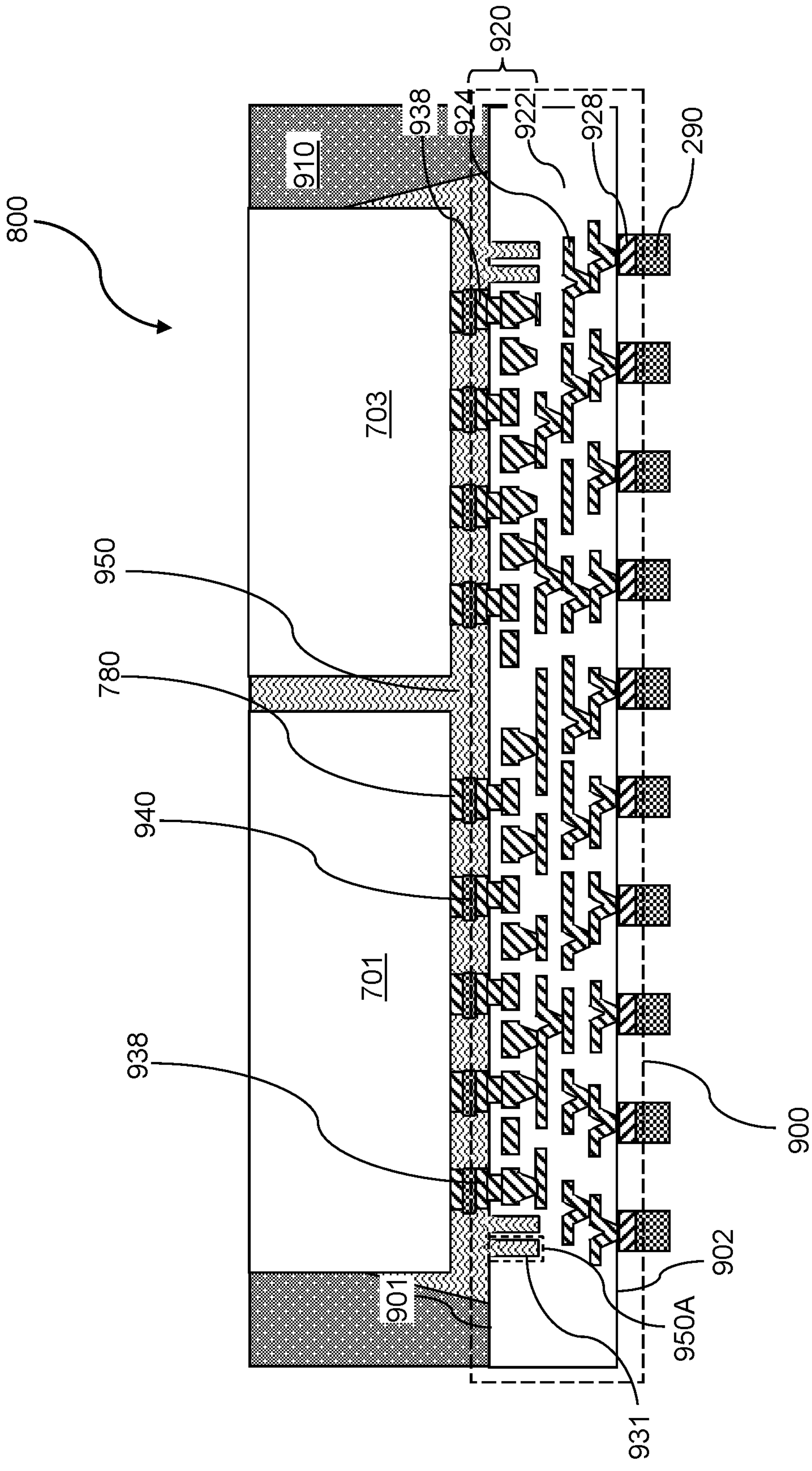
FIG. 13 is a vertical cross-sectional view of a fan-out package according to an embodiment of the present disclosure.

Referring to FIG. 13, a fan-out package 800 obtained by dicing the structure at the processing steps of FIG. 12 is illustrated. The fan-out package 800 comprises an interposer 900 including on-interposer bump structure 938, at least one semiconductor die (701, 703) comprising a respective set of on-die bump structures 780 that is attached to the on-interposer bump structure 938 through a respective set of first solder material portions 940, a first underfill material portion 950 laterally surrounding the on-interposer bump structure 938 and the on-die bump structures 780 of the at least one semiconductor die (701, 703). The first underfill material portion 950 also including downward-protruding anchor portions 950A of the an underfill material portion 950 located in recesses 931 of the interposer 900.

The fan-out package 800 may comprise a molding compound die frame 910 laterally surrounding the at least one semiconductor die (701, 703) and comprising a molding compound material. In one embodiment, the molding compound die frame 910 may include sidewalls that are vertically coincident with sidewalls of the interposer 900, i.e., located within same vertical planes as the sidewalls of the interposer 900. Generally, the molding compound die frame 910 may be formed around the at least one semiconductor die (701, 703) after formation of the first underfill material portion 950 within each fan-out package 800. The molding compound material contacts a peripheral portion of a planar surface of the interposer 900.

The fan-out package 800 comprises a bonded assembly. According to an aspect of the present disclosure, a bonded assembly is provided, which comprises: an interposer 900 including redistribution wiring interconnects 924 and redistribution insulating layers 922 and comprising recesses 931 in corner regions, wherein the recesses 931 comprise surfaces that are recessed relative to a horizontal plane including a horizontal surface of the interposer 900; at least one semiconductor die (701, 703) attached to the interposer 900 through a respective array of solder material portions 940; and an underfill material portion 950 located between the interposer 900 and the at least one semiconductor die (701, 703) and comprising downward-protruding anchor portions 950A that protrude downward from a horizontally-extending portion of the underfill material portion 950 that laterally surrounds each array of solder material portions 940 into the recesses 931.

In one embodiment, a first downward-protruding anchor portion 950A selected from the downward-protruding anchor portions 950A is located within an area of a first semiconductor die (701 or 703) selected from the at least one semiconductor die (701, 703) in a plan view. In one embodiment, the first semiconductor die (701 or 703) may be attached to the interposer 900 through a first array of solder material portions 940; and the first downward-protruding anchor portion 950A may be more proximal to sidewalls of the first semiconductor die (701 or 703) than any solder material portion 940 within the first array of solder material portions 940 is to the sidewalls of the first semiconductor die (701 or 703).

In one embodiment, the interposer 900 comprises on-interposer bump structures 938 located above the horizontal plane including a horizontal surface of the interposer 900; and the horizontally-extending portion of the underfill material portion 950 is located above the horizontal plane including the horizontal surface of the interposer 900. In one embodiment, each of the recesses 931 has a depth that is in a range from 5% to 99.9%, such as from 10% to 90%, of a thickness of the interposer 900.

In one embodiment, the recesses 931 comprise an array of recesses 931 having a first periodicity along a first horizontal direction hd1 and having a second periodicity along a second horizontal direction hd2 and located in one of the corner regions. In one embodiment, one, a plurality, and/or each, of the recesses 931 may have a vertical sidewall that vertically extends from the horizontal plane including the horizontal surface of the interposer 900 to a recessed horizontal surface located within the interposer 900, the recessed horizontal surface being a surface of a polymer material. In one embodiment, one, a plurality, and/or each, of the recesses 931 has a concave surface segment that is adjoined to a recessed horizontal surface located within the interposer 900, the recessed horizontal surface being a surface of a polymer material.

In one embodiment, the bonded assembly comprises a molding compound die frame 910 laterally surrounding the at least one semiconductor die (701, 703) and the underfill material portion 950, and is laterally spaced from the recesses 931. In one embodiment, the at least one semiconductor die (701, 703) comprises a plurality of semiconductor dies (701, 703); and at least one semiconductor die (701, 703) selected from the plurality of semiconductor dies (701, 703) comprises at least two corner regions that do not have any areal overlap with the recesses 931.

According to another aspect of the present disclosure, a bonded assembly comprising a fan-out package 800 is provided. The fan-out package 800 comprises: an interposer 900 comprising on-interposer bump structures 938 overlying a horizontal plane including a first horizontal surface of the interposer 900, and comprising recesses 931 located in corner regions of the interposer 900 and vertically extending from the first horizontal plane toward a second horizontal plane of the interposer 900; at least one semiconductor die (701, 703) attached to the interposer 900 through a respective array of solder material portions 940; an underfill material portion 950 located between the interposer 900 and the at least one semiconductor die (701, 703) and comprising downward-protruding anchor portions 950A that fill the recesses 931 in the interposer 900; and a molding compound die frame 910 laterally surrounding the at least one semiconductor die (701, 703).

In one embodiment, each of the downward-protruding anchor portions 950A of the underfill material portion 950 is located entirely within an area of a respective one of the at least one semiconductor die (701, 703) in a plan view. In one embodiment, the at least one semiconductor die (701, 703) comprises a plurality of semiconductor dies (701, 703); and one or more of the at least one semiconductor die (701, 703) comprises a respective corner region that does not have any areal overlap with the downward-protruding anchor portions 950A in a plan view.

In one embodiment, a first semiconductor die (701 or 703) selected from the at least one semiconductor die (701, 703) comprises first sidewalls laterally extending along a first horizontal direction hd1 and second sidewalls laterally extending along a second horizontal direction hd2; the first semiconductor die (701 or 703) is attached to the interposer 900 through a first array of solder material portions 940 and has areal overlap with a first downward-protruding anchor portion 950A selected from the downward-protruding anchor portions 950A; the first downward-protruding anchor portion 950A is more proximal to a proximal one of the first sidewalls than any solder material portion 940 within the first array of solder material portions 940 is to the first sidewalls; and the first downward-protruding anchor portion 950A is more proximal to a proximal one of the second sidewalls than any solder material portion 940 within the first array of solder material portions 940 is to the second sidewalls.

In one embodiment, the recesses 931 comprise an array of recesses 931 having a first periodicity along a first horizontal direction hd1 and having a second periodicity along a second horizontal direction hd2 and located in one of the corner regions.

Figure 14A:
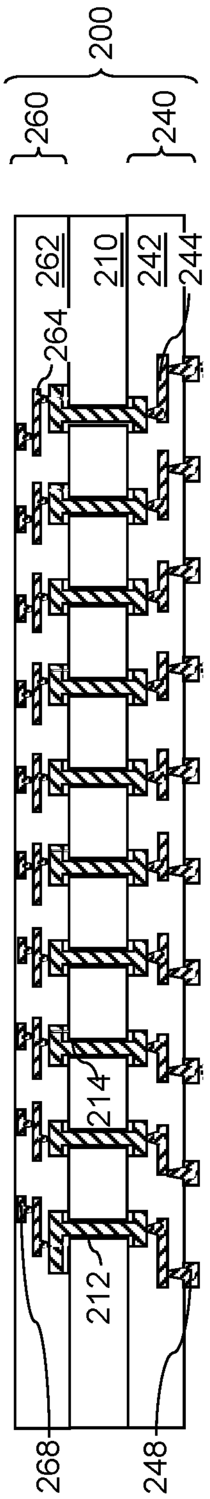
FIG. 14A is a vertical cross-sectional view of a packaging substrate according to an embodiment of the present disclosure.
Figure 14B:
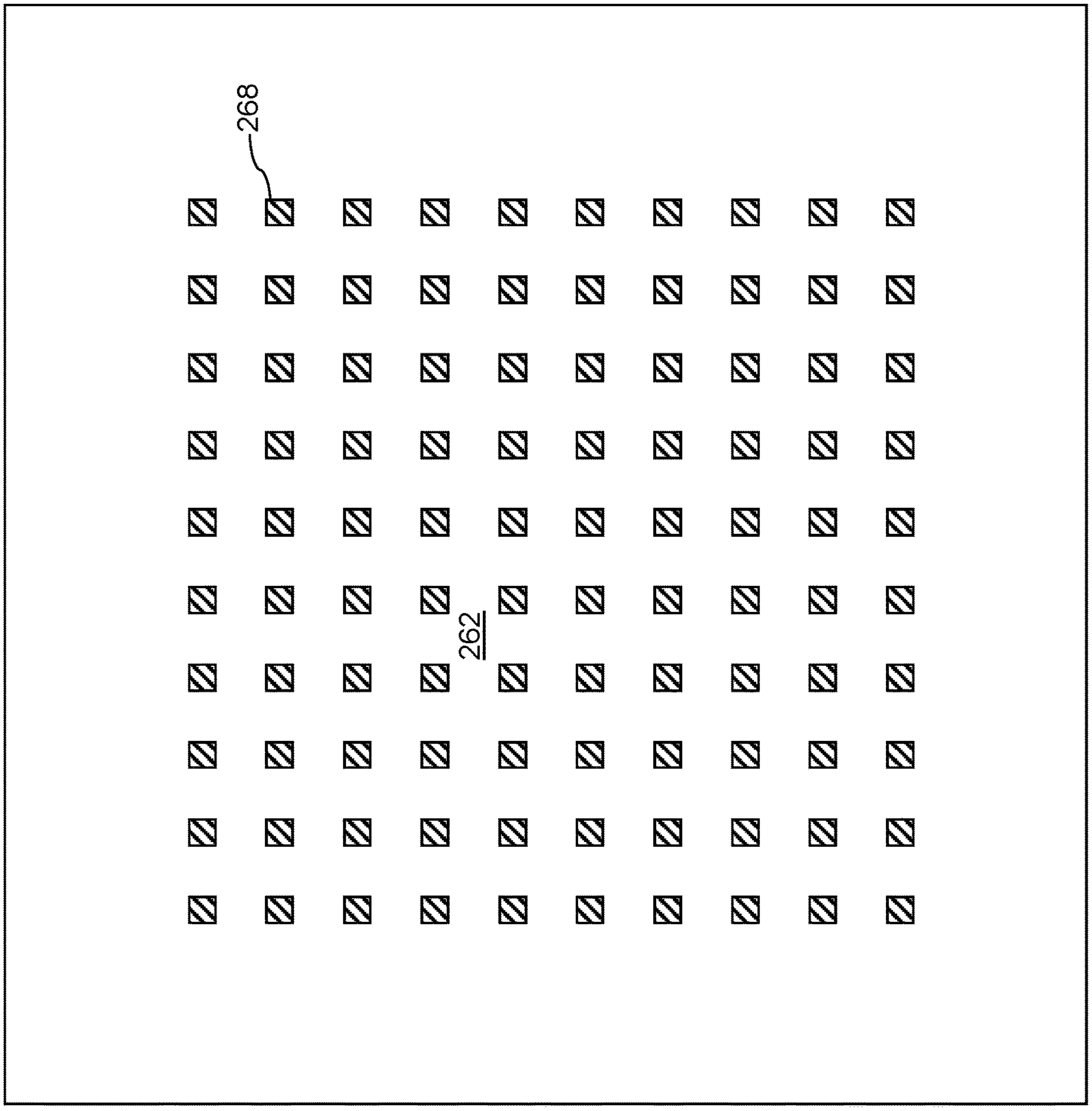
FIG. 14B is a top-down view of the packaging substrate of FIG. 14A.

Referring to FIGS. 14A and 14B, a packaging substrate 200 is provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of chip-side bonding pads 268 may be configured to allow bonding through C4 solder balls. Generally, any type of packaging substrate 200 may be used. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

Figure 15A:
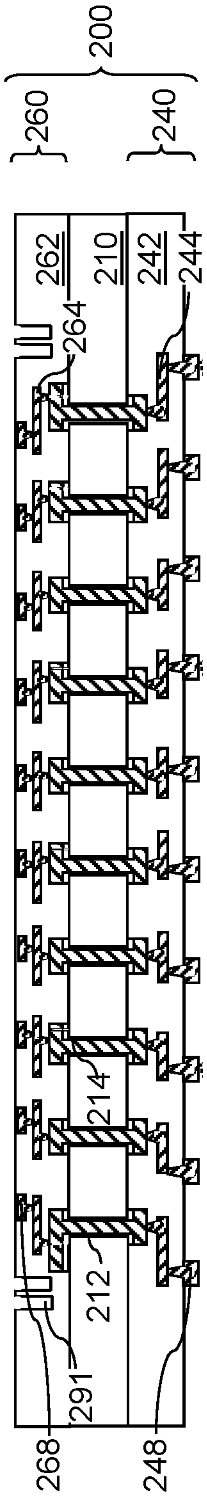
FIG. 15A is a vertical cross-sectional view of the packaging substrate after formation of recesses in corner regions according to an embodiment of the present disclosure.
Figure 15B:
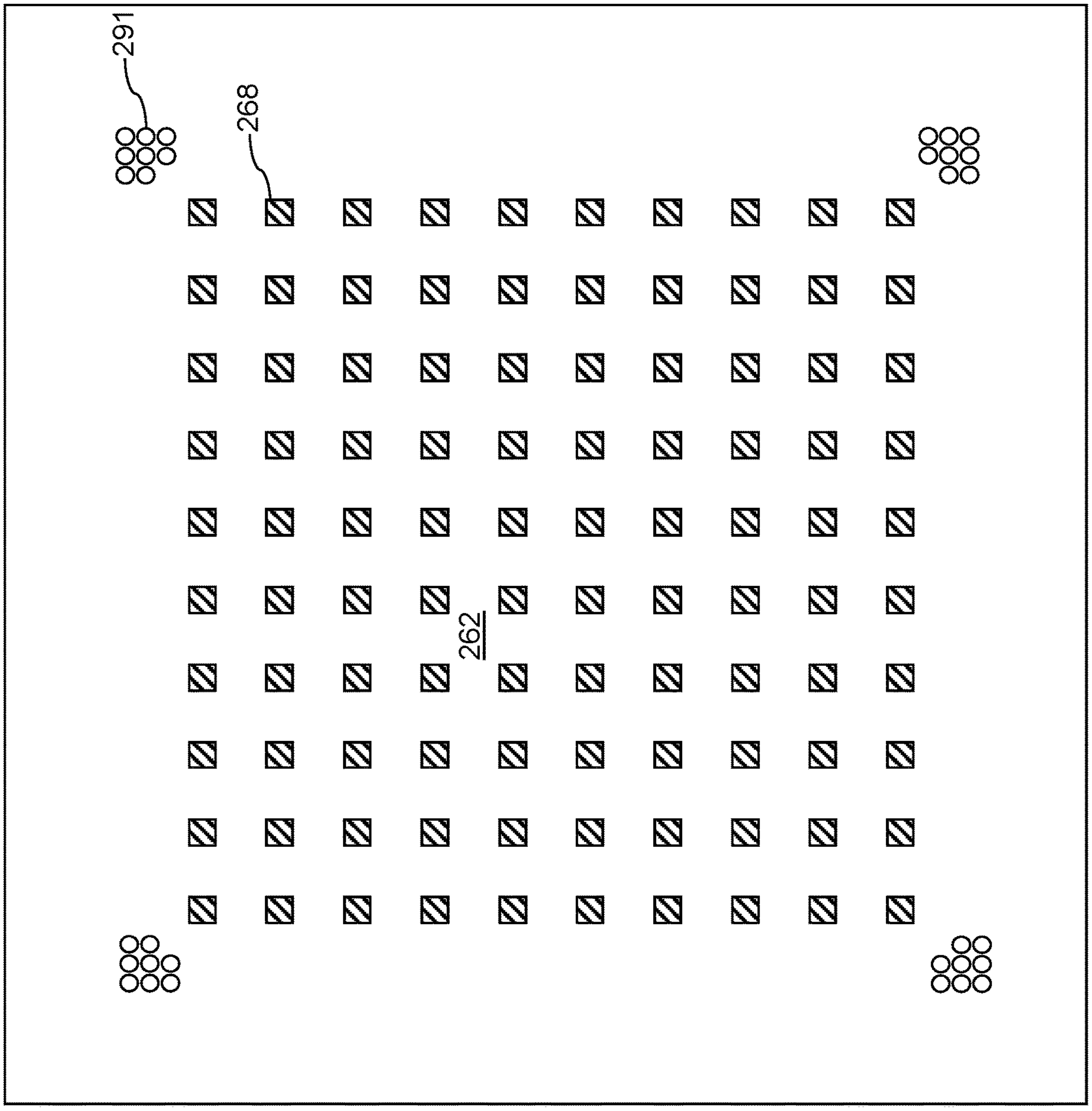
FIG. 15B is a top-down view of the packaging substrate of FIG. 15A.

Referring to FIGS. 15A and 15B, recesses 291 may be formed in the front-side surface of the packaging substrate 200. In one embodiment, the recesses 291 may be formed by applying a photoresist layer (not shown) over the first horizontal surface of the packaging substrate 200, lithographically patterning the photoresist layer to form openings in corner regions of packaging substrate 200, and by transferring the pattern of the openings in the photoresist layer into the packaging substrate 200 by performing at least one etch process. The at least one etch process may comprise any etch process that is described with reference to FIGS. 3A-3E. The photoresist layer can be subsequently removed, for example, by ashing. Alternatively, the recesses 291 may be formed by laser drilling. According to an aspect of the present disclosure, the locations of the recesses 291 may be selected such that recesses 291 do not have any areal overlap with the chip-side bonding pads 268.

In one embodiment, all chip-side bonding pads 268 of the packaging substrate 200 may be located within a respective rectangular area in a plan view (such as a top-down view), and all recesses 291 may be formed outside the rectangular area. In one embodiment, all chip-side bonding pads 268 of the packaging substrate 200 may be laterally offset inward from sidewalls an interposer 800 to be subsequently bonded to the packaging substrate 200 at least by offset distances. For example, all chip-side bonding pads 268 of a packaging substrate 200 may be laterally offset inward from first sidewalls of the interposer 800 (to be subsequently bonded to the packaging substrate 200) that are perpendicular to the first horizontal direction hd1 at least by a first offset distance. All chip-side bonding pads 268 of an packaging substrate 200 may be laterally offset inward from second sidewalls of the interposer 800 (to be subsequently bonded to the packaging substrate 200) that are perpendicular to the first horizontal direction hd1 at least by a second offset distance. Each of the first offset distance and the second offset distance may be in a range from 50 microns to 5 mm, although lesser and greater dimensions may also be used.

Generally, the pattern of the recesses 291 in the packaging substrate 200 may be any of the patterns for the recesses 931 described above with displacement of positions of the recesses 291 such that all recesses 291 are formed outside the areas of the chip-side bonding pads 268 of an packaging substrate 200.

Figure 16:
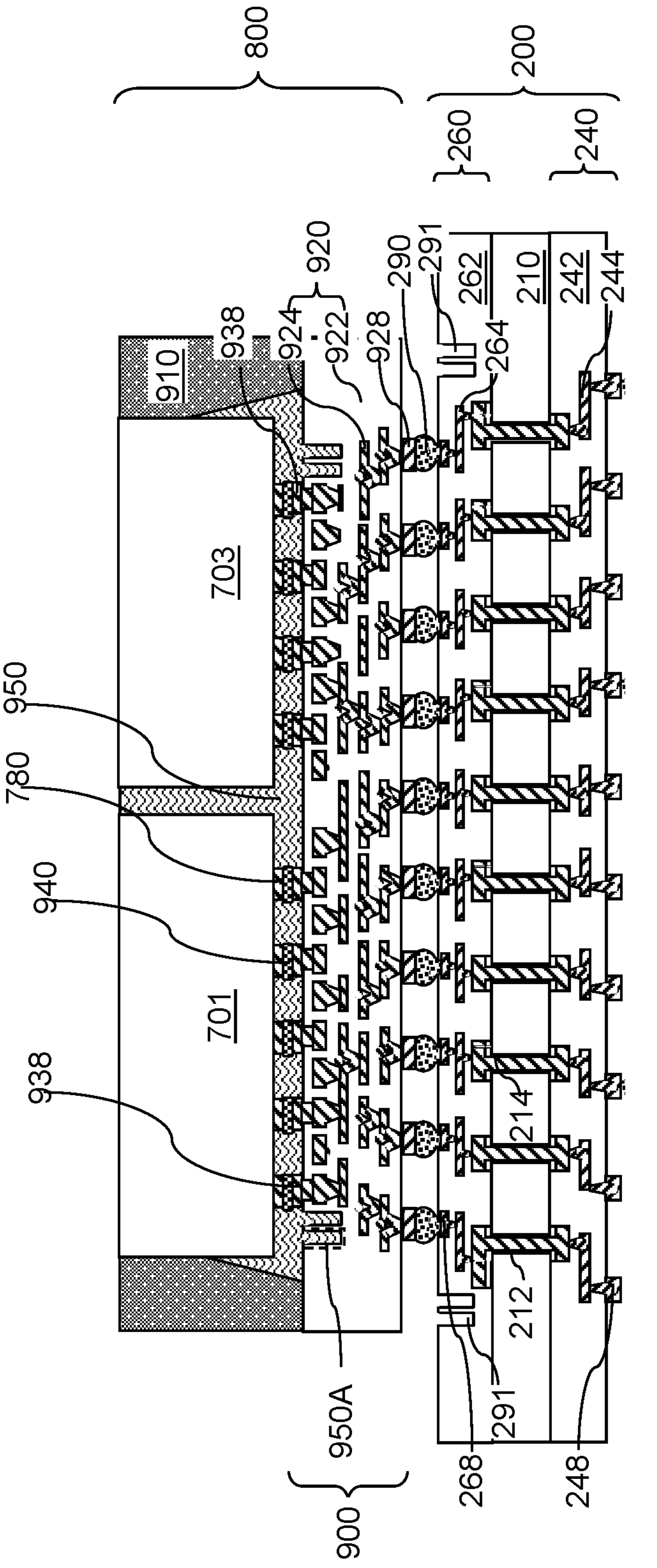
FIG. 16 is a vertical cross-sectional view of an structure after attaching the fan-out package to the packaging substrate according to an embodiment of the present disclosure.

Referring to FIG. 16, the fan-out package 800 may be disposed over the packaging substrate 200 with an array of the second solder material portions 290 therebetween. In embodiments in which the second solder material portions 290 are formed on the fan-out bonding pads 928 of the fan-out package 800, the second solder material portions 290 may be disposed on the chip-side bonding pads 268 of the packaging substrate 200. A reflow process may be performed to reflow the second solder material portions 290, thereby inducing bonding between the fan-out package 800 and the packaging substrate 200. Each second solder material portion 290 may be bonded to a respective one of the fan-out bonding pads 928 and to a respective one of the chip-side bonding pads 268. In one embodiment, the second solder material portions 290 may include C4 solder balls, and the fan-out package 800 may be attached to the packaging substrate 200 through an array of C4 solder balls. Generally, the fan-out package 800 may be bonded to the packaging substrate 200 such that the interposer 900 is bonded to the packaging substrate 200 by an array of solder material portions (such as the second solder material portions 290).

Figure 17:
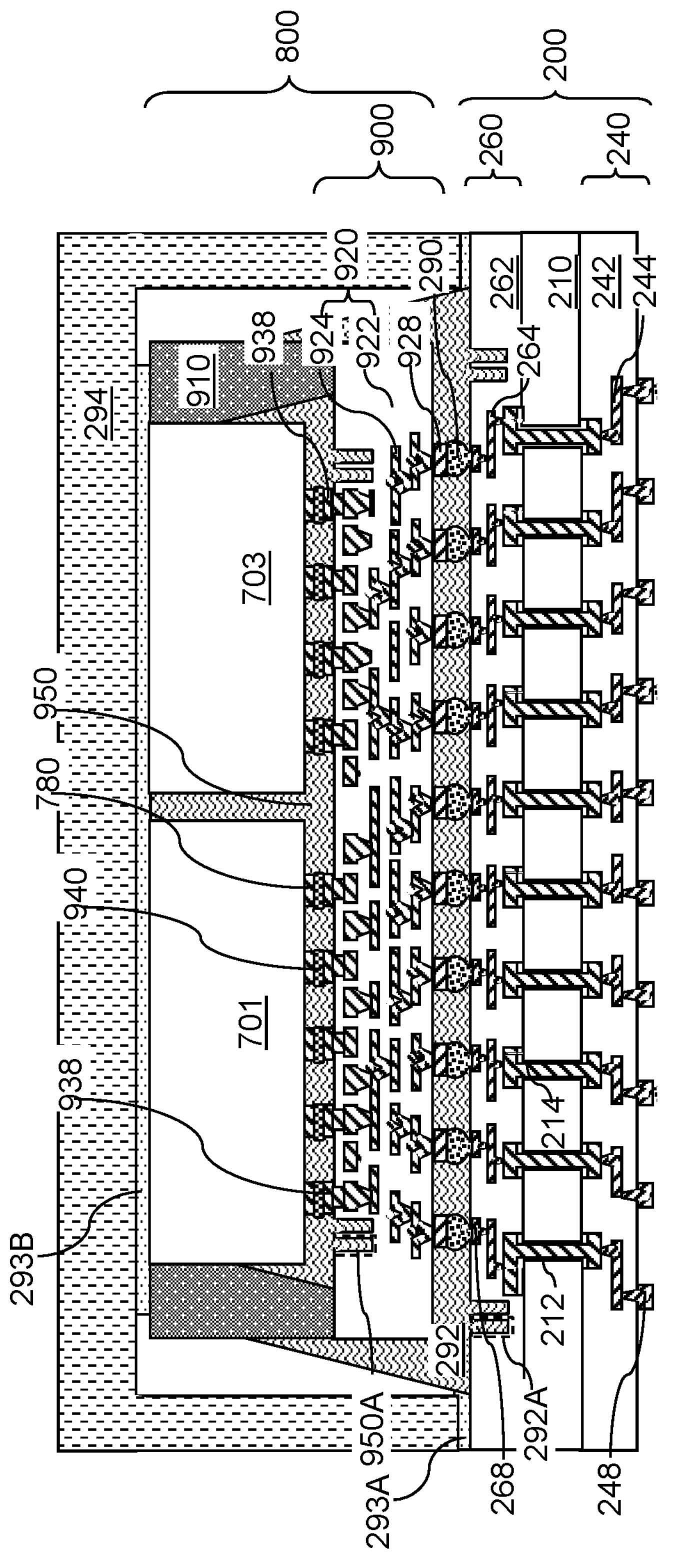
FIG. 17 is a vertical cross-sectional view of the structure after formation of a second underfill material portion and attaching a stiffener structure according to an embodiment of the present disclosure.

Referring to FIGS. 17, a second underfill material portion 292 may be formed around the second solder material portions 290 by applying and shaping a second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method. The second underfill material may the same or different from the first underfill material.

The second underfill material portion 292 may be formed between the interposer 900 and the packaging substrate 200. The second underfill material portion 292 can fill each of the recesses 291 in the packaging substrate 200. The second underfill material portion 292 may contact each of the second solder material portions 290 (which may be C4 solder balls or C2 solder caps), and may contact vertical sidewalls of the fan-out package 800. The second underfill material portion laterally surrounds, and contacts, the array of second solder material portions 290 and the fan-out package 800.

Optionally, a stabilization structure 294, such as a cap structure or a ring structure, may be attached to the assembly of the fan-out package 800 and the packaging substrate 200 to reduce deformation of the assembly during subsequent processing steps and/or during usage of the assembly. The stabilization structure 294 may comprise a stiffener structure, and may be attached to the packaging substrate 200 using a first adhesive layer 293A and to the at least one semiconductor die (701, 703) using a second adhesive layer 293B.

In one embodiment, the fan-out package 800 comprises a molding compound die frame 910 that laterally surrounds the at least one semiconductor die (701, 703) and contacting a peripheral portion of a top surface of the interposer 900. The second underfill material portion 292 may be formed directly on sidewalls of the molding compound die frame 910.

Generally, the assembly of the interposer 900 and the fan-out package 800 comprises a bonded assembly. According to an aspect of the present disclosure, a bonded assembly is provided, which comprises: a packaging substrate 200 including first interconnects (such as chip-side wiring interconnects 264 and board-side wiring interconnects 244) and comprising recesses 291 in corner regions, wherein the recesses 291 comprise bottom surfaces that are recessed relative to a horizontal plane including a horizontal surface of the packaging substrate 200; an interposer 800 including second interconnects (such as redistribution wiring interconnects 924) and attached to the packaging substrate 200 through a respective array of solder material portions 290; and an underfill material portion located between the packaging substrate 200 and the interposer 800 and comprising downward-protruding anchor portions 292A that protrude downward from a horizontally-extending portion of the underfill material portion 292 that laterally surrounds each respective array of solder material portions 290 into the recesses 291.

In one embodiment, a first downward-protruding anchor portion 292A selected from the downward-protruding anchor portions 292A may be located within an area of the interposer 800 in a plan view. In one embodiment, the interposer 800 may be attached to the packaging substrate 200 through a first respective array of solder material portions 290; and the first downward-protruding anchor portion 292A may be more proximal to sidewalls of the interposer 800 than any solder material portion 290 within the first array of solder material portions 290 is to the sidewalls of the interposer 800.

In one embodiment, the packaging substrate 200 comprises first bump structures (such as chip-side bonding pads 268) located above the horizontal plane including a horizontal surface of the packaging substrate 200; and the horizontally-extending portion of the underfill material portion is located above the horizontal plane including the horizontal surface of the packaging substrate 200. In one embodiment, each of the recesses 291 has a depth that is in a range from 5% to 99.9% of a thickness of the packaging substrate 200.

In one embodiment, the recesses 291 comprise an array of recesses 291 having a first periodicity along a first horizontal direction and having a second periodicity along a second horizontal direction and located in one of the corner regions. In one embodiment, one of the recesses 291 has a vertical sidewall that vertically extends from the horizontal plane including the horizontal surface of the packaging substrate 200 to a recessed horizontal surface located within the packaging substrate 200, the recessed horizontal surface being a surface of a polymer material. In one embodiment, one of the recesses 291 has a concave surface segment that is adjoined to a recessed horizontal surface located within the interposer, the recessed horizontal surface being a surface of a polymer material.

Figure 18A:
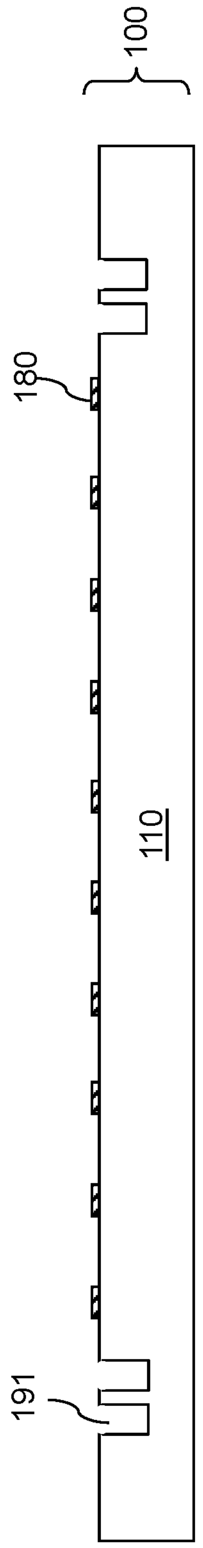
FIG. 18A is a vertical cross-sectional view of a printed circuit board according to an embodiment of the present disclosure.
Figure 18B:
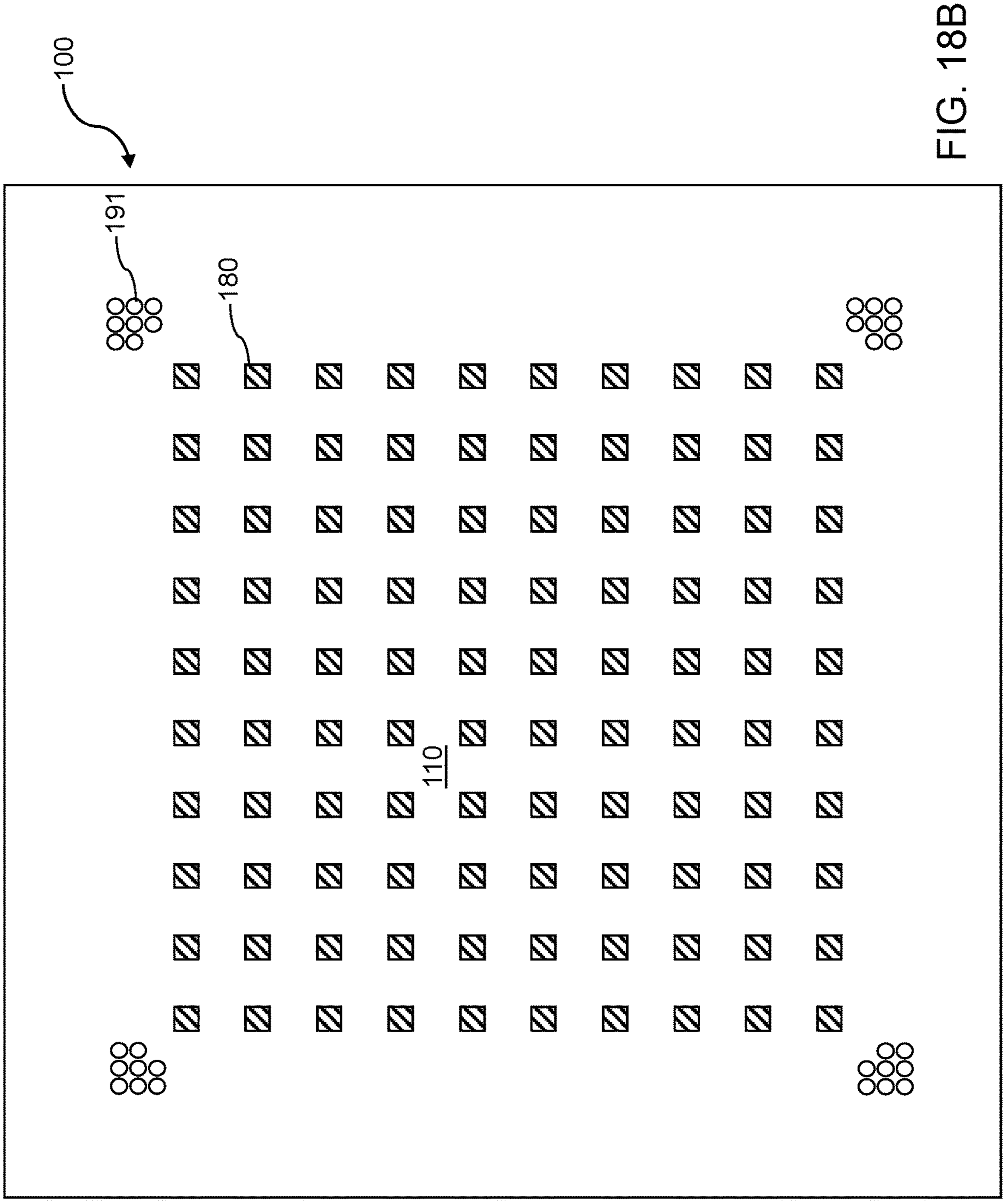
FIG. 18B is a top-down view of the printed circuit board of FIG. 18A.

Referring to FIGS. 18A and 18B, a printed circuit board (PCB) 100 including a PCB substrate 110 and PCB bonding pads 180 may be provided. The PCB 100 includes a printed circuitry (not shown) at least on one side of the PCB substrate 110. Recesses 191 may be formed in the front-side surface of the printed circuit board 100. In one embodiment, the recesses 191 may be formed by applying a photoresist layer (not shown) over the first horizontal surface of the printed circuit board 100, lithographically patterning the photoresist layer to form openings in corner regions of printed circuit board 100, and by transferring the pattern of the openings in the photoresist layer into the printed circuit board 100 by performing at least one etch process. The at least one etch process may comprise any etch process that is described with reference to FIGS. 3A-3E. The photoresist layer can be subsequently removed, for example, by ashing. Alternatively, the recesses 191 may be formed by laser drilling. According to an aspect of the present disclosure, the locations of the recesses 191 may be selected such that recesses 191 do not have any areal overlap with the PCB bonding pads 180.

In one embodiment, all PCB bonding pads 180 of the printed circuit board 100 may be located within a respective rectangular area in a plan view (such as a top-down view), and all recesses 191 may be formed outside the rectangular area. In one embodiment, all PCB bonding pads 180 of the printed circuit board 100 may be laterally offset inward from sidewalls a packaging substrate 200 to be subsequently bonded to the printed circuit board 100 at least by offset distances. For example, all PCB bonding pads 180 of a printed circuit board 100 may be laterally offset inward from first sidewalls of the packaging substrate 200 (to be subsequently bonded to the printed circuit board 100) that are perpendicular to the first horizontal direction hd1 at least by a first offset distance. All PCB bonding pads 180 of an printed circuit board 100 may be laterally offset inward from second sidewalls of the packaging substrate 200 (to be subsequently bonded to the printed circuit board 100) that are perpendicular to the first horizontal direction hd1 at least by a second offset distance. Each of the first offset distance and the second offset distance may be in a range from 50 microns to 20 mm, although lesser and greater dimensions may also be used.

Generally, the pattern of the recesses 191 in the printed circuit board 100 may be any of the patterns for the recesses 931 described above with displacement of positions of the recesses 191 such that all recesses 191 are formed outside the areas of the PCB bonding pads 180 of an printed circuit board 100.

Figure 19:
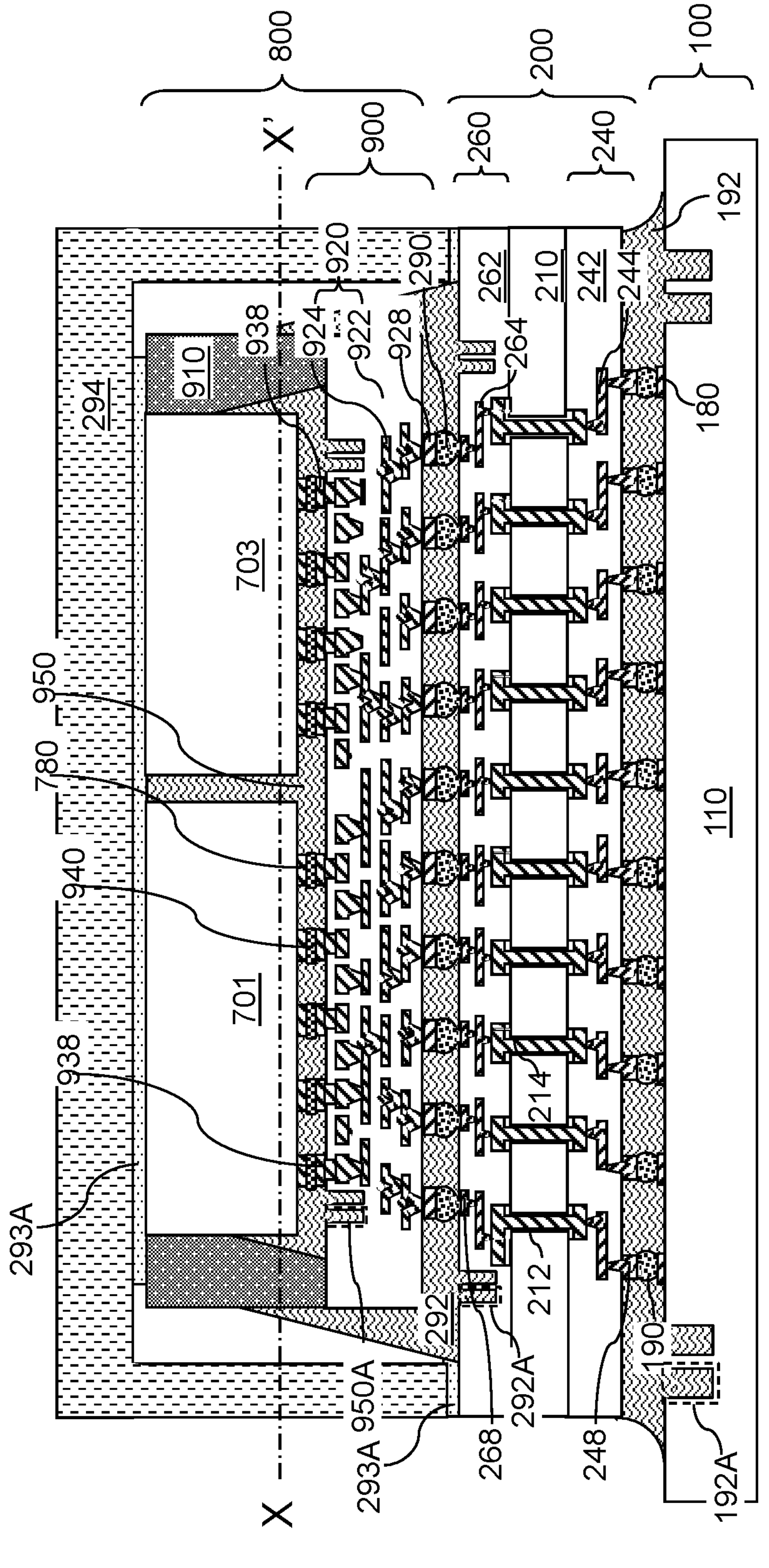
FIG. 19 is a vertical cross-sectional view of the structure after the packaging substrate is attached to a printed circuit board (PCB) according to an embodiment of the present disclosure.
Figure 20A:
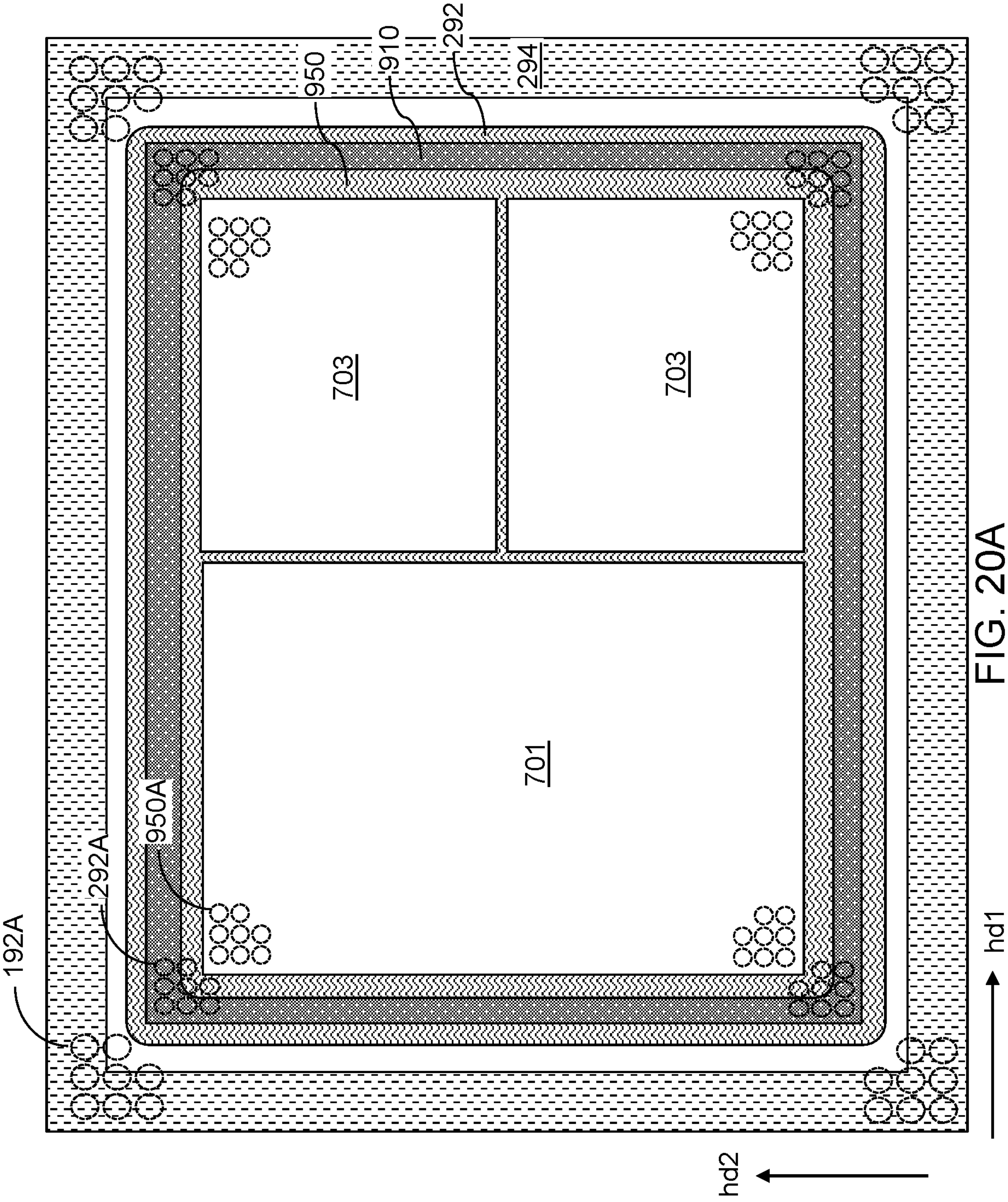
FIGS. 20A-20H are horizontal cross-sectional views of various configurations of the structure at a processing steps that corresponds to the processing step of FIG. 19 along a horizontal cross-sectional plane that corresponds to the horizontal plane X-X' in FIG. 19.
Figure 20B:
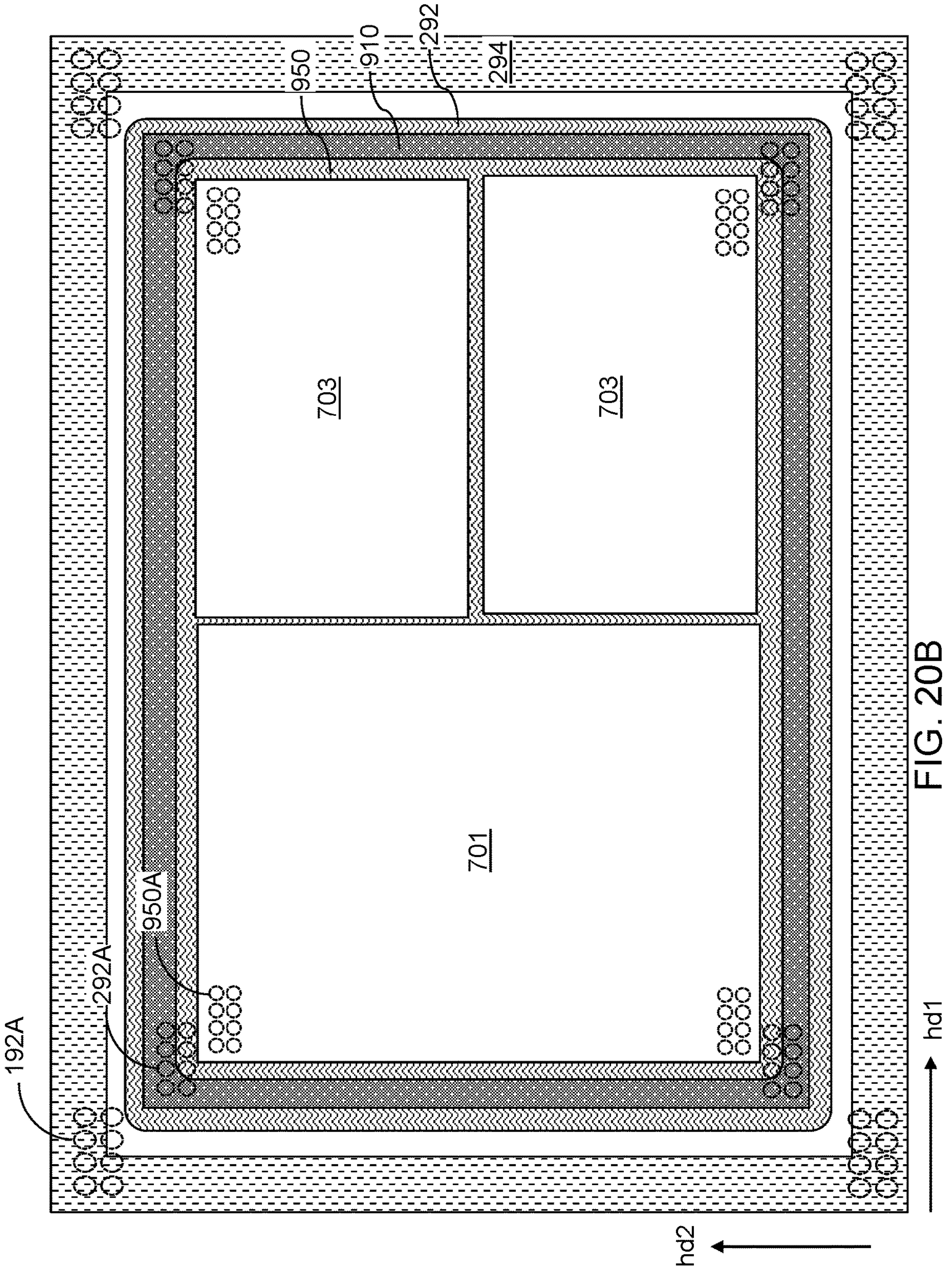
Figure 20C:
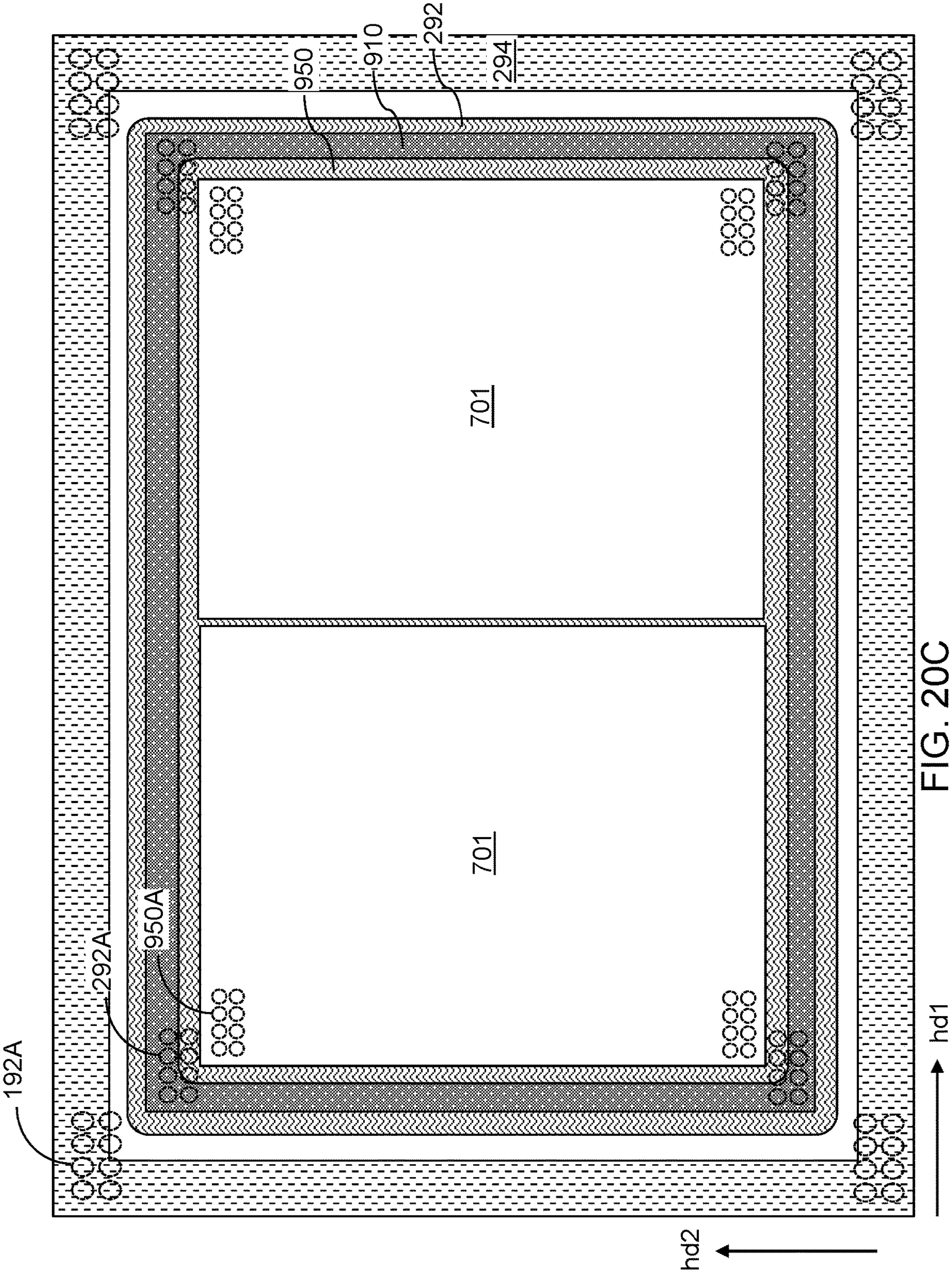
Figure 20D:
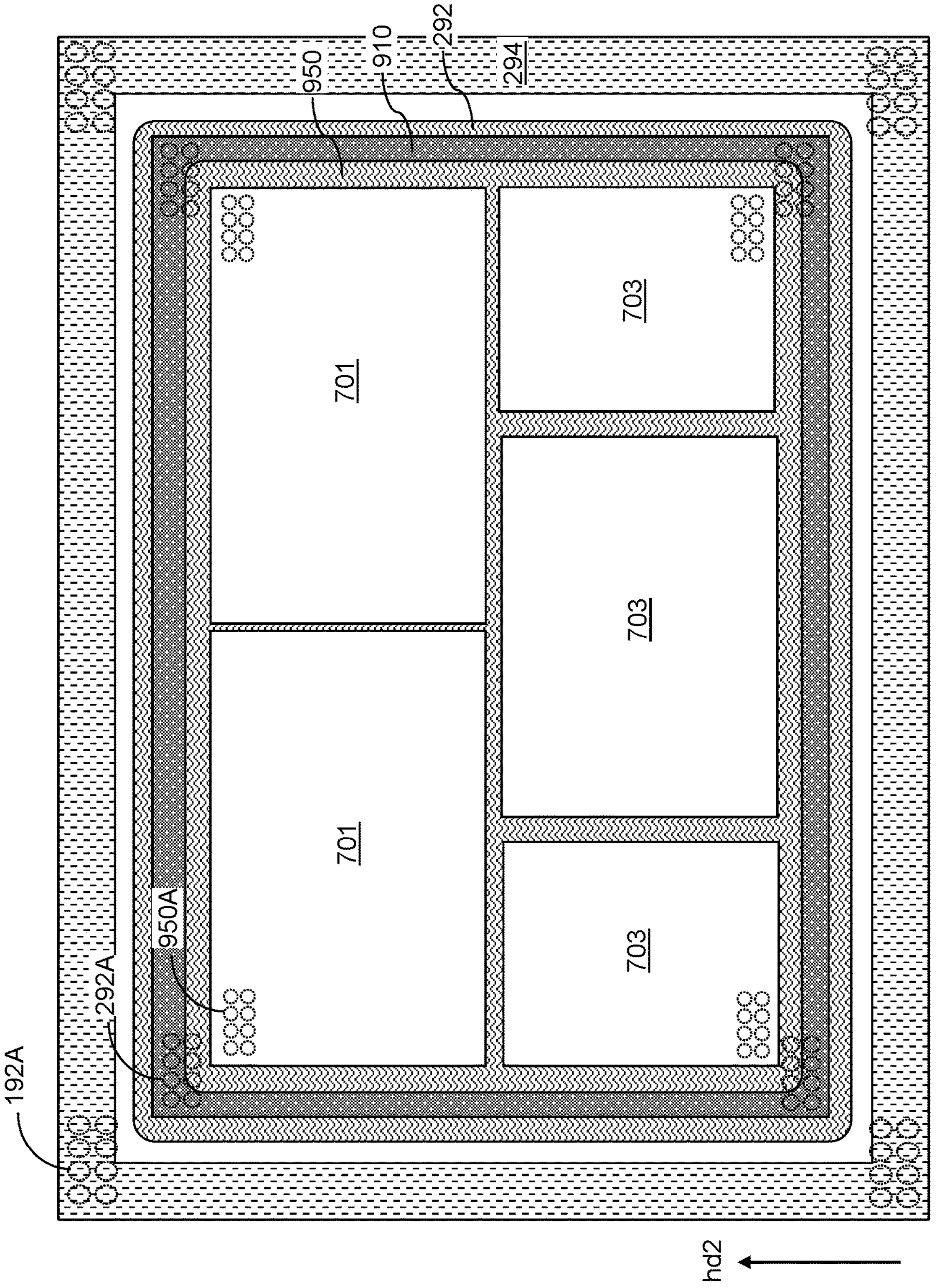
Figure 20E:
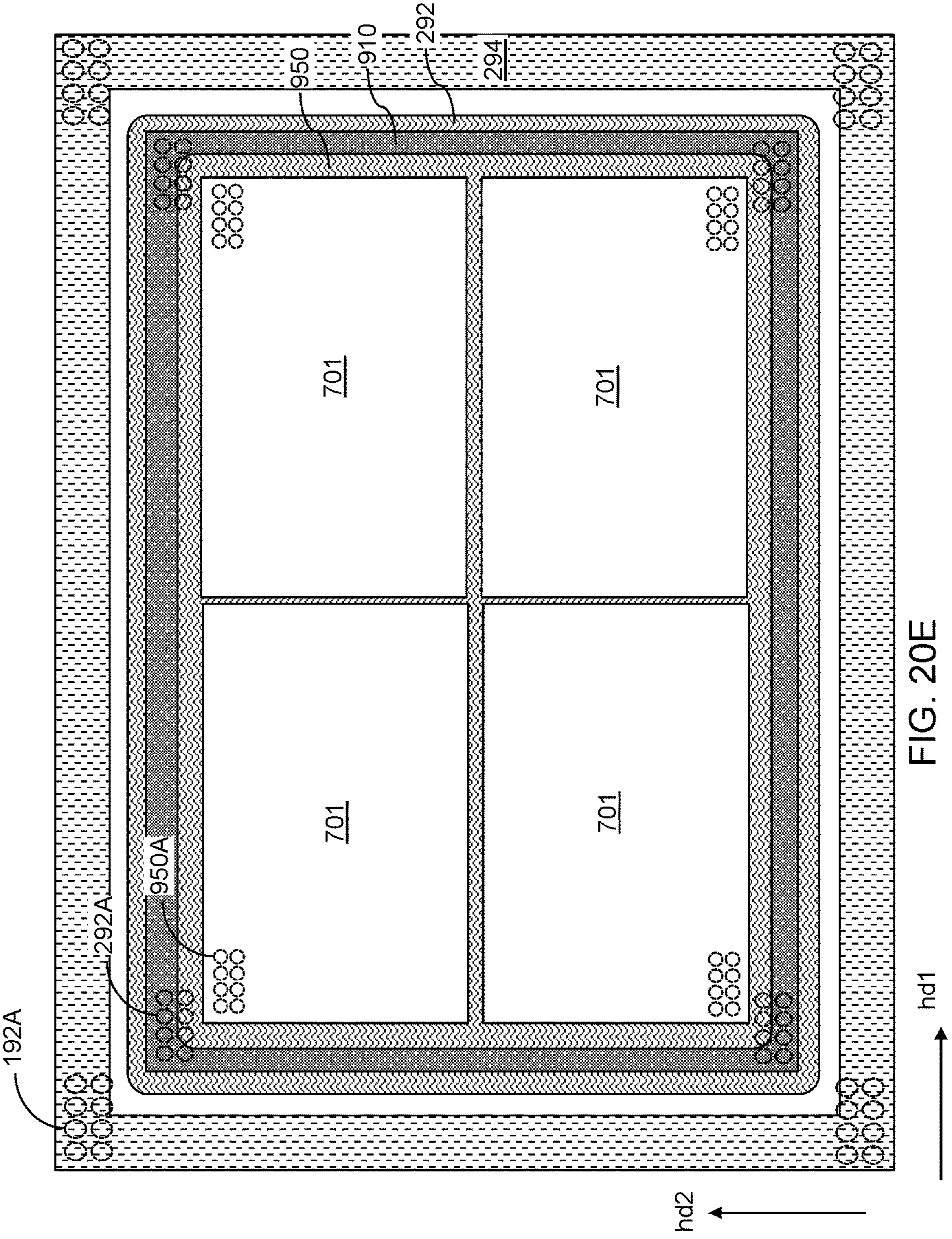
Figure 20F:
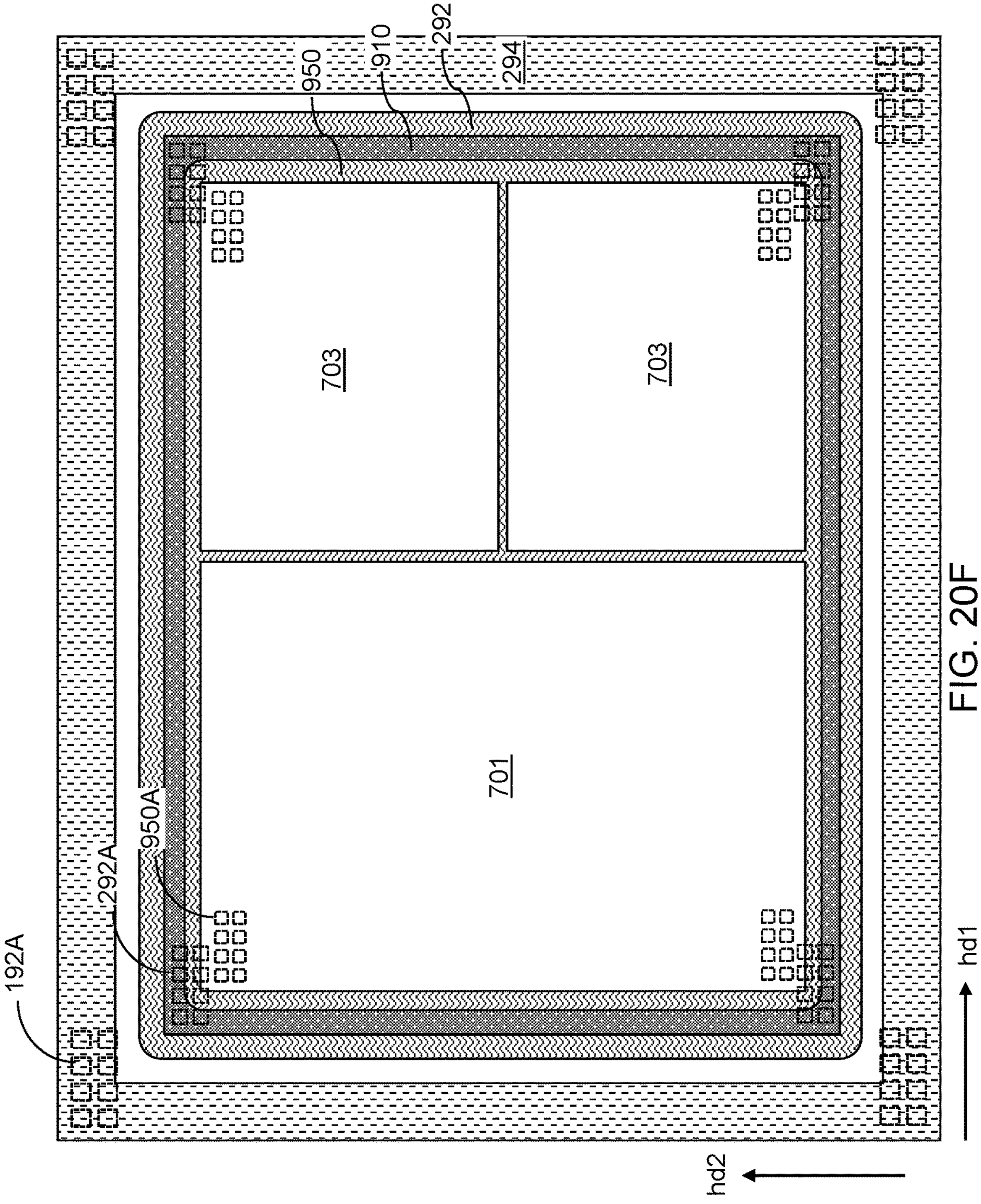
Figure 20G:
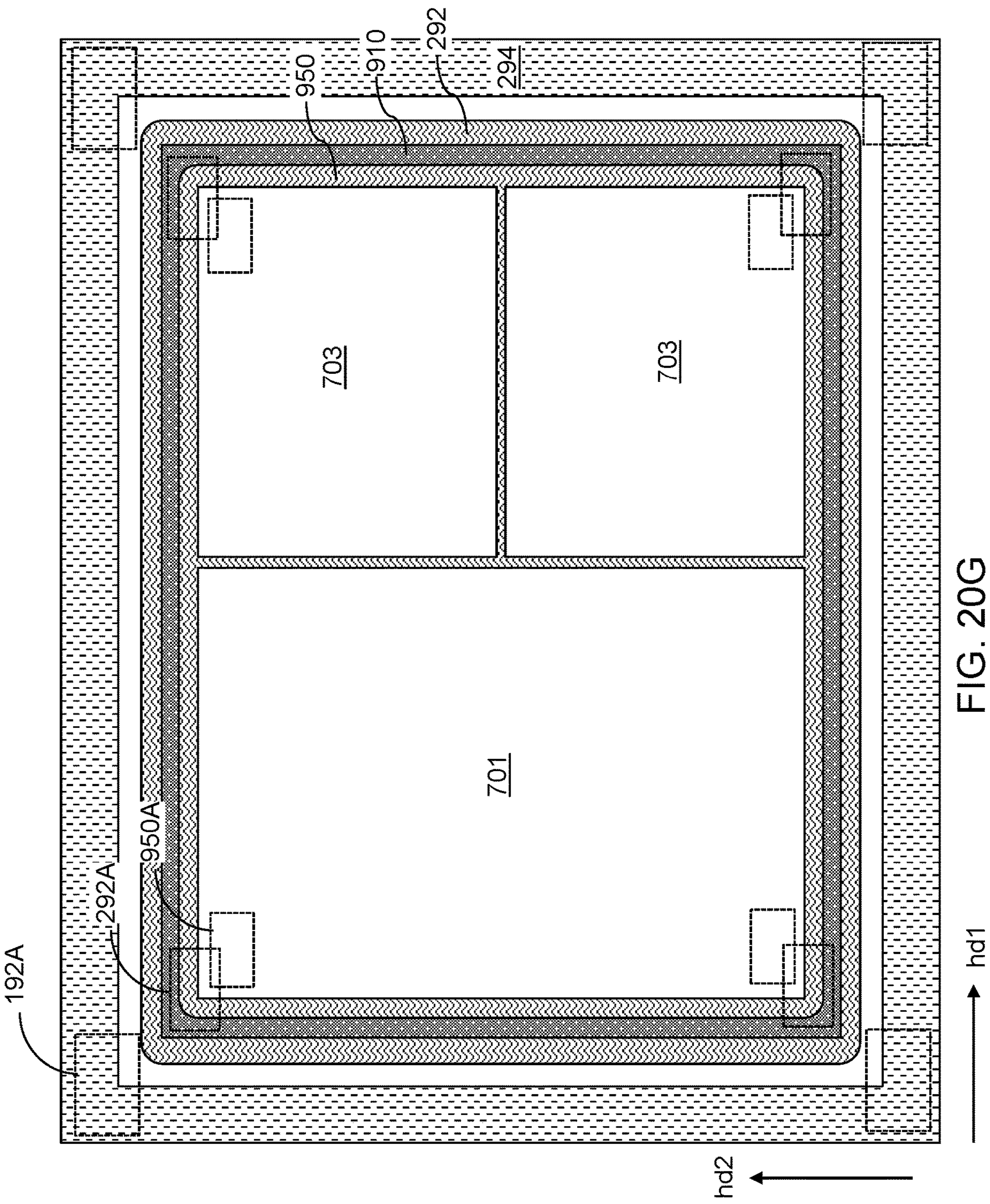
Figure 20H:
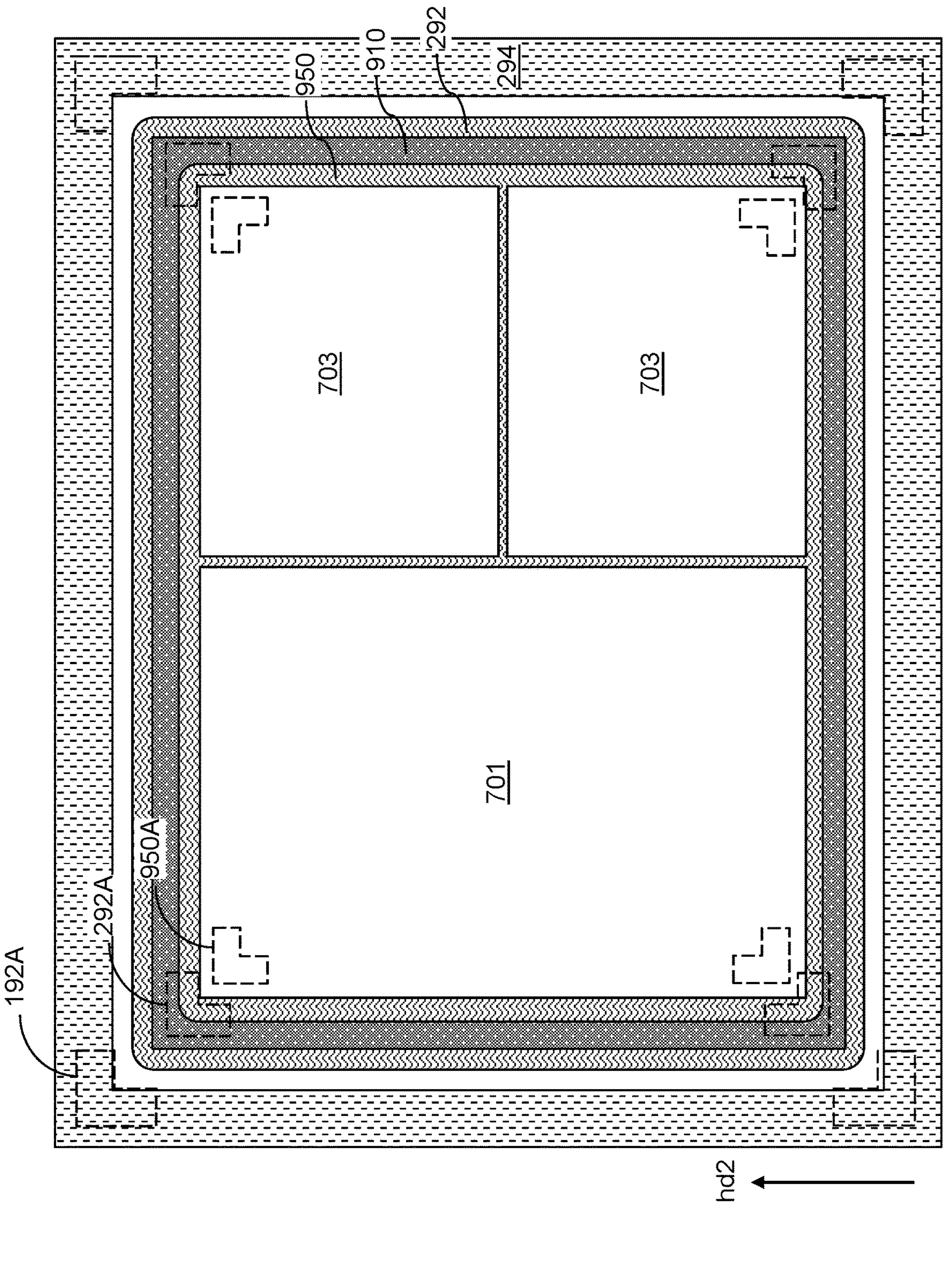

Referring to FIG. 19, an array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. A third underfill material portion 192 may be formed around the solder joints 190 by applying and shaping a third underfill material. The third underfill material portion 192 may fill each of the recesses 191 in the printed circuit board 100. The packaging substrate 200 is attached to the PCB 100 through the array of solder joints 190. The third underfill material may be the same as or different from the second underfill material. The third underfill material may be the same as or different from the first underfill material.

According to an aspect of the present disclosure, the combination of the printed circuit board 100 and the packaging substrate 200 comprises a bonded assembly. The bonded assembly comprises: a printed circuit board 100 including first interconnects (such as the printed circuitry within the printed circuit board 100) and comprising recesses 191 in corner regions, wherein the recesses 191 comprise surfaces that are recessed relative to a horizontal plane including a horizontal surface of the printed circuit board 100; packaging substrate 200 including second interconnects (such as chip-side wiring interconnects 264 and board-side wiring interconnects 244) and attached to the printed circuit board 100 through a respective array of solder material portions (such as solder joints 190); and an underfill material portion 192 located between the printed circuit board 100 and the packaging substrate 200 and comprising downward-protruding anchor portions 192A that protrude downward from a horizontally-extending portion of the underfill material portion 192 that laterally surrounds each respective array of solder material portions (such as solder joints 190) into the recesses 191.

In one embodiment, a first downward-protruding anchor portion 192A selected from the downward-protruding anchor portions 192A is located within an area of the packaging substrate 200 in a plan view. In one embodiment, the packaging substrate 200 may be attached to the printed circuit board 100 through a an array of solder material portions (such as solder joints 190); and the first downward-protruding anchor portion 192A may be is more proximal to sidewalls of the packaging substrate 200 than any solder material portion within the array of solder material portions (such as solder joints 190) is to the sidewalls of the packaging substrate 200.

In one embodiment, the printed circuit board 100 comprises first bump structures (such as the PCB bonding pads 180) located above the horizontal plane including a horizontal surface of the interposer; and the horizontally-extending portion of the underfill material portion 192 may be located above the horizontal plane including the horizontal surface of the printed circuit board 100.

In one embodiment, each of the recesses 191 may have a depth that is in a range from 5% to 99.9% of a thickness of the printed circuit board 100. In one embodiment, the recesses 191 comprise an array of recesses 191 having a first periodicity along a first horizontal direction and having a second periodicity along a second horizontal direction and located in one of the corner regions.

In one embodiment, one of the recesses 191 may have a vertical sidewall that vertically extends from the horizontal plane including the horizontal surface of the printed circuit board 100 to a recessed horizontal surface located within the printed circuit board 100, the recessed horizontal surface being a surface of a polymer material.

In one embodiment, one of the recesses 191 may have a concave surface segment that is adjoined to a recessed horizontal surface located within the interposer, the recessed horizontal surface being a surface of a polymer material.

FIGS. 20A-20H are horizontal cross-sectional views of various configurations of the structure at a processing steps that corresponds to the processing step of FIG. 17 along a horizontal cross-sectional plane that corresponds to the horizontal plane X-X' in FIG. 19. Locations of downward-protruding anchor portions (950A, 292A, 192A) of the an underfill material portion (950, 292, 192) are illustrated in dotted lines.

In some configurations, such as the configurations illustrated in FIGS. 20A, 20B, 20C, 20D, 20E, and 20F, the downward-protruding anchor portions (950A, 292A, 192A) comprise an array of downward-protruding anchor portions (950A, 292A, 192A) having a first periodicity along a first horizontal direction hd1 and/or having a second periodicity along a second horizontal direction hd2 and located in one of the corner regions of a respective first interconnect-containing structure (900, 200, or 100). In some configurations such as the configurations illustrated in FIGS. 20G and 20H, the downward-protruding anchor portions (950A, 292A, 192A) may comprise a discrete downward-protruding anchor portion (950A, 292A, 192A) located in a respective corner region of a first interconnect-containing structure (900, 200, or 100) such that each corner region of the first interconnect-containing structure (900, 200, or 100) includes no more than one downward-protruding anchor portion (950A, 292A, 192A) therein.

In some configurations such as the configurations illustrated in FIGS. 20A, 20B, 20C, 20D, and 20E, the downward-protruding anchor portions (950A, 292A, 192A) may have a respective horizontal cross-sectional shape of a circle, an ellipse, or an oval. In some configurations such as the configurations illustrated in FIGS. 20F, 20G, and 20H, the downward-protruding anchor portions may have a respective horizontal cross-sectional shape of a polygon such as a rectangle, a triangle, or any other polygonal shape. Generally, each of the downward-protruding anchor portions (950A, 292A, 192A) may have a respective horizontal cross-sectional shape of any two-dimensional curvilinear shape having a closed periphery.

Figure 21A:
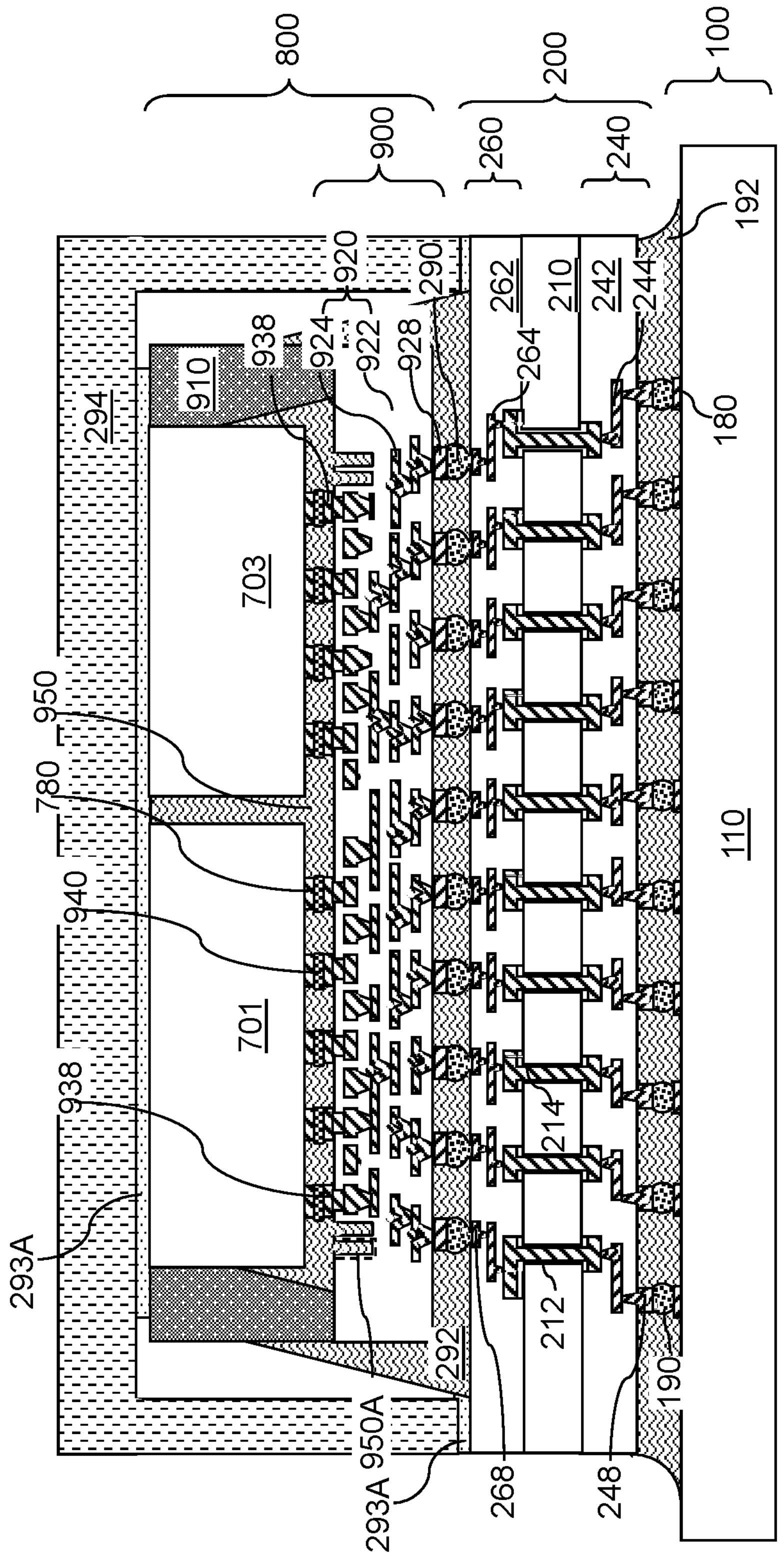
FIGS. 21A-21C are vertical cross-sectional views of alternative configuration of the exemplary structure.
Figure 21B:
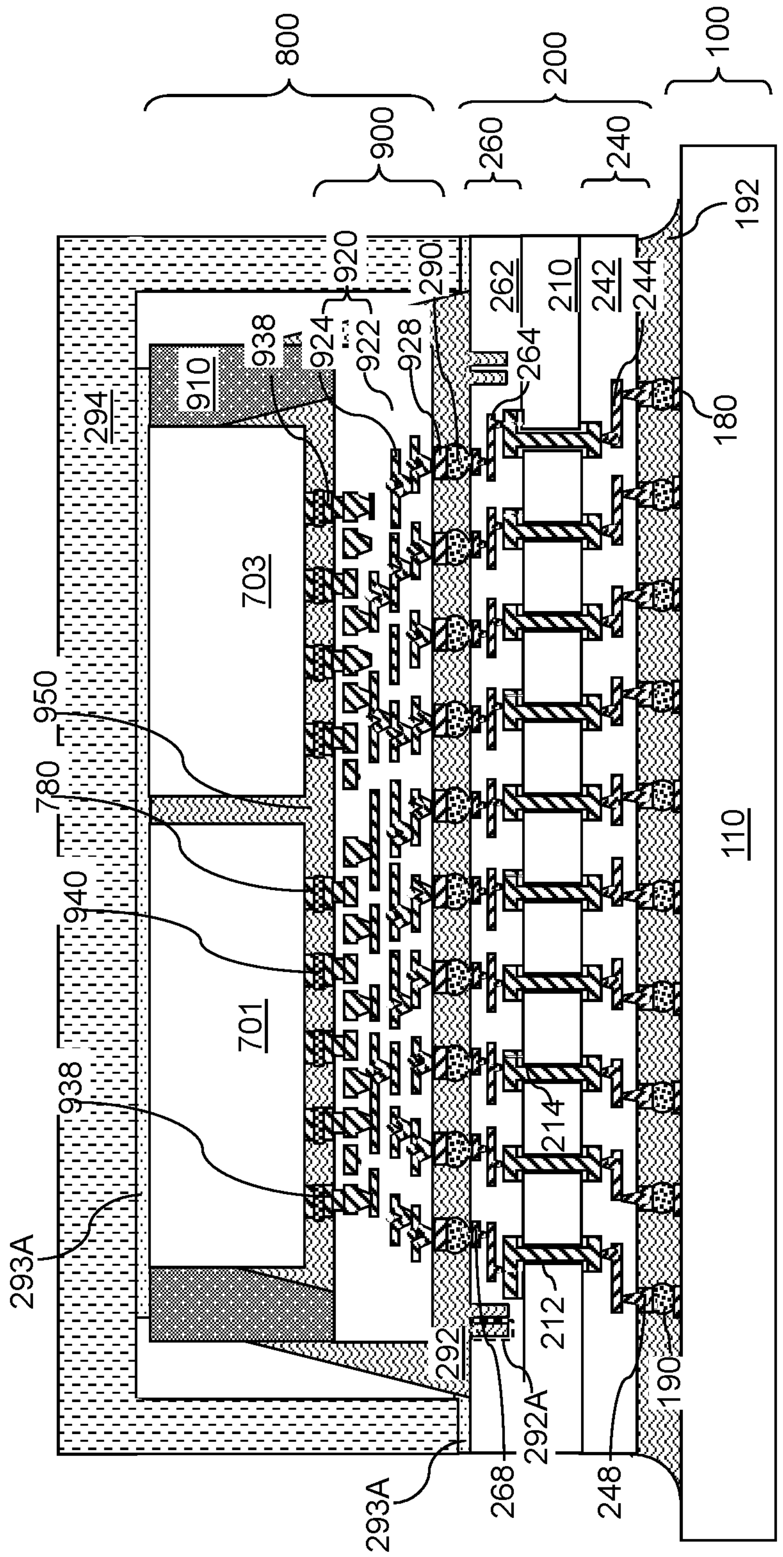
Figure 21C:
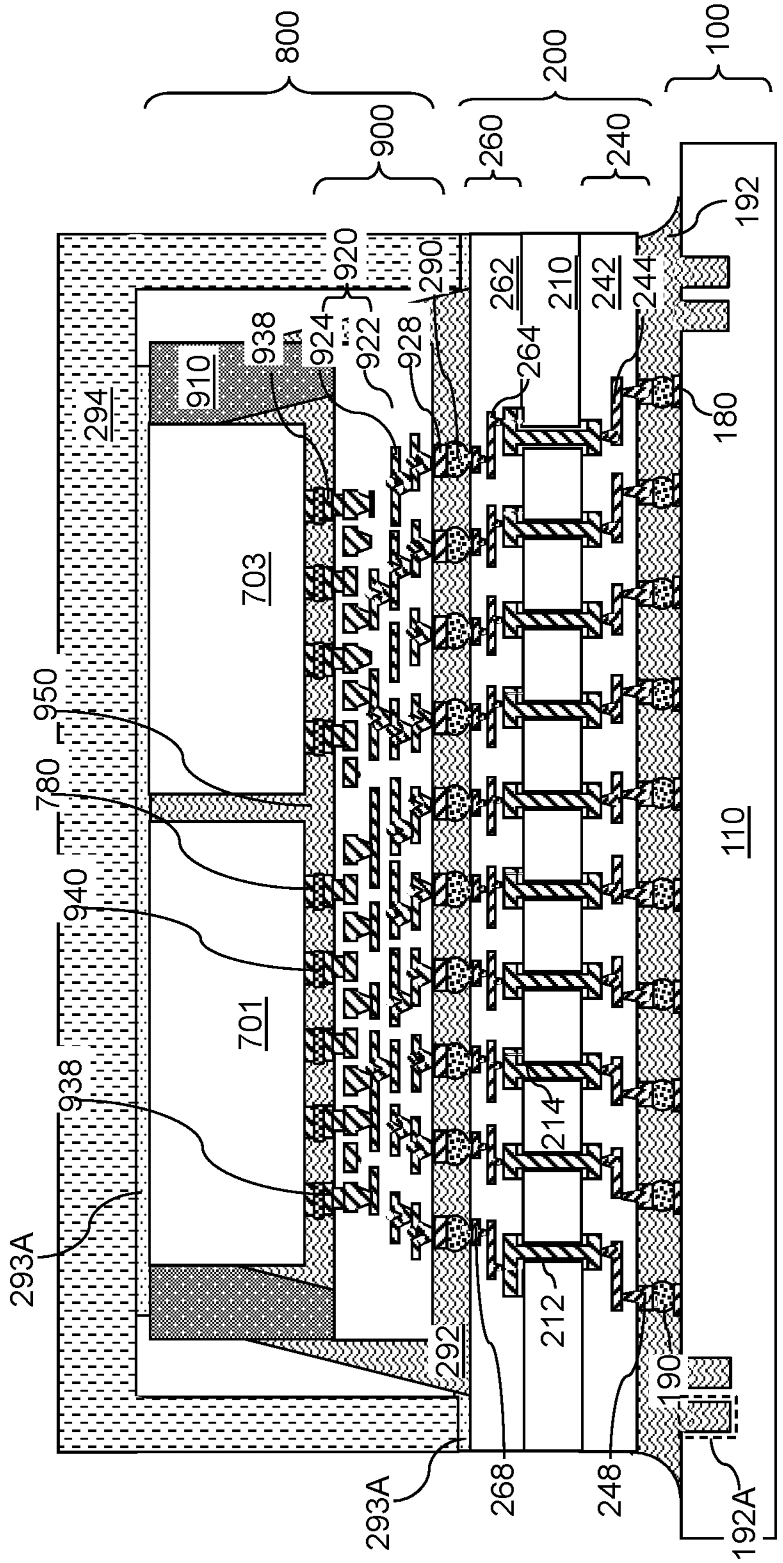

Referring to FIGS. 21A-21C, alternative configurations of the exemplary structure can be derived from any of the previously described exemplary structures by omitting formation of recesses 931 in an interposer 900, by omitting formation of recesses 291 in a packaging substrate 200, or by omitting formation of recesses 191 in a printed circuit board 100. Further, only one type of recesses (931, 291, or 191) may be formed in an interposer 900, a packaging substrate 200, or a printed circuit board 100. Various combinations of presence of one type of recesses and accompanying downward-protruding anchor portions of an underfill material portion and absence of another type of recesses and accompanying downward-protruding anchor portions of an underfill material portion are expressly contemplated herein.

Figure 22:
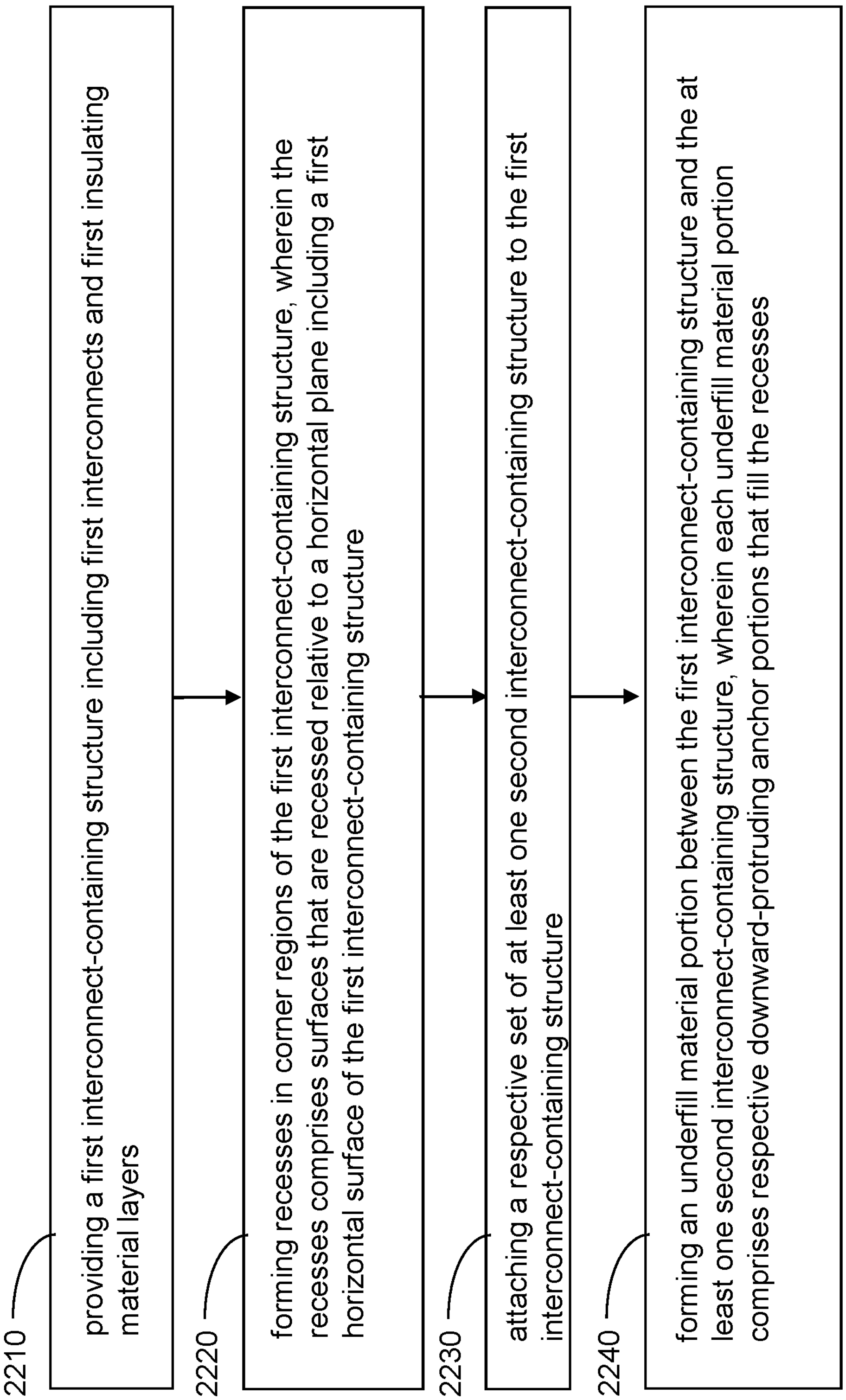
FIG. 22 is a flowchart illustrating steps for forming a structure according to an embodiment of the present disclosure.

FIG. 22 is a flowchart illustrating steps for forming a structure according to an embodiment of the present disclosure.

Referring to step 2210 and FIGS. 1A and 1B, 14A and 14B, and 18A and 18B, a first interconnect-containing structure (900, 200, or 100) including first interconnects (which may be embodied as redistributing wiring interconnects 924, a combination of chip-side wiring interconnects 264 and board-side wiring interconnects 244, or a printed circuitry) and first insulating material layers is provided. For example, as illustrated in FIGS. 1A and 1B, at least one interposer 900 including a respective set of redistribution wiring interconnects 924 and redistribution insulating layers 922 may be provided.

Referring to step 2220 and FIGS. 2A-3E, 15A and 15B, and 18A and 18B, recesses (931, 291, or 191) are formed in corner regions of the first interconnect-containing structure (900, 200, or 100). The recesses (931, 291, or 191) comprises surfaces that are recessed relative to a horizontal plane including a first horizontal surface of the first interconnect-containing structure (900, 200, or 100). For example, as illustrated in FIGS. 2A-3E, recesses 931 may be formed in corner regions of each interposer 900 selected from the at least one interposer 900. The recesses 931 comprise surfaces that are recessed relative to a horizontal plane including a first horizontal surface 901 of the at least one interposer 900.

Referring to step 2230 and FIGS. 4A-5H, 16, and 19, at least one second interconnect-containing structure {(701, 703), 800, 200} is attached to the first interconnect-containing structure (900, 200, or 100). For example, as illustrated in FIGS. 4A-5H, a respective set of at least one semiconductor die (701, 703) may be attached to each of the at least one interposer 900.

Referring to step 2240 and FIGS. 6A-18H, an underfill material portion (950, 292, 192) can be formed between the first interconnect-containing structure (900, 200, or 100) and the at least one second interconnect-containing structure (900, 200, or 100). The each underfill material portion (950, 292, 192) comprises respective downward-protruding anchor portions (950A, 292A, 192A) that fill the recesses (931, 291, or 191). For example, as illustrated in FIGS. 6A-13, an underfill material portion 950 may be formed between each facing pair of the at least one interposer 900 and at least one set of the at least one semiconductor die (701, 703). Each underfill material portion 950 comprises respective downward-protruding anchor portions 950A that substantially fills a respective subset of the recesses 931.

Referring to all drawings and according to various embodiments of the present disclosure, a bonded assembly is provided, which comprises: a first interconnect-containing structure (900, 200, 100) including first interconnects and comprising recesses (931, 291, 191) in corner regions, wherein the recesses (931, 291, 191) comprise surfaces that are recessed relative to a horizontal plane including a horizontal surface of the first interconnect-containing structure (900, 200, 100); at least one second interconnect-containing structure {(701, 703), 800, 200} including second interconnects and attached to the first interconnect-containing structure (900, 200, 100) through a respective array of solder material portions (940, 290, 190); and an underfill material portion (950, 292, 192) located between the first interconnect-containing structure (900, 200, 100) and the at least one second interconnect-containing structure {(701, 703), 800, 200} and comprising downward-protruding anchor portions (950A, 292A, 192A) that protrude downward from a horizontally-extending portion of the underfill material portion (950, 292, 192) that laterally surrounds each respective array of solder material portions (940, 290, 190) into the recesses (931, 291, 191).

In one embodiment, a first downward-protruding anchor portion (950A, 292A, 192A) selected from the downward-protruding anchor portions (950A, 292A, 192A) is located within an area of the at least one second interconnect-containing structure {(701, 703), 800, 200} in a plan view. In one embodiment, one of the at least one second interconnect-containing structure {(701, 703), 800, 200} is attached to the first interconnect-containing structure (900, 200, 100) through an array of solder material portions (940, 290, 190); and the first downward-protruding anchor portion (950A, 292A, 192A) is more proximal to sidewalls of the one of the at least one second interconnect-containing structure {(701, 703), 800, 200} than any solder material portion (940, 290, 190) within the array of solder material portions (940, 290, 190) is to the sidewalls of the one of the at least one second interconnect-containing structure {(701, 703), 800, 200}.

In one embodiment, the first interconnect-containing structure (900, 200, 100) comprises first bump structures (938, 268, 180) located above the horizontal plane including a horizontal surface of the first interconnect-containing structure (900, 200, 100); and the horizontally-extending portion of the underfill material portion (950, 292, 192) is located above the horizontal plane including the horizontal surface of the first interconnect-containing structure (900, 200, 100).

In one embodiment, each of the recesses (931, 291, 191) has a depth that is in a range from 5% to 99.9% of a thickness of the first interconnect-containing structure (900, 200, 100). In one embodiment, the recesses (931, 291, 191) comprise an array of recesses (931, 291, 191) having a first periodicity along a first horizontal direction and having a second periodicity along a second horizontal direction and located in one of the corner regions.

In one embodiment, one of the recesses (931, 291, 191) has a vertical sidewall that vertically extends from the horizontal plane including the horizontal surface of the first interconnect-containing structure (900, 200, 100) to a recessed horizontal surface located within the first interconnect-containing structure (900, 200, 100), the recessed horizontal surface being a surface of a polymer material.

In one embodiment, one of the recesses (931, 291, 191) has a concave surface segment that is adjoined to a recessed horizontal surface located within the interposer, the recessed horizontal surface being a surface of a polymer material.

In one embodiment, the bonded assembly of comprises a molding compound die frame 910 laterally surrounding the at least one second interconnect-containing structure (701, 703) and the underfill material portion 950, and is laterally spaced from the recesses 931.

In one embodiment, the at least one second interconnect-containing structure (701, 703) comprises a plurality of semiconductor dies (701, 703); and at least one semiconductor die selected from the plurality of semiconductor dies (701, 703) comprises at least two corner regions that do not have any areal overlap with the recesses (931, 291, 191).

The various embodiments of the present disclosure provide a chip package structure in which an interposer 900 includes recesses 931, which are cavities formed within the areas of at least one semiconductor die (701, 703) that is attached to the interposer 900. Generally, the interposer 900 may comprise any type of interposer known in the art. While the present disclosure is described using an embodiment in which the interposer 800 is an organic interposer, embodiments are expressly contemplated herein in which the interposer 900 is an interposer of a different type such as a silicon interposer. A downward-protruding anchor portion 950A of an underfill material portion 950 may be formed within each recess 931. The combination of the recesses 931 and the downward-protruding anchor portions 950A may effectively reduce the stress on the underfill material portion 950 at corner segments of the underfill material portion 950, and may prevent delamination or cracking of the underfill material portion and enhance the reliability of the chip package. In some embodiments, the downward-protruding anchor portions 950A may be formed at four corners of each interposer 900. The downward-protruding anchor portions 950A may function as anchor structures that absorb mechanical stress applied to the corner segments of the underfill material portion 950. In some embodiments, at least one downward-protruding anchor portion 950A may be formed in each corner of an interposer 900. Each at least one downward-protruding anchor portion 950A may be formed as a single downward-protruding anchor portion 950A, or may be formed as a plurality of downward-protruding anchor portions 950A such as a one-dimensional array or a two-dimensional array of downward-protruding anchor portions 950A. According to a simulation, the downward-protruding anchor portions 950A are expected to reduce the mechanical stress at corner regions of an underfill material portion 950 by about 15%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bonded assembly comprising:

a first interconnect-containing structure including first interconnects formed within first dielectric layers which have a first horizontal surface located within a first horizontal plane, wherein the first-interconnect structure comprises recesses located in corner regions and having sidewalls containing first surfaces of the first dielectric layers and having recessed surfaces containing second surfaces of the first dielectric layers located within a second horizontal plane that is vertically spaced from, and recessed relative to, the first horizontal plane;

first bump structures located directly on a subset of the first interconnects, wherein bottom peripheries of the first bump structures are located within the first horizontal plane;

at least one second interconnect-containing structure including second interconnects and attached to the first interconnect-containing structure through a respective array of solder material portions that are bonded a respective one of the first bump structures, wherein the bottom peripheries of the first bump structures are more distal from the at least one second interconnect-containing structure than top peripheries of the first bump structures are from the at least one second interconnect-containing structure; and an underfill material portion comprising a horizontally-extending portion that is located between the first interconnect-containing structure and the at least one second interconnect-containing structure and laterally surrounds each respective array of solder material portions, further comprising an upward protruding portion that protrudes upward from the horizontally-extending portion and laterally surrounds sidewalls of the second interconnect-containing structure, and yet further comprising downward-protruding anchor portions that protrude downward from the horizontally-extending portion of the underfill material portion into the recesses in the first interconnect-containing structure such that bottommost surfaces of the downward-protruding anchor portions are in direct contact with the recessed surfaces of the first dielectric layers within the second horizontal plane and are vertically spaced from the bottom peripheries of sidewalls of the first bump structures which are located within the first horizontal plane, wherein:

the first surfaces of the first dielectric layers comprise concave surface segments having a concave vertical cross-sectional profile;

the downward-protruding anchor portions comprise convex surface segments in direct contact with the concave surface segments;

the recesses and the downward-protruding anchor portions received therein constitute a mechanical interlock structure having a non-planar interface between the first interconnect-containing structure and the underfill material portion, reducing a stress on the underfill material portion at corner segments of the underfill material portion, and reducing delamination or cracking of the underfill material portion; and the recesses comprise additional sidewalls connecting bottom peripheries of the concave surface segments and peripheries of the second surfaces and having cylindrical configurations.

2. The bonded assembly of claim 1, wherein a first downward-protruding anchor portion selected from the downward-protruding anchor portions is located within an area of the at least one second interconnect-containing structure in a plan view.

3. The bonded assembly of claim 2, wherein:

one of the at least one second interconnect-containing structure is attached to the first interconnect-containing structure through a first array of solder material portions; and the first downward-protruding anchor portion is more proximal to sidewalls of the one of the at least one second interconnect-containing structure than any solder material portion within the first array of solder material portions is to the sidewalls of the one of the at least one second interconnect-containing structure.

4. The bonded assembly of claim 1, wherein the horizontally-extending portion of the underfill material portion is located above the first horizontal plane and directly contacts sidewalls of the first bump structures.

5. The bonded assembly of claim 1, wherein an entirety of an interface between the horizontally-extending portion of the underfill material portion is located within the first horizontal plane.

6. The bonded assembly of claim 1, wherein the recesses comprise an array of recesses having a first periodicity along a first horizontal direction and having a second periodicity along a second horizontal direction and located in one of the corner regions.

7. The bonded assembly of claim 1, wherein one of the recesses has a vertical sidewall that vertically extends from the first horizontal plane to the second horizontal plane.

8. The bonded assembly of claim 1, wherein one of the recesses has a concave surface segment that is adjoined to a recessed horizontal surface located within the first interconnect-containing structure within the second horizontal plane, the recessed horizontal surface being a surface of a polymer material.

9. A bonded assembly comprising a fan-out package, the fan-out package comprising:

an interposer comprising first interconnects embedded in first dielectric layers which have a first horizontal surface located within a first horizontal plane and further comprising on-interposer bump structures overlying the first horizontal plane, and having sidewalls of which bottom peripheries are located within the first horizontal plane, wherein the interposer comprises recesses located in corner regions of the interposer and vertically extending from the first horizontal plane toward a backside horizontal surface of the interposer such that recessed surfaces of the first dielectric layers are located within a second horizontal plane that is located at a depth which is in a range from 5% to 99.9% of a thickness of the interposer such that the recessed surfaces are located below a horizontal plane containing bottommost surfaces of the on-interposer bump structures and is more proximal to the backside horizontal surface than the first horizontal plane is to the backside horizontal surface;

at least one semiconductor die attached to the interposer through a respective array of solder material portions that are bonded a respective one of the first bump structures, wherein the bottom peripheries of the sidewalls of the on-interposer bump structures are more distal from the at least one semiconductor die than top peripheries of the sidewalls of the on-interposer bump structures are from the at least one semiconductor die;

an underfill material portion located between the interposer and the at least one semiconductor die and comprising downward-protruding anchor portions that fill the recesses in the interposer; and a molding compound die frame laterally surrounding the at least one semiconductor die, wherein bottommost surfaces of the downward-protruding anchor portions are in direct contact with the recessed surfaces of the first dielectric layers within the second horizontal plane and are vertically spaced from the bottom peripheries of the sidewalls of the on-interposer bump structures which are located within the first horizontal plane, wherein:

the first surfaces of the first dielectric layers comprise concave surface segments having a concave vertical cross-sectional profile;

the downward-protruding anchor portions comprise convex surface segments in direct contact with the concave surface segments;

the recesses and the downward-protruding anchor portions received therein constitute a mechanical interlock structure having a non-planar interface between the first interconnect-containing structure and the underfill material portion, reducing a stress on the underfill material portion at corner segments of the underfill material portion, and reducing delamination or cracking of the underfill material portion; and the recesses comprise additional sidewalls connecting bottom peripheries of the concave surface segments and peripheries of the second surfaces and having cylindrical configurations.

10. The bonded assembly of claim 9, wherein:

each of the downward-protruding anchor portions of the underfill material portion is located entirely within an area of a respective one of the at least one semiconductor die in a plan view; and the recesses in the interposer and the downward-protruding anchor portions of underfill material received constitute a mechanical interlock structure between the interposer and the underfill material portion that mitigates against delamination or cracking in a vicinity of corners of the at least one semiconductor die that is located on an opposite side of the interposer relative to the underfill material portions by reducing thermal and mechanical stress on the underfill material portion.

11. The bonded assembly of claim 9, wherein:

a first semiconductor die selected from the at least one semiconductor die comprises first sidewalls laterally extending along a first horizontal direction and second sidewalls laterally extending along a second horizontal direction;

the first semiconductor die is attached to the interposer through a first array of solder material portions and has areal overlap with a first downward-protruding anchor portion selected from the downward-protruding anchor portions;

the first downward-protruding anchor portion is more proximal to a proximal one of the first sidewalls than any solder material portion within the first array of solder material portions is to the first sidewalls; and the first downward-protruding anchor portion is more proximal to a proximal one of the second sidewalls than any solder material portion within the first array of solder material portions is to the second sidewalls.

12. The bonded assembly of claim 9, wherein the recesses comprise an array of recesses having a first periodicity along a first horizontal direction and having a second periodicity along a second horizontal direction and located in one of the corner regions.

13. A bonded assembly comprising:

a first interconnect-containing structure including first interconnects formed within first dielectric layers which have a first horizontal surface located within a first horizontal plane, wherein the first-interconnect structure comprises recesses located in corner regions and having sidewalls containing first surfaces of the first dielectric layers and having recessed surfaces containing second surfaces of the first dielectric layers located within a second horizontal plane that is vertically spaced from, and recessed relative to, the first horizontal plane;

first bump structures located directly on a subset of the first interconnects, wherein bottom peripheries of the first bump structures are located within the first horizontal plane, wherein the recessed surfaces are located at a depth which is in a range from 5% to 99.9% of a thickness of the first interconnect-containing structure such that the recessed surfaces are located below a horizontal plane containing bottommost surfaces of the first bump structures;

at least one second interconnect-containing structure including second interconnects and attached to the first interconnect-containing structure through a respective array of solder material portions that are bonded a respective one of the first bump structures, wherein the bottom peripheries of the first bump structures are more distal from the at least one second interconnect-containing structure than top peripheries of the first bump structures are from the at least one second interconnect-containing structure; and an underfill material portion laterally surrounding each of the solder material portions and comprising downward-protruding anchor portions that protrude downward from a horizontally-extending portion of the underfill material portion such that bottommost surfaces of the downward-protruding anchor portions are in direct contact with the recessed surfaces of the first dielectric layers within the second horizontal plane and are vertically spaced from the bottom peripheries of sidewalls of the first bump structures which are located within the first horizontal plane, wherein:

the first surfaces of the first dielectric layers comprise concave surface segments having a concave vertical cross-sectional profile;

the downward-protruding anchor portions comprise convex surface segments in direct contact with the concave surface segments;

the recesses and the downward-protruding anchor portions received therein constitute a mechanical interlock structure having a non-planar interface between the first interconnect-containing structure and the underfill material portion, reducing a stress on the underfill material portion at corner segments of the underfill material portion, and reducing delamination or cracking of the underfill material portion; and the recesses comprise additional sidewalls connecting bottom peripheries of the concave surface segments and peripheries of the second surfaces and having cylindrical configurations.

14. The bonded assembly of claim 13, wherein a first downward-protruding anchor portion selected from the downward-protruding anchor portions is located within an area of the at least one second interconnect-containing structure in a plan view.

15. The bonded assembly of claim 13, wherein:

the first interconnects comprise first redistribution wiring interconnects; and the second horizontal plane is located entirely below a first subset of the first redistribution wiring interconnects, and is located entirely above a second subset of the first redistribution wiring interconnects.

16. The bonded assembly of claim 1, wherein one of the recesses has a vertical sidewall that vertically extends from the first horizontal plane to a recessed horizontal surface located within the second horizontal plane, the recessed horizontal surface being a surface of a polymer material.

17. The bonded assembly of claim 1, wherein top peripheries of the concave surface segments are located within the first horizontal plane.

18. The bonded assembly of claim 9, wherein top peripheries of the concave surface segments are located within the first horizontal plane.

19. The bonded assembly of claim 13, wherein top peripheries of the concave surface segments are located within the first horizontal plane.

20. The bonded assembly of claim 13, wherein the horizontally-extending portion of the underfill material portion is located above the first horizontal plane and contacts sidewalls of the first bump structures.

* * * * *